(12) United States Patent
Yasumoto et al.

(10) Patent No.: US 9,937,698 B2
(45) Date of Patent: Apr. 10, 2018

(54) PEELING METHOD AND LIGHT-EMITTING DEVICE

(71) Applicant: Semiconductor Energy Laboratory Co., Ltd., Kanagawa-ken (JP)

(72) Inventors: Seiji Yasumoto, Tochigi (JP); Masataka Sato, Tochigi (JP); Tomoya Aoyama, Kanagawa (JP); Ryu Komatsu, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 57 days.

(21) Appl. No.: 14/532,634

(22) Filed: Nov. 4, 2014

(65) Prior Publication Data
US 2015/0123106 A1    May 7, 2015

(30) Foreign Application Priority Data

Nov. 6, 2013  (JP) ................. 2013-230532
Dec. 2, 2013  (JP) ................. 2013-249158
Feb. 19, 2014  (JP) ................. 2014-029755

(51) Int. Cl.
*B32B 38/10* (2006.01)
*B32B 43/00* (2006.01)
*H01L 51/00* (2006.01)
*H01L 21/687* (2006.01)
(Continued)

(52) U.S. Cl.
CPC .......... *B32B 43/006* (2013.01); *H01L 51/003* (2013.01); *B32B 38/10* (2013.01); *B32B 2309/105* (2013.01); *B32B 2315/08* (2013.01); *B32B 2457/00* (2013.01); *H01L 21/68757* (2013.01); *H01L 27/3244* (2013.01); *H01L 51/0097* (2013.01); *H01L 51/5237* (2013.01); *H01L 51/5262* (2013.01); *H01L 2221/68386* (2013.01); *H01L 2251/5338* (2013.01); *Y10T 156/11* (2015.01); *Y10T 156/1142* (2015.01); *Y10T 156/1168* (2015.01);
(Continued)

(58) Field of Classification Search
CPC ............... B32B 38/10; B32B 43/006; H01L 2221/68386; H01L 21/68757; Y10T 156/1142; Y10T 156/1168; Y10T 156/1184; Y10T 156/1967; Y10T 156/1978
USPC .......... 156/709, 714, 717, 762, 764, 930, 41
See application file for complete search history.

(56) References Cited

U.S. PATENT DOCUMENTS 5,821,138 A  10/1998  Yamazaki et al.
5,854,123 A  12/1998  Sato et al.
5,891,298 A   4/1999  Kuroda et al.
(Continued)

FOREIGN PATENT DOCUMENTS

JP  10-125931 A   5/1998
JP  2003-174153 A  6/2003

*Primary Examiner* — Mark A Osele
*Assistant Examiner* — Nickolas Harm
(74) *Attorney, Agent, or Firm* — Husch Blackwell LLP

(57) ABSTRACT

The yield of a peeling process is improved. A first step of forming a peeling layer to a thickness of greater than or equal to 0.1 nm and less than 10 nm over a substrate; a second step of forming, on the peeling layer, a layer to be peeled including a first layer in contact with the peeling layer; a third step of separating parts of the peeling layer and parts of the first layer to form a peeling trigger; and a fourth step of separating the peeling layer and the layer to be peeled are performed. The use of the thin peeling layer can improve the yield of a peeling process regardless of the structure of the layer to be peeled.

18 Claims, 33 Drawing Sheets

(51) Int. Cl.
*H01L 51/52* (2006.01)
*H01L 27/32* (2006.01)

(52) U.S. Cl.
CPC .... *Y10T 156/1184* (2015.01); *Y10T 156/1967* (2015.01); *Y10T 156/1978* (2015.01)

(56) References Cited

U.S. PATENT DOCUMENTS

| | | | |
|---|---|---|---|
| 6,072,239 A | 6/2000 | Yoneda et al. |
| 6,100,166 A | 8/2000 | Sakaguchi et al. |
| 6,127,199 A | 10/2000 | Inoue et al. |
| 6,326,279 B1 | 12/2001 | Kakizaki et al. |
| 6,372,608 B1 | 4/2002 | Shimoda et al. |
| 6,391,220 B1 | 5/2002 | Zhang et al. |
| 6,452,091 B1 | 9/2002 | Nakagawa et al. |
| 6,544,430 B2 | 4/2003 | McCormack et al. |
| 6,592,739 B1 | 7/2003 | Sonoda et al. |
| 6,682,963 B2 | 1/2004 | Ishikawa |
| 6,846,696 B2 | 1/2005 | Adachi et al. |
| 6,849,877 B2 | 2/2005 | Yamazaki et al. |
| 6,946,361 B2 | 9/2005 | Takayama et al. |
| 6,953,735 B2 | 10/2005 | Yamazaki et al. |
| 6,982,181 B2 | 1/2006 | Hideo |
| 7,015,075 B2 | 3/2006 | Fay et al. |
| 7,029,950 B2 | 4/2006 | Yonehara et al. |
| 7,056,810 B2 | 6/2006 | Yamazaki et al. |
| 7,060,153 B2 | 6/2006 | Yamazaki et al. |
| 7,067,392 B2 | 6/2006 | Yamazaki et al. |
| 7,122,445 B2 | 10/2006 | Takayama et al. |
| 7,122,447 B2 | 10/2006 | Abe |
| 7,147,740 B2 | 12/2006 | Takayama et al. |
| 7,169,636 B2 | 1/2007 | Maruyama et al. |
| 7,180,091 B2 | 2/2007 | Yamazaki et al. |
| 7,189,631 B2 | 3/2007 | Yamazaki et al. |
| 7,241,666 B2 | 7/2007 | Goto et al. |
| 7,245,331 B2 | 7/2007 | Yamazaki et al. |
| 7,262,088 B2 | 8/2007 | Kodaira et al. |
| 7,271,076 B2 | 9/2007 | Yamazaki et al. |
| 7,282,380 B2 | 10/2007 | Maruyama et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,436,050 B2 | 10/2008 | Yamazaki et al. |
| 7,465,674 B2 | 12/2008 | Tamura et al. |
| 7,482,248 B2 | 1/2009 | Tamura |
| 7,521,383 B2 | 4/2009 | Morisue et al. |
| 7,536,780 B2 | 5/2009 | Shimizu et al. |
| 7,540,079 B2 | 6/2009 | Okuyama et al. |
| 7,566,633 B2 | 7/2009 | Koyama et al. |
| 7,566,640 B2 | 7/2009 | Yamazaki et al. |
| 7,591,863 B2 | 9/2009 | Watanabe et al. |
| 7,601,236 B2 | 10/2009 | Yamashita et al. |
| 7,608,520 B2 | 10/2009 | Sugita et al. |
| 7,723,209 B2 | 5/2010 | Maruyama et al. |
| 7,732,263 B2 | 6/2010 | Yamazaki et al. |
| 7,767,543 B2 | 8/2010 | Tateishi et al. |
| 7,820,526 B2 | 10/2010 | Yamada et al. |
| 7,867,907 B2 | 1/2011 | Shimomura et al. |
| 7,927,971 B2 | 4/2011 | Tamura et al. |
| 8,030,132 B2 | 10/2011 | Ogita et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,058,083 B2 | 11/2011 | Eguchi et al. |
| 8,058,146 B2 | 11/2011 | Kuwabara |
| 8,110,442 B2 | 2/2012 | Jinbo |
| 8,367,440 B2 | 2/2013 | Takayama et al. |
| 2003/0022403 A1 | 1/2003 | Shimoda et al. |
| 2003/0082889 A1 | 5/2003 | Maruyama et al. |
| 2004/0209442 A1 | 10/2004 | Takakuwa et al. |
| 2005/0176745 A1 | 8/2005 | Fay et al. |
| 2005/0214984 A1 | 9/2005 | Maruyama et al. |
| 2005/0229370 A1 | 10/2005 | Kobayashi |
| 2006/0199382 A1 | 9/2006 | Sugiyama et al. |
| 2007/0045621 A1 | 3/2007 | Suzuki et al. |
| 2007/0262403 A1 | 11/2007 | Tsurume |
| 2008/0011420 A1 | 1/2008 | Yoshizawa et al. |
| 2008/0042168 A1 | 2/2008 | Watanabe et al. |
| 2008/0044940 A1 | 2/2008 | Watanabe et al. |
| 2008/0113486 A1 | 5/2008 | Eguchi et al. |
| 2008/0132033 A1 | 6/2008 | Eguchi et al. |
| 2008/0182385 A1 | 7/2008 | Kamine |
| 2008/0259575 A1 | 10/2008 | Tanimura et al. |
| 2009/0023251 A1 | 1/2009 | Eguchi et al. |
| 2010/0096090 A1 | 4/2010 | Yoshioka et al. |
| 2010/0124795 A1 | 5/2010 | Eguchi et al. |
| 2012/0045861 A1 | 2/2012 | Eguchi et al. |
| 2013/0048967 A1 | 2/2013 | Nishido et al. |
| 2014/0061612 A1 | 3/2014 | Yamazaki et al. |
| 2015/0044792 A1 | 2/2015 | Aoyama et al. |
| 2015/0069358 A1 | 3/2015 | Chida et al. |

FIG. 12A1 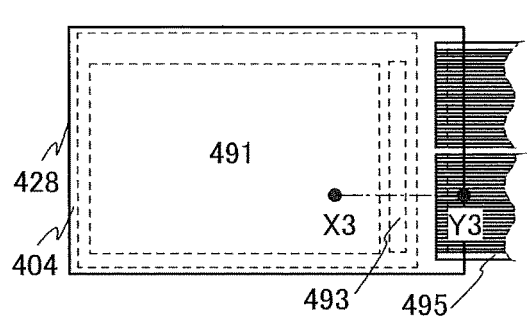
FIG. 12A2 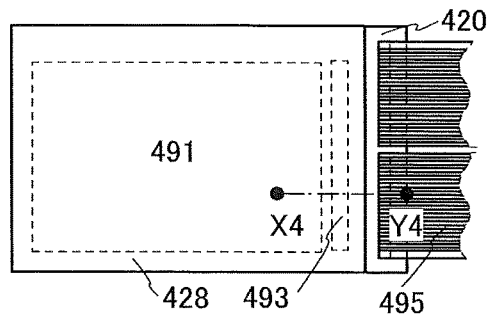

FIG. 14A1 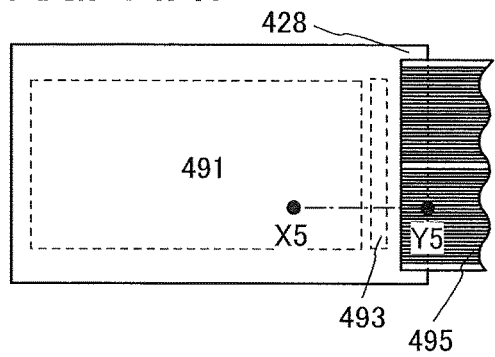
FIG. 14A2 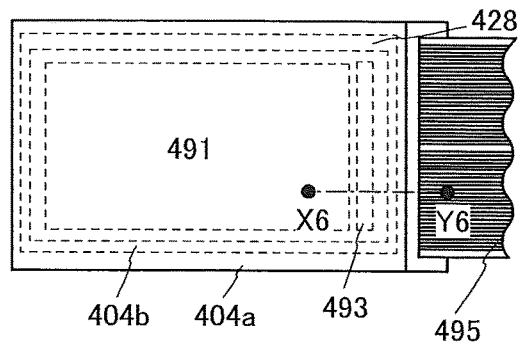
FIG. 14B
FIG. 14C
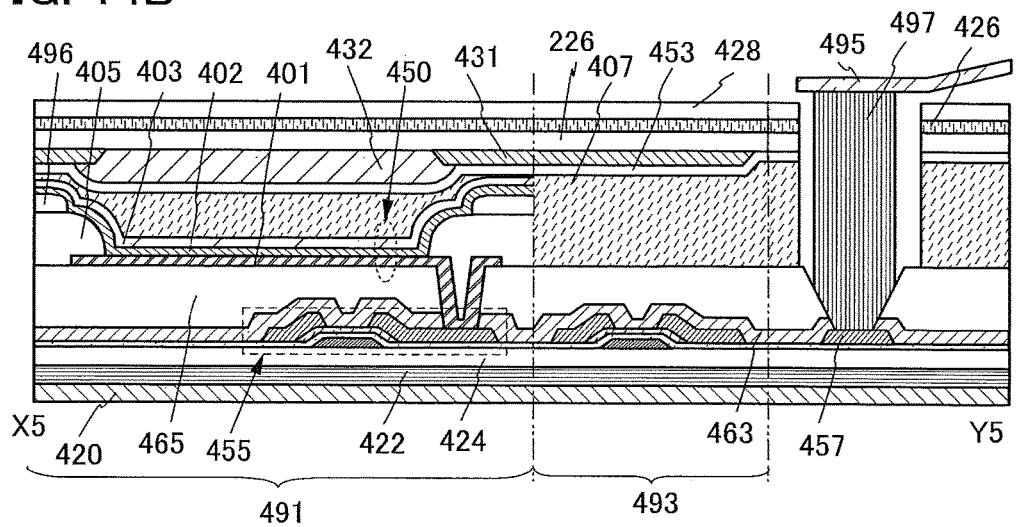

FIG. 15A
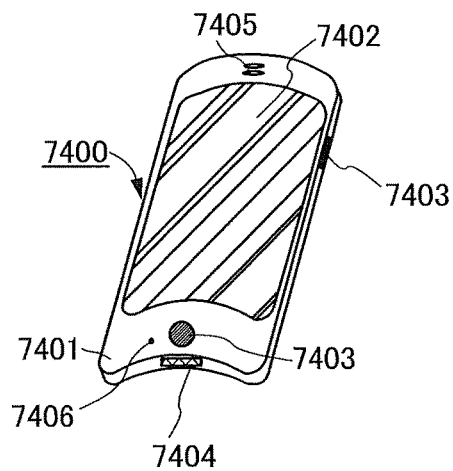
FIG. 15B
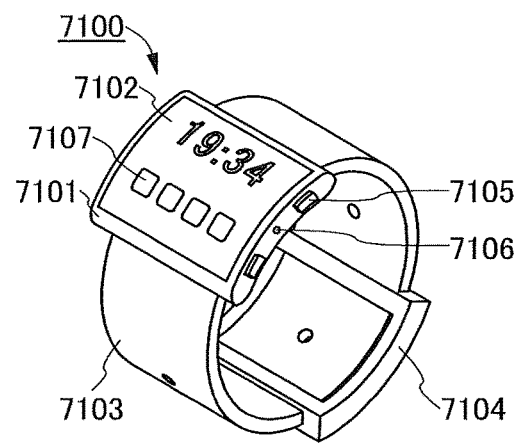
FIG. 15C
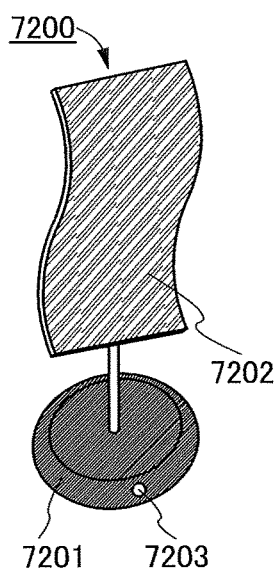
FIG. 15D
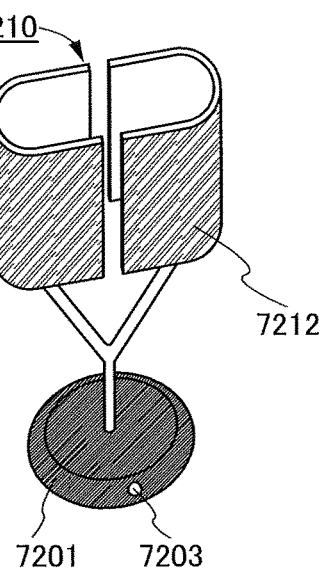
FIG. 15E
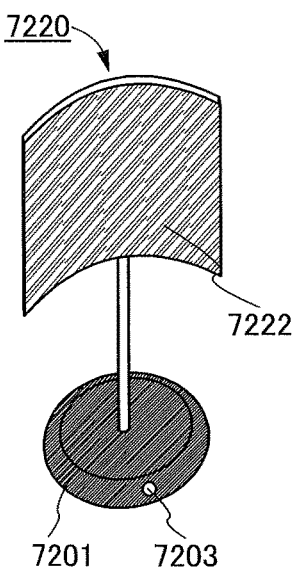
FIG. 15F
FIG. 15G
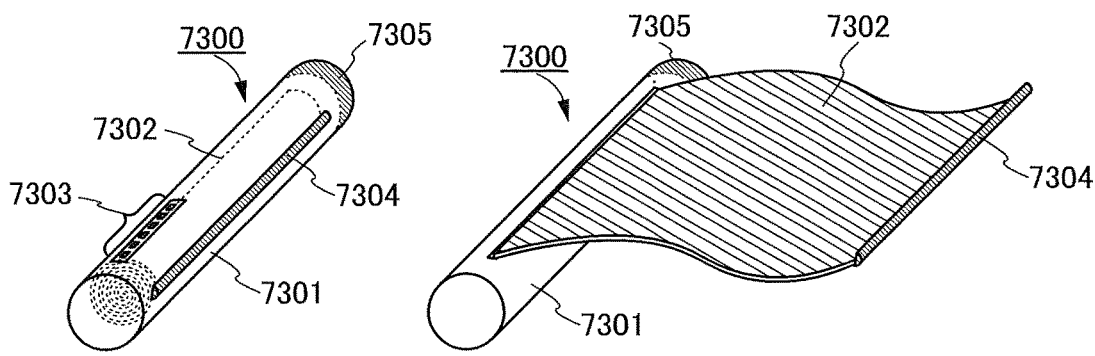

before the bending test          after the bending test bent portion before the preservation test     after a lapse of 100 hours from
                                 the start of the preservation test bent portion                     bent portion before the bending test after the bending test ↑ bent portion before the preservation test ↑ bent portion after a lapse of 100 hours from the start of the preservation test ↑ bent portion

PEELING METHOD AND LIGHT-EMITTING DEVICE

BACKGROUND OF THE INVENTION

1. Field of the Invention

The present invention relates to an object, a method, or a fabrication method. In addition, the present invention relates to a process, a machine, manufacture, or a composition of matter. One embodiment of the present invention relates to a semiconductor device, a light-emitting device, a display device, an electronic appliance, a lighting device, and a method for fabricating these devices. In particular, one embodiment of the present invention relates to a light-emitting device using an organic electroluminescence (hereinafter also referred to as EL) phenomenon, and a method for fabricating the light-emitting device. In particular, one embodiment of the present invention relates to a peeling method and a method for fabricating a device including a peeling process.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for fabricating a device including a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of peeling a layer including the functional element from the formation substrate (also referred to as a peeling step).

For example, Patent Document 1 discloses the following separation technique using laser ablation: a separation layer formed of amorphous silicon or the like is formed over a substrate, a layer to be peeled that includes a thin film element is formed over the separation layer, and the layer to be peeled is bonded to a transfer body with the use of an adhesive layer. The separation layer is ablated by laser light irradiation, so that peeling is caused in the separation layer.

Patent Document 2 discloses a technique in which peeling is conducted by physical force with human hands or the like. In addition, Patent Document 2 discloses the following separation technique: a metal layer is formed between a substrate and an oxide layer and peeling is caused at the interface between the oxide layer and the metal layer by utilizing a weak bond between the oxide layer and the metal layer at their interface, whereby a layer to be peeled and the substrate are separated.

REFERENCE

Patent Document 1: Japanese Published Patent Application No. H10-125931
Patent Document 2: Japanese Published Patent Application No. 2003-174153

SUMMARY OF THE INVENTION

When it is difficult to perform peeling at a peeling interface in a peeling step, high stress is applied to the functional element and the functional element broken in some cases.

An object of one embodiment of the present invention is to improve the yield of a peeling step.

Another object of one embodiment of the present invention is to improve the yield of a fabrication process of a device such as a semiconductor device, a light-emitting device, a display device, an electronic appliance, or a lighting device. In particular, another object of one embodiment of the present invention is to improve the yield of a fabrication process of a device such as a semiconductor device, a light-emitting device, a display device, an electronic appliance, or a lighting device that is lightweight, thin, or flexible.

Another object of one embodiment of the present invention is to reduce the amount of dust generated in a fabrication process of the device. Another object of one embodiment of the present invention is to prevent entry of impurities in a fabrication process of the device. Another object of one embodiment of the present invention is to improve alignment accuracy at the time of attachment of substrates in a fabrication process of the device. Another object of one embodiment of the present invention is to provide a highly reliable light-emitting device or the like.

An object of one embodiment of the present invention is to provide a novel light-emitting device, display device, electronic appliance, or lighting device. Another object of one embodiment of the present invention is to provide a novel peeling method or a novel method for fabricating such a device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a peeling method that includes a first step of forming a peeling layer to a thickness of greater than or equal to 0.1 nm and less than 10 nm over a substrate, a second step of forming, on the peeling layer, a layer to be peeled including a first layer in contact with the peeling layer, a third step of separating parts of the peeling layer and parts of the first layer to form a peeling trigger, and a fourth step of separating the peeling layer and the layer to be peeled.

In the second step of the peeling method, at least a stack that includes the first layer and has stress with a negative value (i.e., compressive stress) is preferably formed as the layer to be peeled. For example, it is preferable to form, in the stack, at least the first layer having stress with a negative value on the peeling layer and a second layer having stress with a negative value over the first layer. Alternatively, it is preferable to form, in the stack, at least the first layer having stress with a negative value over the peeling layer, a second layer having stress with a negative value over the first layer, a third layer having stress with a negative value over the second layer, a fourth layer having stress with a positive value (i.e., tensile stress) over the third layer, and a fifth layer having stress with a negative value over the fourth layer. For example, an oxide insulating film may be formed as the first layer, and a nitride insulating film may be formed as the second layer.

Another embodiment of the present invention is a peeling method that includes a first step of forming a peeling layer to a thickness of greater than or equal to 0.1 nm and less than 10 nm over a substrate, a second step of forming, on the peeling layer, a layer to be peeled including a first layer in contact with the peeling layer, a third step of curing a bonding layer while the bonding layer, the peeling layer, and the layer to be peeled overlap one another, a fourth step of separating parts of the peeling layer and parts of the first layer that overlap the bonding layer to form a peeling trigger, and a fifth step of separating the peeling layer and the layer to be peeled.

Another embodiment of the present invention is a peeling method that includes a first step of forming a peeling layer to a thickness of greater than or equal to 0.1 nm and less than 10 nm over a substrate, a second step of forming, on the peeling layer, a layer to be peeled including a first layer in contact with the peeling layer, a third step of curing a first bonding layer and a frame-shaped second bonding layer surrounding the first bonding layer while the first bonding layer, the second bonding layer, the peeling layer, and the layer to be peeled overlap one another, a fourth step of separating parts of the peeling layer and parts of the first layer overlapped by the second bonding layer to form a peeling trigger, and a fifth step of separating the peeling layer and the layer to be peeled.

One embodiment of the present invention can improve the yield of a peeling process. One embodiment of the present invention can improve the yield of a fabrication process of a semiconductor device, a light-emitting device, a display device, an electronic appliance, or a lighting device. In particular, one embodiment of the present invention can improve the yield of a fabrication process of a semiconductor device, a light-emitting device, a display device, an electronic appliance, or a lighting device that is lightweight, thin, or flexible.

One embodiment of the present invention can provide a novel light-emitting device, display device, electronic appliance, or lighting device. One embodiment of the present invention can provide a novel peeling method or a novel method for fabricating a device.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 12A1, 12A2, 12B, and 12C illustrate examples of light-emitting devices.
FIGS. 14A1, 14A2, 14B, and 14C illustrate examples of light-emitting devices.
FIGS. 15A to 15G illustrate examples of electronic appliances and lighting devices.

DETAILED DESCRIPTION OF THE INVENTION

Figure 1A:
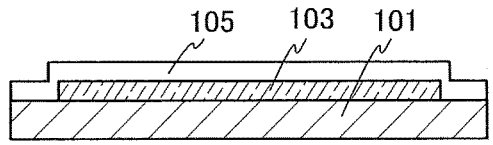
FIGS. 1A to 1F illustrate a peeling method.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

A layer to be peeled can be formed over a formation substrate, peeled from the formation substrate, and then transferred to another substrate. With this method, for example, a layer to be peeled that is formed over a formation substrate having high heat resistance can be transferred to a substrate having low heat resistance. The temperature at which the layer to be peeled is formed is not limited by the substrate having low heat resistance. The layer to be peeled is transferred to a substrate or the like that is more lightweight or flexible or thinner than the formation substrate, whereby a variety of devices such as a semiconductor device, a light-emitting device, or a display device can be made lightweight, flexible, and thin.

A device that can be fabricated according to one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element that are sealed is also included) are also examples of the device that can be fabricated according to one embodiment of the present invention.

For example, in order to protect an organic EL element that is likely to deteriorate because of moisture or the like, a protective film with an excellent gas barrier property can be formed over a glass substrate at a high temperature and transferred to a flexible organic resin substrate. By forming the organic EL element over the protective film transferred to the organic resin substrate, a highly reliable flexible light-emitting device can be fabricated even when the organic resin substrate has low heat resistance and a poor gas barrier property.

Another example is as follows: after a protective film having an excellent gas barrier property is formed over a glass substrate at a high temperature and an organic EL element is formed over the protective film, the protective film and the organic EL element can be peeled from the glass substrate and transferred to an organic resin substrate having a low heat resistance, a poor gas barrier property, and flexibility. A highly reliable flexible light-emitting device can be fabricated by transferring the protective film and the organic EL element to the organic resin substrate.

One embodiment of the present invention relates to a method for fabricating a device in which peeling and transfer are performed in the above manner, specifically to a peeling method. In each of Embodiments 1 and 4, a peeling method of one embodiment of the present invention will be described. In Embodiment 2, as a structure example of a device that can be fabricated according to one embodiment of the present invention, a flexible light-emitting device including an organic EL element will be described. In Embodiment 3, electronic appliances and lighting devices each including the device that can be fabricated according to one embodiment of the present invention will be described. Lastly, Example of the peeling method of one embodiment of the present invention will be described.

Embodiment 1

In this embodiment, a peeling method of one embodiment of the present invention is described with reference to FIGS. 1A to 1F, FIGS. 2A to 2C, FIGS. 3A to 3D, FIGS. 4A to 4D, FIGS. 5A to 5D, FIGS. 6A to 6D, FIGS. 7A to 7D, FIGS. 8A to 8C, and FIGS. 9A to 9I.

The peeling method of one embodiment of the present invention includes a first step of forming a peeling layer to a thickness of, for example, greater than or equal to 0.1 nm and less than 10 nm over a substrate, a second step of forming, on the peeling layer, a layer to be peeled including a first layer in contact with the peeling layer, a third step of separating parts of the peeling layer and parts of the first layer to form a peeling trigger, and a fourth step of separating the peeling layer and the layer to be peeled.

When the layer to be peeled has high tensile stress in the separation of the peeling layer and the layer to be peeled, the layer to be peeled is cracked or film breakage is caused in some cases even if peeling can be performed with a small amount of force. In contrast, when the layer to be peeled has high compressive stress in the separation of the peeling layer and the layer to be peeled, a large amount of force is required for peeling in some cases. As described above, the yield of peeling is decreased depending on the structure of the layer to be peeled in some cases.

The present inventors have found out that the force required for peeling depends on the peeling layer as well as the stress on the layer to be peeled.

In the peeling method of one embodiment of the present invention, the peeling layer with a thickness of, for example, greater than or equal to 0.1 nm and less than 10 nm is used. With such a thin peeling layer, peeling can be performed with a small amount of force, regardless of the stress on the layer to be peeled. In addition, with such a thin peeling layer, the layer to be peeled can be prevented from being cracked when peeled regardless of the stress on the layer to be peeled. In other words, by applying one embodiment of the present invention, the yield of a peeling process can be improved regardless of the structure of the layer to be peeled.

In the second step of the peeling method, at least a stack that includes the first layer and has stress with a negative value (i.e., compressive stress) is preferably formed as the layer to be peeled. In the case where the stress on the stack included in the layer to be peeled is compressive stress, the layer to be peeled can be prevented from being cracked when peeled.

The stress on each layer included in the stack is not necessarily compressive stress as long as the stress on the entire stack is compressive stress. The stack may include a layer with tensile stress and a layer with compressive stress.

The yield of the peeling process can be improved even when $N_2O$ plasma treatment is not performed between the first step and the fourth step in the above peeling method. This can simplify a fabrication process of a device fabricated by the peeling method.

For example, in the case where a tungsten film is used as the peeling layer, a tungsten oxide film can be formed between the tungsten film and the first layer by $N_2O$ plasma treatment. The formation of the tungsten oxide film by $N_2O$ plasma treatment enables the layer to be peeled to be peeled with a small amount of force.

In this case, when the tungsten film and the tungsten oxide film are separated at their interface, the tungsten oxide film might remain on the layer to be peeled side. In addition, the remaining tungsten oxide film might adversely affect the characteristics of a transistor. Thus, it is preferable to perform a step of removing the tungsten oxide film after the step of separating the peeling layer and the layer to be peeled.

Since $N_2O$ plasma treatment does not need to be performed in the peeling method of one embodiment of the present invention as described above, a step of removing a tungsten oxide film is also not performed. Thus, a device can be fabricated more easily.

Another embodiment of the present invention is a peeling method that includes a first step of forming a peeling layer to a thickness of greater than or equal to 0.1 nm and less than 10 nm over a substrate, a second step of forming, on the peeling layer, a layer to be peeled including a first layer in contact with the peeling layer, a third step of curing a bonding layer while the bonding layer, the peeling layer, and the layer to be peeled overlap one another, a fourth step of separating parts of the peeling layer and parts of the first layer that overlap the bonding layer to form a peeling trigger, and a fifth step of separating the peeling layer and the layer to be peeled.

By separating parts of the peeling layer and parts of the first layer to form the peeling trigger in the region where the bonding layer, the peeling layer, and the first layer overlap one another, the yield of peeling can be improved.

Another embodiment of the present invention is a peeling method that includes a first step of forming a peeling layer to a thickness of greater than or equal to 0.1 nm and less than 10 nm over a substrate, a second step of forming, on the peeling layer, a layer to be peeled including a first layer in contact with the peeling layer, a third step of curing a first bonding layer and a frame-shaped second bonding layer surrounding the first bonding layer while the first bonding layer, the second bonding layer, the peeling layer, and the layer to be peeled overlap one another, a fourth step of separating parts of the peeling layer and parts of the first layer overlapped by the second bonding layer to form a peeling trigger, and a fifth step of separating the peeling layer and the layer to be peeled.

By separating parts of the peeling layer and parts of the first layer to form the peeling trigger in the region where the second bonding layer, the peeling layer, and the first layer overlap one another, the yield of peeling can be improved. In addition, the layer to be peeled can be sealed by both the first bonding layer and the second bonding layer; thus, the reliability of a device to be fabricated can be increased.

Four examples of the peeling method of one embodiment of the present invention are described below. In each peeling method, the use of a thin peeling layer with a thickness of less than 10 nm enables a layer to be peeled to be peeled from a formation substrate with a small amount of peeling force regardless of the structure of the layer to be peeled.

It is preferable that the thickness of the entire peeling layer be, for example, greater than or equal to 0.1 nm and less than 10 nm. Note that one embodiment of the present invention is not limited thereto. For example, at least part of the peeling layer may have a thickness of greater than or equal to 0.1 nm and less than 10 nm. Alternatively, preferably 50% or more of the peeling layer, more preferably 90% or more of the peeling layer, may have a thickness of greater than or equal to 0.1 nm and less than 10 nm. In other words, in one embodiment of the present invention, part of the peeling layer may have a thickness of less than 0.1 nm or greater than or equal to 10 nm.

<Peeling Method 1>

First, a peeling layer 103 is formed to a thickness of less than 10 nm over a formation substrate 101, and a layer to be peeled 105 is formed over the peeling layer 103 (FIG. 1A). Although an example in which the peeling layer is formed to have an island shape is described here, one embodiment of the present invention is not limited to this example. The layer to be peeled 105 may be formed to have an island shape.

In this step, a material of the peeling layer 103 can be selected such that peeling occurs at the interface between the formation substrate 101 and the peeling layer 103, the interface between the peeling layer 103 and the layer to be peeled 105, or in the peeling layer 103 when the layer to be peeled 105 is peeled from the formation substrate 101. Although an example in which peeling occurs at the interface between the layer to be peeled 105 and the peeling layer 103 is described in this embodiment, one embodiment of the present invention is not limited to this example depending on the material used for the peeling layer 103 or the layer to be peeled 105. Note that in the case where the layer to be peeled 105 has a stacked-layer structure, a layer in contact with the peeling layer 103 is particularly referred to as a first layer.

The thickness of the peeling layer 103 can be, for example, less than 10 nm, preferably less than or equal to 8 nm, further preferably less than or equal to 5 nm, still further preferably less than or equal to 3 nm. The peeling layer 103 is preferably as thin as possible, in which case the yield of peeling can be improved. Alternatively, the thickness of the peeling layer 103 may be, for example, greater than or equal to 0.1 nm, preferably greater than or equal to 0.5 nm, further preferably greater than or equal to 1 nm. The peeling layer 103 is preferably as thick as possible, in which case the peeling layer 103 can be uniform. The thickness of the peeling layer 103 is preferably, for example, greater than or equal to 1 nm and less than or equal to 8 nm. In this embodiment, a 5-nm-thick tungsten film is used.

For example, the thickness of the peeling layer 103 is preferably within the range given above throughout the layer. Note that one embodiment of the present invention is not limited thereto. For example, at least part of the peeling layer 103 may have the thickness in the range given above. Alternatively, preferably 50% or more of the peeling layer 103, more preferably 90% or more of the peeling layer 103, may have the thickness in the range given above. In other words, in one embodiment of the present invention, part of the peeling layer 103 may have a thickness of less than 0.1 mm or greater than or equal to 10 nm.

As the formation substrate 101, a substrate having at least heat resistance high enough to withstand process temperature in a fabrication process is used. As the formation substrate 101, for example, a glass substrate, a quartz substrate, a sapphire substrate, a semiconductor substrate, a ceramic substrate, a metal substrate, a resin substrate, or a plastic substrate can be used.

Note that it is preferable to use a large-sized glass substrate as the formation substrate 101 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In the case where a glass substrate is used as the formation substrate 101, as a base film, an insulating film such as a silicon oxide film, a silicon oxynitride film, a silicon nitride film, or a silicon nitride oxide film is preferably formed between the formation substrate 101 and the peeling layer 103, in which case contamination from the glass substrate can be prevented.

The peeling layer 103 can be formed using an element selected from tungsten (W), molybdenum (Mo), titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The peeling layer 103 is preferably formed using a high melting point metal material such as tungsten, titanium, or molybdenum, in which case the degree of freedom of the process for forming the layer to be peeled 105 can be increased.

The peeling layer 103 can be formed by, for example, a sputtering method, a chemical vapor deposition (CVD) method (e.g., a plasma CVD method, a thermal CVD method, or a metal organic CVD (MOCVD) method), an atomic layer deposition (ALD) method, a coating method (e.g., a spin coating method, a droplet discharge method, or a dispensing method), a printing method, or an evaporation method.

In the case where the peeling layer 103 has a single-layer structure, a tungsten film, a molybdenum film, or a film containing a mixture of tungsten and molybdenum is preferably formed. Alternatively, a film containing an oxide or an oxynitride of tungsten, a film containing an oxide or an oxynitride of molybdenum, or a film containing an oxide or an oxynitride of a mixture of tungsten and molybdenum may be formed. Note that the mixture of tungsten and molybdenum is, for example, an alloy of tungsten and molybdenum. For example, an alloy film of molybdenum and tungsten with an atomic ratio of Mo:W=3:1, 1:1, or 1:3 may be used. For example, the alloy film of molybdenum and tungsten can be formed by a sputtering method using a metal target with a composition of Mo:W=49:51, 61:39, 14.8:85.2 [wt %].

The adhesion between the peeling layer 103 and the layer to be peeled formed later can be controlled by changing the state of a surface of the tungsten film. For example, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the film containing tungsten. Plasma treatment or heat treatment may be performed in an atmosphere of oxygen, nitrogen, or nitrous oxide alone, or a mixed gas of any of these gasses and another gas.

In one embodiment of the present invention, a tungsten film with a thickness of less than 10 nm is used. This enables peeling to be performed easily with a small amount of peeling force; thus, the above plasma treatment or heat treatment does not need to be performed. This can simplify a peeling process and a fabrication process of a device, which is preferable.

There is no particular limitation on a layer formed as the layer to be peeled 105. In this embodiment, an insulating layer in contact with the peeling layer 103 is formed on the peeling layer 103 as the layer to be peeled 105. Furthermore, a functional element may be formed over the insulating layer. For specific examples of the layer formed as the layer to be peeled 105, the description in Embodiment 2 can also be referred to.

The insulating layer over the peeling layer 103 preferably has a single-layer structure or a stacked-layer structure including any of a silicon nitride film, a silicon oxynitride film, a silicon oxide film, a silicon nitride oxide film, and the like.

The insulating layer can be formed by a sputtering method, a CVD method, an ALD method, a coating method, a printing method, an evaporation method, or the like. For example, the insulating layer is formed at a temperature higher than or equal to 250° C. and lower than or equal to 400° C. by a plasma CVD method, whereby the insulating layer can be a dense film having an excellent gas barrier property. Note that the thickness of the insulating layer is preferably greater than or equal to 10 nm and less than or equal to 3000 nm, further preferably greater than or equal to 200 nm and less than or equal to 1500 nm.

Figure 1C:
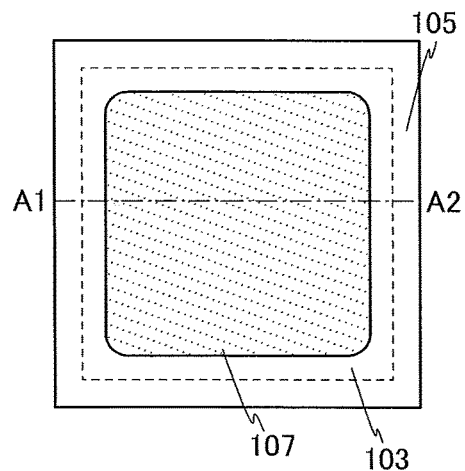
Figure 1B:
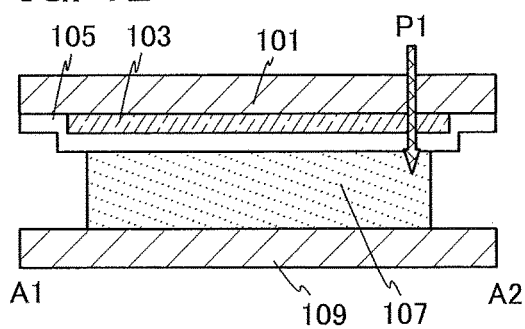

Next, the layer to be peeled 105 is attached to a substrate 109 with an bonding layer 107, and the bonding layer 107 is cured (FIG. 1B). FIG. 1B corresponds to a cross-sectional view taken along the dashed-dotted line A1-A2 in FIG. 1C. FIG. 1C is a plan view viewed from the substrate 109 side. Note that the substrate 109 is not illustrated in the plan view.

Here, the bonding layer 107 is provided so that it is overlapped by the peeling layer 103 and the layer to be peeled 105. As illustrated in FIGS. 1B and 1C, it is preferable that an end portion of the bonding layer 107 be not more on the outside than an end portion of the peeling layer 103.

Figure 2A:
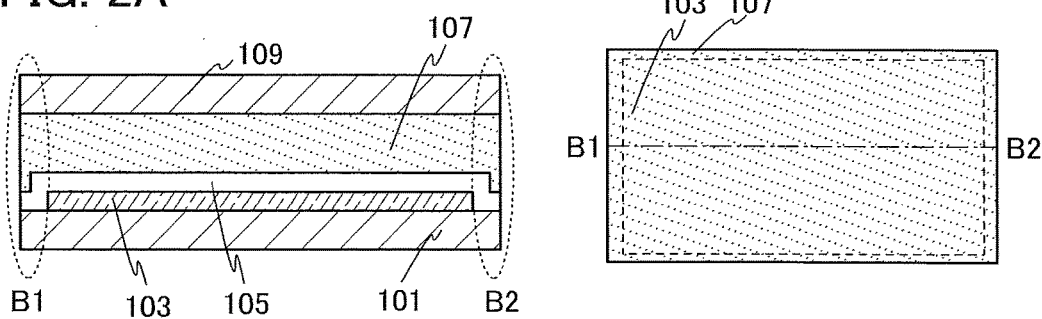
FIGS. 2A to 2C illustrate a peeling method.

FIG. 2A illustrates another structure example. FIG. 2A is a plan view viewed from the substrate 109 side and a cross-sectional view taken along the dashed-dotted line B1-B2 in the plan view. Note that the substrate 109 is not illustrated in the plan view. When the formation substrate 101 is attached to the substrate 109 with the bonding layer 107 in a region where the formation substrate 101 and the peeling layer 103 do not overlap each other and the substrate 109 and the peeling layer 103 do not overlap each other like a region surrounded by a dotted line in the cross-sectional view of FIG. 2A, failure of peeling is likely to occur depending on the area of the region and the degree of adhesion between the bonding layer 107 and a layer in contact with the bonding layer 107.

Thus, it is preferable that the bonding layer 107 be more on the inside than the peeling layer 103 (FIGS. 1B and 1C) or the end portion of the bonding layer 107 and the end portion of the peeling layer 103 be aligned with each other. The bonding layer 107 is preferably formed using a sheet-like adhesive (adhesive sheet) or a low-fluidity material, in which case the bonding layer 107 does not spread or is less likely to spread outside the peeling layer 103.

Figure 2B:
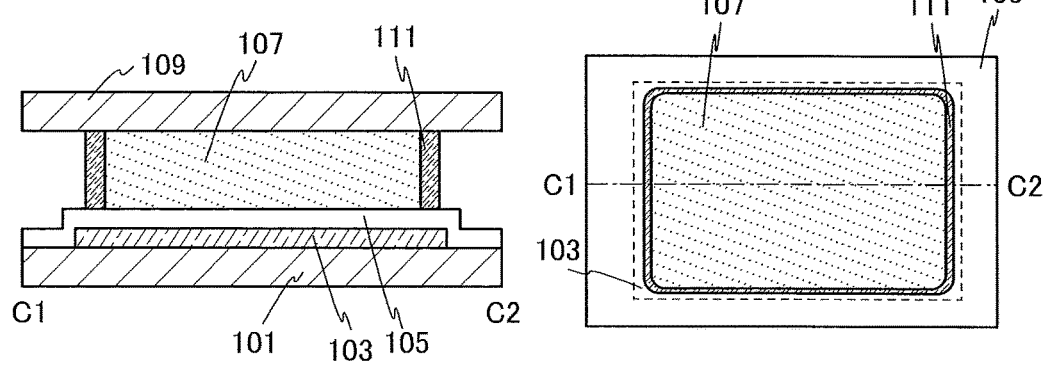

FIG. 2B is a plan view viewed from the substrate 109 side and a cross-sectional view taken along the dashed-dotted line C1-C2 in the plan view. Note that the substrate 109 is not illustrated in the plan view. As illustrated in FIG. 2B, it is preferable to provide a frame-shaped bonding layer 111 over the layer to be peeled 105 or the peeling layer 103 and to form the bonding layer 107 in a region surrounded by the frame-shaped bonding layer 111. This can prevent the bonding layer 107 from spreading outside the peeling layer 103 and the yield of a peeling process from being decreased. The structure illustrated in FIG. 2B is preferably employed, in which case a liquid adhesive can be used for the bonding layer and the range of materials for the bonding layer can be expanded.

It is particularly preferable that an end portion of the frame-shaped bonding layer 111 be more on the inside than the end portion of the peeling layer 103. This enables the end portion of the bonding layer 107 to be also more on the inside than the end portion of the peeling layer 103. Note that the frame-shaped bonding layer 111 and the end portion of the peeling layer 103 may overlap each other.

The formation order of the frame-shaped bonding layer 111 and the bonding layer 107 is not limited. For example, the bonding layer 107 may be formed by a screen printing method or the like, and then the frame-shaped bonding layer 111 may be formed by a coating method or the like. Alternatively, the frame-shaped bonding layer 111 may be formed by a coating method or the like, and then the bonding layer 107 may be formed using an apparatus for a one drop fill (ODF) method or the like.

Figure 2C:
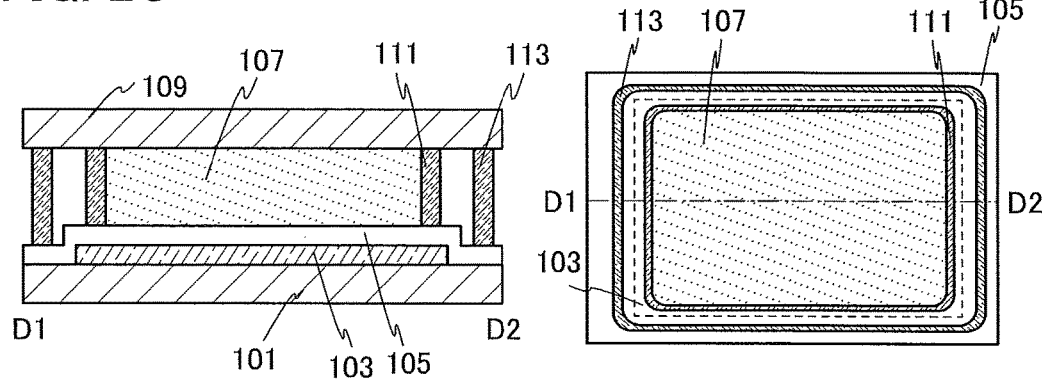

As illustrated in FIG. 2C, a resin layer 113 may be provided outside the frame-shaped bonding layer 111 or the bonding layer 107. FIG. 2C is a plan view viewed from the substrate 109 side and a cross-sectional view taken along the dashed-dotted line D1-D2 in the plan view. Note that the substrate 109 is not illustrated in the plan view. The resin layer 113 can prevent entry of impurities such as moisture into the layer to be peeled 105 even when the device under manufacture is exposed to an air atmosphere during the fabrication process.

Note that the layer to be peeled 105 and the substrate 109 are preferably attached to each other in a reduced-pressure atmosphere.

As the bonding layer 107, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. A material with low moisture permeability, such as an epoxy resin, is particularly preferable. Alternatively, a two-component-mixture-type resin may be used. Alternatively, a sheet-like adhesive may be used.

The resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the device.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

Alternatively, an adhesive with which the substrate 109 and the layer to be peeled 105 can be chemically or physically separated when necessary, such as an adhesive that is soluble in water or a solvent or an adhesive that is capable of being plasticized upon irradiation of UV light, can be used for the bonding layer 107. For example, a water-soluble resin may be used.

As the substrate 109, a variety of substrates that can be used as the formation substrate 101 can be used. Alternatively, a film-like flexible substrate may be used.

Materials that can be used for the frame-shaped bonding layer 111 and the resin layer 113 are the same as the material that can be used for the bonding layer 107.

The frame-shaped bonding layer 111 may be in any of a cured state, a semi-cured state, and uncured state as long as the bonding layer 107 can be prevented from spreading outside the peeling layer 103. In the case where the frame-shaped bonding layer 111 is in a cured state, a peeling trigger, which is described later, is preferably formed in a region overlapping the frame-shaped bonding layer 111. This enables the frame-shaped bonding layer 111 together with the bonding layer 107 to be used as a layer for sealing the layer to be peeled 105 after peeling, which prevents deterioration of the functional element due to entry of moisture in the air. Thus, a highly reliable device can be fabricated. Note that when the frame-shaped bonding layer 111 is cured, it is preferable that an end portion of the frame-shaped bonding layer 111 be not more on the outside than the end portion of the peeling layer 103 in order to prevent a decrease in the yield of the peeling process.

In the case where a photocurable resin is used for the bonding layer 107 and the frame-shaped bonding layer 111, light for curing the photocurable resin needs to be transmitted through the formation substrate, the peeling layer, and the layer to be peeled. Note that depending on the material, the peeling layer with too large thickness has a low light-transmitting property as in the case of using a metal film such as a tungsten film; thus, light for curing a photocurable resin hardly passes through the peeling layer. This causes a problem in that, for example, a photocurable resin is not cured or it takes a long time to cure a photocurable resin. Since the peeling layer with a small thickness of less than 10 nm is used in one embodiment of the present invention, the following advantages are obtained: the bonding layer can be reliably cured or the bonding layer can be cured in a short time, and a wide range of materials can be used for the peeling layer.

Moreover, when the resin layer 113 is in a cured state, the yield of a subsequent peeling process might be decreased because of the degree of adhesion between the formation substrate 101 and the substrate 109. Thus, at least part of the resin layer 113 is preferably in a semi-cured state or an uncured state. With the use of a material having high viscosity for the resin layer 113, an effect of preventing entry of impurities such as moisture in the air into the layer to be peeled 105 can be increased even when the resin layer 113 is in a semi-cured state or an uncured state.

For example, a photocurable resin is used for the resin layer 113 and is partly irradiated with light, so that part of the resin layer 113 is cured. Part of the resin layer 113 is preferably cured, in which case the gap between the formation substrate 101 and the substrate 109 and the positions thereof can remain unchanged even when the device under manufacture is moved from a reduced-pressure atmosphere to the air atmosphere during the process.

Figure 1D:
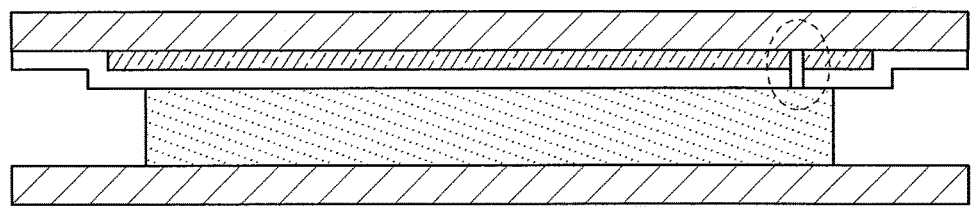

Next, a peeling trigger is formed by laser light irradiation (FIGS. 1B and 1D).

Laser light irradiation is preferably employed, in which case the substrate does not need to be, for example, cut to form a peeling trigger and generation of dust or the like can be prevented.

A region where the cured bonding layer 107, the layer to be peeled 105, and the peeling layer 103 overlap each other is irradiated with laser light (see an arrow P1 in FIG. 1B). In the case where the frame-shaped bonding layer 111 is in a cured state in FIGS. 2B and 2C, a region where the frame-shaped bonding layer 111, the layer to be peeled 105, and the peeling layer 103 overlap each other is preferably irradiated with laser light.

Although laser light irradiation may be performed from either substrate side, it is preferable to perform laser light irradiation from the formation substrate 101 side on which the peeling layer 103 is provided so that irradiation of the functional element or the like with scattered light can be suppressed. Note that a material that transmits the laser light is used for the substrate on the side where laser light irradiation is performed.

Part of the first layer (a layer that is included in the layer to be peeled 105 and is in contact with the peeling layer 103) can be removed and the peeling trigger (see a region surrounded by a dotted line in FIG. 1D) can be formed by cracking at least part of the first layer or causing film breakage. At this time, not only the first layer but also the peeling layer 103, the bonding layer 107, or another layer included in the layer to be peeled 105 may be partly removed. Laser light irradiation enables part of the films to be dissolved, evaporated, or thermally broken. A method for forming the peeling trigger is not limited as long as at least part of the first layer is peeled from the peeling layer, and part of the first layer is not necessarily removed.

In the peeling process, the force of separating the layer to be peeled 105 and the peeling layer 103 is preferably concentrated at the peeling trigger; thus, it is preferable to form the peeling trigger not at the center portion of the bonding layer 107 in a cured state but in the vicinity of the end portion of the bonding layer 107. It is particularly preferable to form the peeling trigger in the vicinity of the corner portion compared to the vicinity of the side portion among the vicinities of the end portion.

The peeling trigger is preferably formed in the form of a solid line or a dashed line by continuously or intermittently irradiating the vicinity of the end portion of the bonding layer 107 with laser light, in which case peeling is performed easily.

There is no particular limitation on a laser used to form a peeling trigger. For example, a continuous wave laser or a pulsed oscillation laser can be used. Note that the conditions for laser light irradiation such as frequency, power density, energy density, and beam profile are controlled as appropriate in consideration of the thicknesses, the materials, or the like of the formation substrate 101 and the peeling layer 103.

Figure 1E:
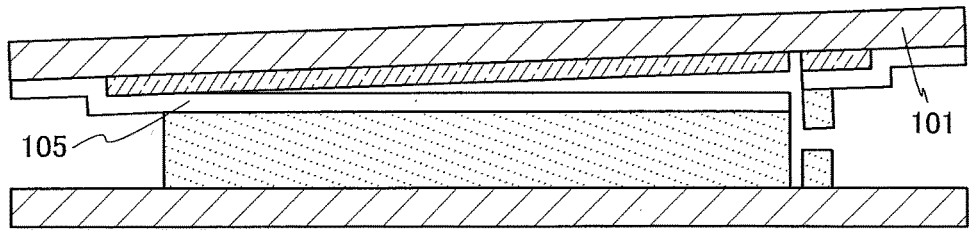
Figure 1F:
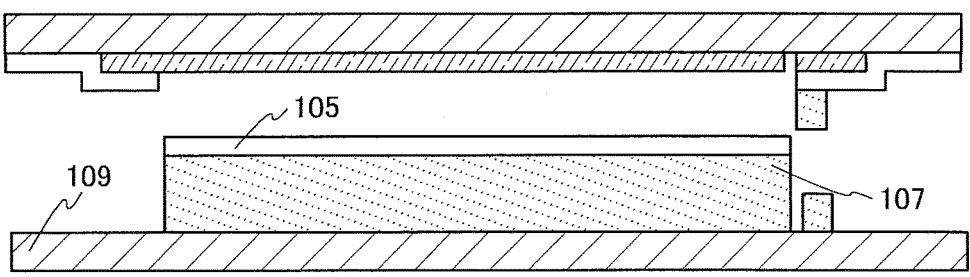

Then, the layer to be peeled 105 and the formation substrate 101 are separated from the formed peeling trigger (FIGS. 1E and 1F). As a result, the layer to be peeled 105 can be transferred from the formation substrate 101 to the substrate 109. At this time, one of the substrates is preferably fixed to a suction stage or the like. For example, the formation substrate 101 may be fixed to the suction stage to peel the layer to be peeled 105 from the formation substrate 101. Alternatively, the substrate 109 may be fixed to a suction stage to peel the formation substrate 101 from the substrate 109. Note that the bonding layer 107 that is more on the outside than the peeling trigger remains on at least one of the formation substrate 101 and the substrate 109. Although FIGS. 1E and 1F illustrate an example in which the bonding layer 107 remains on both substrates, one embodiment of the present invention is not limited to this example.

For example, the layer to be peeled 105 and the formation substrate 101 may be separated by mechanical force (a peeling process with a human hand or a gripper, a peeling process by rotation of a roller, or the like) from the peeling trigger.

The formation substrate 101 and the layer to be peeled 105 may be separated by filling the interface between the peeling layer 103 and the layer to be peeled 105 with liquid such as water. A portion between the peeling layer 103 and the layer to be peeled 105 absorbs a liquid through capillarity action, so that the peeling layer 103 can be separated easily. Furthermore, an adverse effect on the functional element included in the layer to be peeled 105 due to static electricity caused at the time of peeling (e.g., a phenomenon in which a semiconductor element is damaged by static electricity) can be suppressed. Note that liquid can be sprayed in the form of mist or steam. As the liquid, pure water, an organic solvent, a neutral, alkaline, or acid aqueous solution, an aqueous solution in which a salt is dissolved, or the like can be used.

Note that after the peeling, the bonding layer 107, the frame-shaped bonding layer 111, the resin layer 113, and the like that remain on the substrate 109 and does not contribute to attachment of the layer to be peeled 105 and the substrate 109 may be removed. Such removal is preferable because an adverse effect on the functional element in a subsequent step (e.g., entry of impurities) can be suppressed. An unnecessary resin can be removed by, for example, wiping or cleaning.

In the above-described peeling method of one embodiment of the present invention, peeling is performed in such a manner that the peeling trigger is formed by laser light irradiation and then the interface between the peeling layer 103 and the layer to be peeled 105 is made in a state where peeling is easily performed. This can improve the yield of the peeling process.

<Peeling Method 2>

First, in the same manner as Peeling Method 1, the peeling layer 103 with a thickness of less than 10 nm is formed over the formation substrate 101, and the layer to be peeled 105 is formed over the peeling layer 103 (FIG. 1A). Then, the layer to be peeled 105 is attached to the substrate 109 with the bonding layer 107 and the frame-shaped bonding layer 111, and the bonding layer 107 and the frame-shaped bonding layer 111 are cured (FIG. 3A).

Figure 3A:
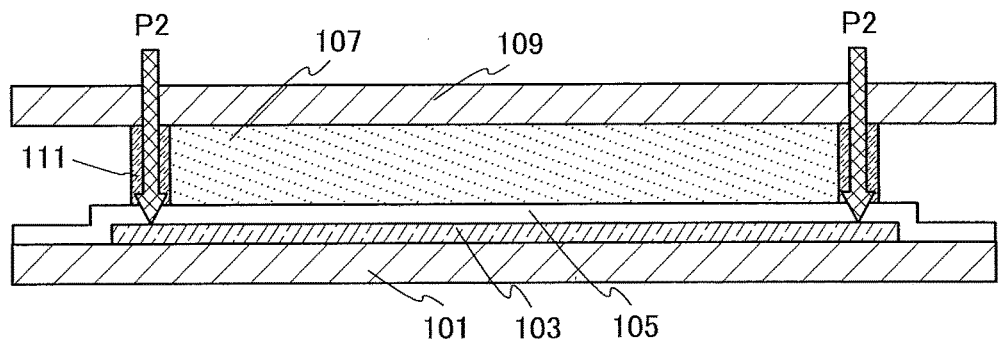
FIGS. 3A to 3D illustrate a peeling method.
Figure 3B:
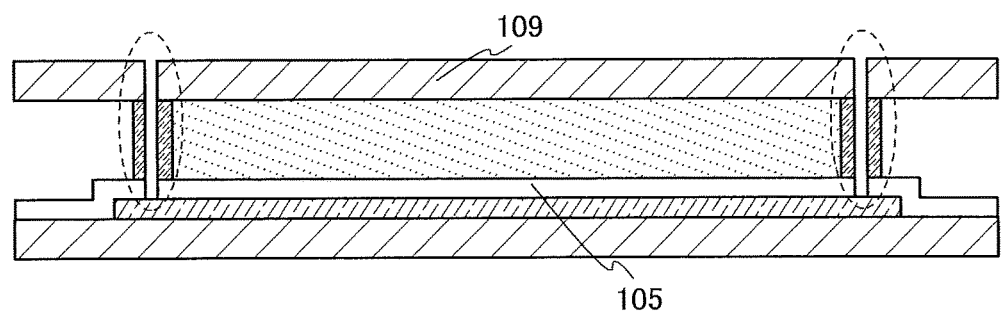

Next, a peeling trigger is formed by a sharp knife such as a cutter knife (FIGS. 3A and 3B).

In the case where the substrate 109 on the side where the peeling layer 103 is not provided can be cut by a knife or the like, a cut may be made in the substrate 109, the bonding layer 107 or the frame-shaped bonding layer 111, and the layer to be peeled 105 (see arrows P2 in FIG. 3A). This enables parts of the first layer to be removed to form peeling triggers (see regions surrounded by dotted lines in FIG. 3B). Here, an example in which the peeling trigger in the form of a solid line is formed by making a cut in a region where the frame-shaped bonding layer 111 in a cured state and the peeling layer 103 overlap each other; however, one embodiment of the present invention is not limited to such an example. Note that a cut may be made in the peeling layer 103.

Figure 3C:
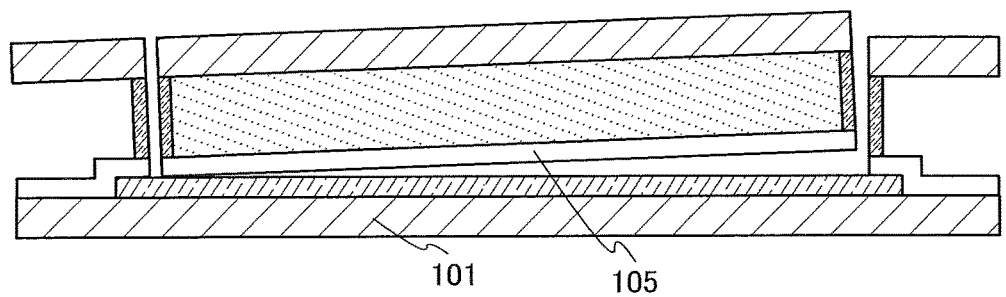
Figure 3D:
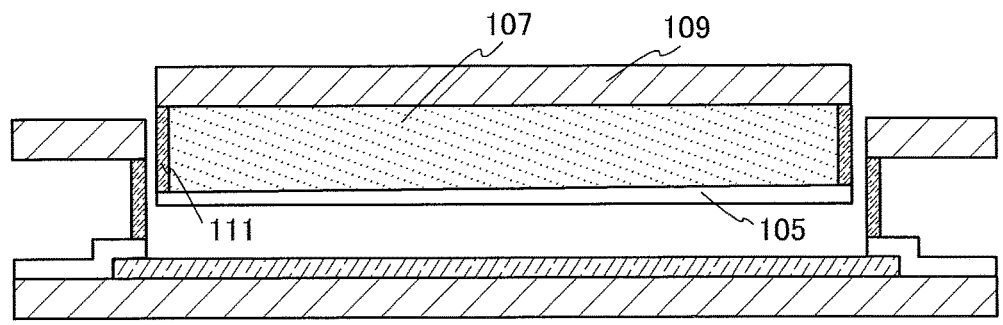

Then, the layer to be peeled 105 and the formation substrate 101 are separated from the formed peeling trigger (FIGS. 3C and 3D). This enables the layer to be peeled 105 to be transferred from the formation substrate 101 to the substrate 109.

In the above-described peeling method of one embodiment of the present invention, peeling is performed in such a manner that the peeling trigger is faulted by a sharp knife or the like and then the interface between the peeling layer 103 and the layer to be peeled 105 is made in a state where peeling can be easily performed. This can improve the yield of the peeling process. Moreover, owing to the peeling from the region where the frame-shaped bonding layer 111 in a cured state and the peeling layer 103 overlap each other, the layer to be peeled 105 can be double sealed by the bonding layer 107 and the frame-shaped bonding layer 111. Therefore, even when an organic EL element or the like that is likely to deteriorate due to moisture or the like is formed in the layer to be peeled 105, a highly reliable light-emitting device can be fabricated.

<Peeling Method 3>

Figure 4A:
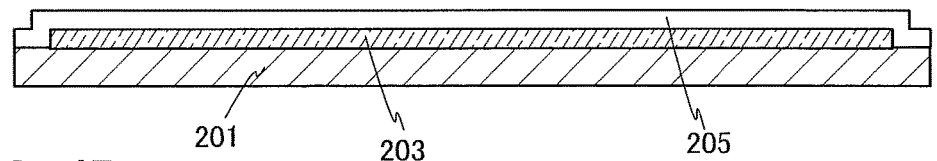
FIGS. 4A to 4D illustrate a peeling method.
Figure 4B:
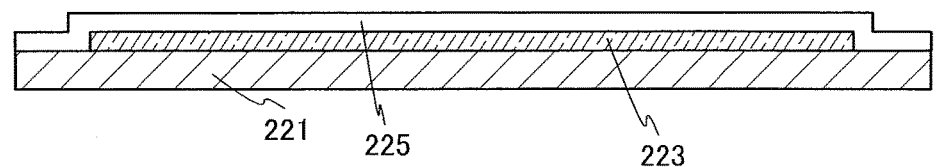

First, a peeling layer 203 with a thickness of less than 10 nm is formed over a formation substrate 201, and a layer to be peeled 205 is formed over the peeling layer 203 (FIG. 4A). In addition, a peeling layer 223 is formed over a formation substrate 221, and a layer to be peeled 225 is formed over the peeling layer 223 (FIG. 4B).

Figure 4C:
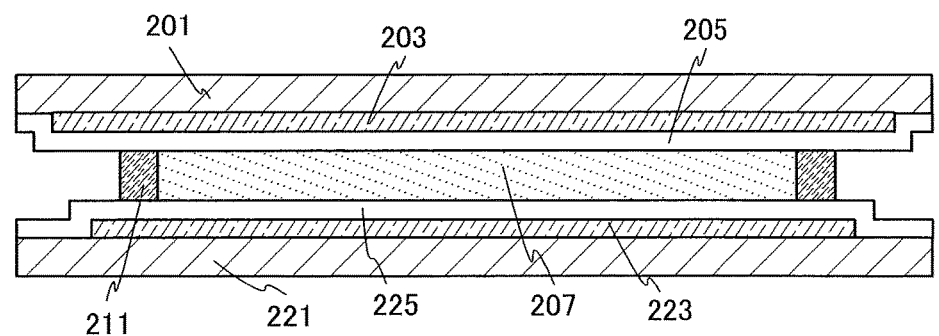

Next, the formation substrate 201 and the formation substrate 221 are attached to each other with a bonding layer 207 and a frame-shaped bonding layer 211 so that surfaces on which the layers to be peeled are formed face each other, and then the bonding layer 207 and the frame-shaped bonding layer 211 are cured (FIG. 4C). Here, the frame-shaped bonding layer 211 and the bonding layer 207 that is more on the inside than the frame-shaped bonding layer 211 are provided over the layer to be peeled 225, and then the formation substrate 201 and the formation substrate 221 are made to face each other and attached to each other.

Note that the formation substrate 201 and the formation substrate 221 are preferably attached to each other in a reduced-pressure atmosphere.

Figure 4D:
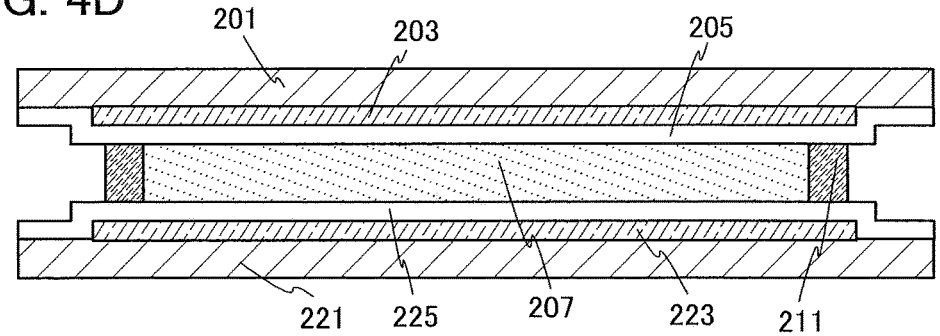

Note that although FIG. 4C illustrates the case where the peeling layer 203 and the peeling layer 223 have different sizes, the peeling layers may have the same size as illustrated in FIG. 4D.

The bonding layer 207 is positioned so as to be overlapped by the peeling layer 203 and the layer to be peeled 205 and to overlap the layer to be peeled 225 and the peeling layer 223. Then, an end portion of the bonding layer 207 is preferably more on the inside than at least an end portion of either the peeling layer 203 or the peeling layer 223 (the peeling layer that is desirably peeled first). This can prevent strong adhesion between the formation substrate 201 and the formation substrate 221; thus, a decrease in the yield of a subsequent peeling process can be suppressed.

Figure 5A:
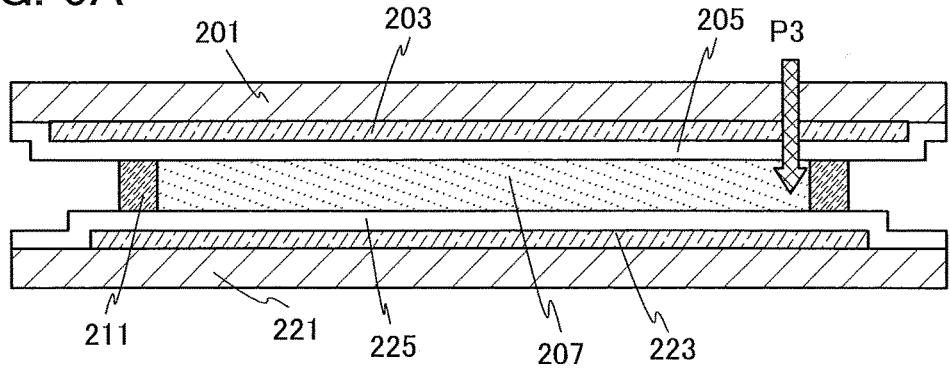
FIGS. 5A to 5D illustrate a peeling method.
Figure 5B:
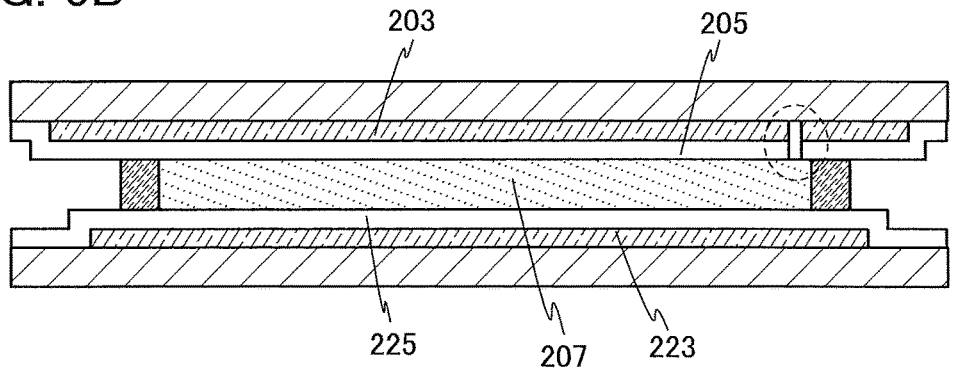

Next, a peeling trigger is formed by laser light irradiation (FIGS. 5A and 5B).

Either the formation substrate 201 or the formation substrate 221 may be peeled first. In the case where the peeling layers have different sizes, a substrate over which a larger peeling layer is formed may be peeled first or a substrate over which a smaller peeling layer is formed may be peeled first. In the case where an element such as a semiconductor element, a light-emitting element, or a display element is formed only over one of the substrates, the substrate on the side where the element is formed may be peeled first or the other substrate may be peeled first. Here, an example in which the formation substrate 201 is peeled first is described.

A region where the bonding layer 207 in a cured state or the frame-shaped bonding layer 211 in a cured state, the layer to be peeled 205, and the peeling layer 203 overlap one another is irradiated with laser light. Described here as an example is the case where the bonding layer 207 is in a cured state and the frame-shaped bonding layer 211 is not in a cured state, and the bonding layer 207 in a cured state is irradiated with laser light (see an arrow P3 in FIG. 5A).

Part of the first layer is removed, so that a peeling trigger can be formed (see a region surrounded by a dotted line in FIG. 5B). At this time, not only the first layer but also the peeling layer 203, the bonding layer 207, or another layer included in the layer to be peeled 205 may be partly removed.

It is preferable that laser light irradiation be performed from the substrate side where the peeling layer that is desirably peeled is provided. In the case where a region where the peeling layer 203 and the peeling layer 223 overlap each other is irradiated with laser light, the formation substrate 201 and the peeling layer 203 can be selectively separated by cracking only the layer to be peeled 205 and not the layer to be peeled 225 (see a region surrounded by a dotted line in FIG. 5B).

When a peeling trigger is formed in both the layer to be peeled 205 on the peeling layer 203 side and the layer to be peeled 225 on the peeling layer 223 side in the case where the region where the peeling layer 203 and the peeling layer 223 overlap each other is irradiated with laser light, it might be difficult to selectively separate one of the formation substrates. Thus, laser light irradiation conditions might be restricted so that only one of the layers to be peeled is cracked.

Figure 8A:
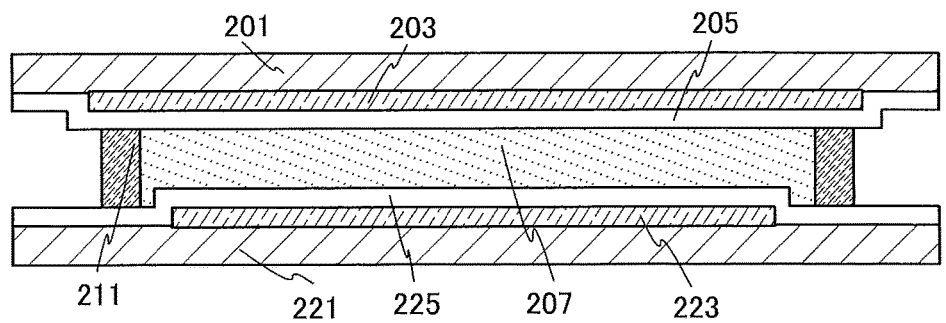
FIGS. 8A to 8C illustrate a peeling method.
Figure 8B:
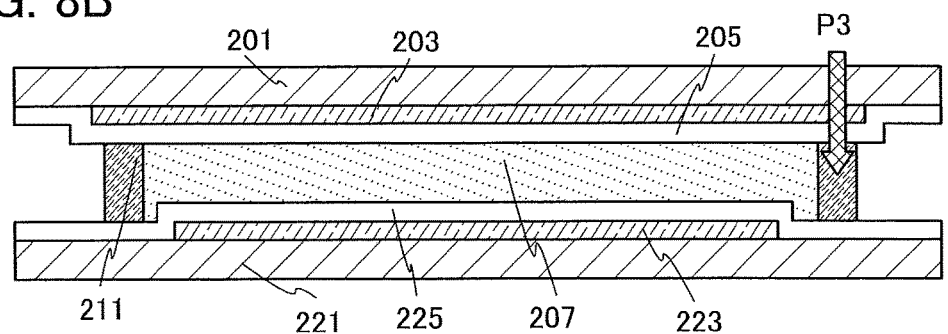
Figure 8C:
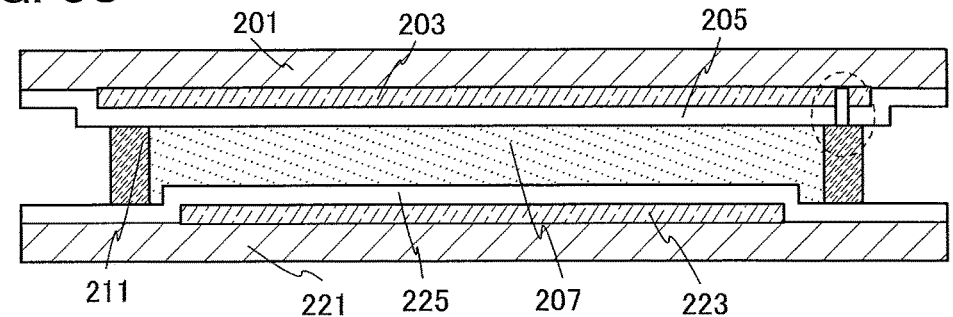

In the case of a structure illustrated in FIG. 8A, a peeling trigger can be prevented from being formed in both the peeling layer 203 and the peeling layer 223 by irradiating a region that is overlapped by the peeling layer 203 and does not overlap the peeling layer 223 with laser light (FIGS. 8B and 8C). This can ease restriction on the laser light irradiation conditions, which is preferable. Although laser light irradiation may be performed from either substrate side in that case, it is preferable to perform laser irradiation from the formation substrate 201 side where the peeling layer 203 is provided so that irradiation of the functional element or the like with scattered light can be prevented.

Figure 5C:
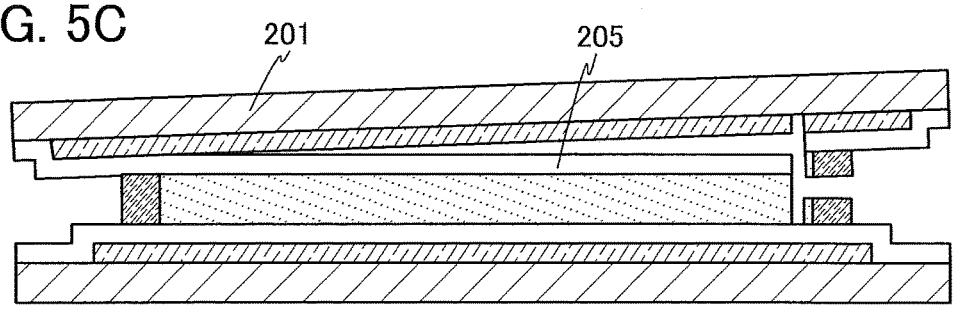
Figure 5D:
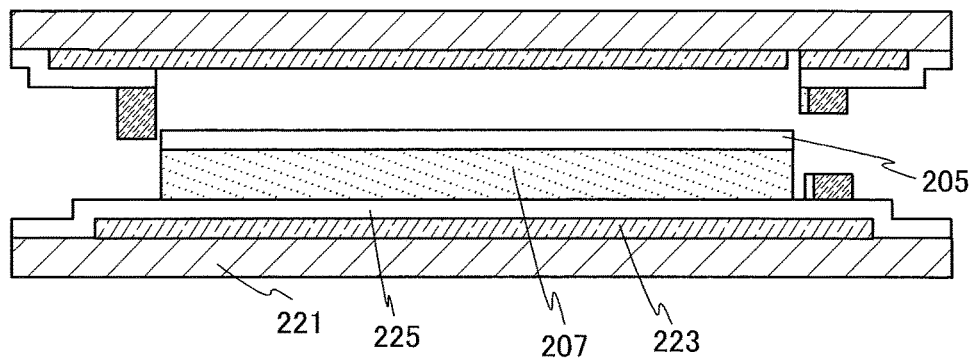

Then, the layer to be peeled 205 and the formation substrate 201 are separated from the formed peeling trigger (FIGS. 5C and 5D). This enables the layer to be peeled 205 to be transferred from the formation substrate 201 to the formation substrate 221. Note that the bonding layer 207 and the frame-shaped bonding layer 211 that are formed more on the outside than the peeling trigger remain on at least one of the formation substrate 201 and the formation substrate 221. FIGS. 5C and 5D illustrate an example in which the bonding layer 207 and the frame-shaped bonding layer 211 remain on both sides, one embodiment of the present invention is not limited to this example.

Figure 6A:
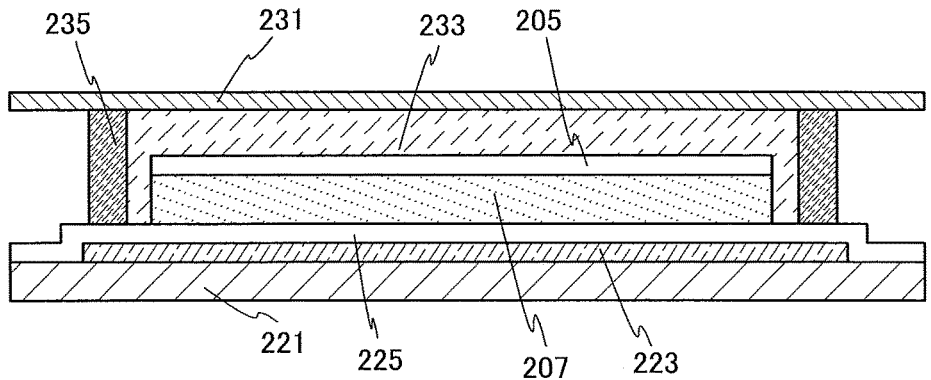
FIGS. 6A to 6D illustrate a peeling method.

Next, the exposed layer to be peeled 205 is attached to a substrate 231 with a bonding layer 233, and the bonding layer 233 is cured (FIG. 6A). Here, a frame-shaped bonding layer 235 and the bonding layer 233 surrounded by the frame-shaped bonding layer 235 are provided over the layer to be peeled 225, and then the layer to be peeled 225 and the flexible substrate 231 are attached to each other.

Note that the layer to be peeled 205 and the substrate 231 are preferably attached to each other in a reduced-pressure atmosphere.

Figure 6B:
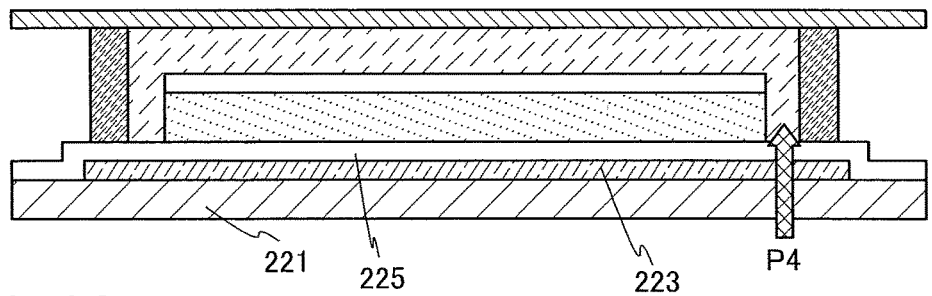
Figure 6C:
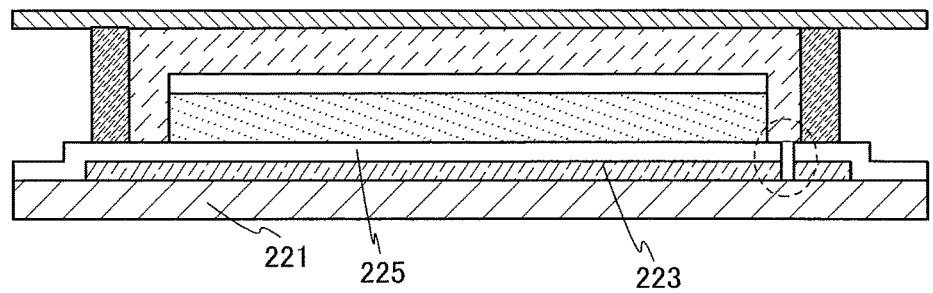

Next, a peeling trigger is formed by laser light irradiation (FIGS. 6B and 6C).

Described here as an example is the case where the bonding layer 233 is in a cured state and the frame-shaped bonding layer 235 is not in a cured state, and the bonding layer 233 in a cured state is irradiated with laser light (see an arrow P4 in FIG. 6B). Part of the first layer is removed, so that a peeling trigger can be formed (see a region surrounded by a dotted line in FIG. 6C). At this time, not only the first layer but also the peeling layer 223, the bonding layer 233, or another layer included in the layer to be peeled 225 may be partly removed.

It is preferable that laser light irradiation be performed from the formation substrate 221 side where the peeling layer 223 is provided.

Figure 6D:
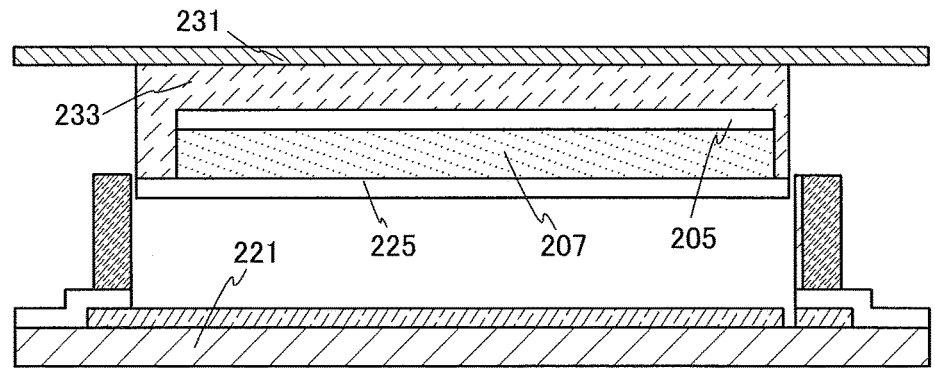

Then, the layer to be peeled 225 and the formation substrate 221 are separated from the formed peeling trigger (FIG. 6D). This enables the layer to be peeled 205 and the layer to be peeled 225 to be transferred to the substrate 231.

In the above-described peeling method of one embodiment of the present invention, peeling is performed after the following steps: the pair of formation substrates each provided with the peeling layer and the layer to be peeled are attached to each other, the peeling trigger is formed by laser light irradiation, and then the interface between each peeling layer and each layer to be peeled is made in a state where peeling can be easily performed. This can improve the yield of the peeling process.

Alternatively, attachment of a substrate included in a device that is desirably fabricated can be performed after the following steps: a pair of formation substrates each provided with a layer to be peeled are attached to each other, and peeling is performed. This means that formation substrates having low flexibility can be used for attaching the layers to be peeled to each other. Thus, the alignment accuracy at the time of attachment can be improved as compared to the case where flexible substrates are attached to each other.

<Peeling Method 4>

In Peeling Method 4, steps up to the first peeling process are the same as those in Peeling Method 3. Steps after the step in FIG. 5D is described below in detail.

Figure 7A:
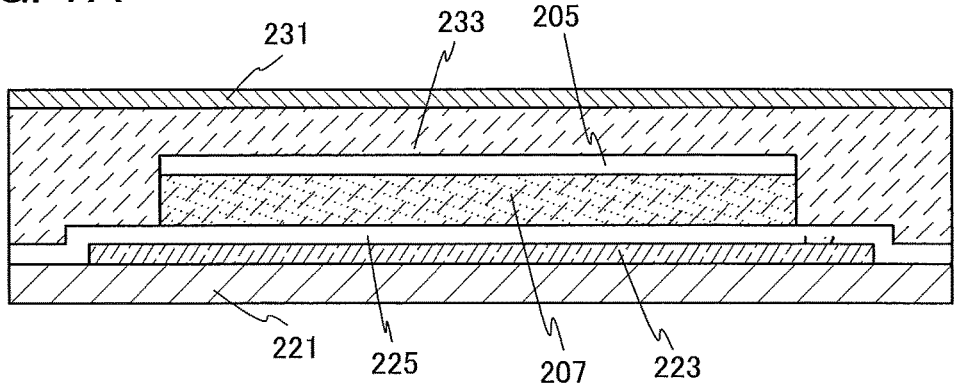
FIGS. 7A to 7D illustrate a peeling method.

The layer to be peeled 205 that is peeled from the formation substrate 201 in the step illustrated in FIG. 5D is attached to the substrate 231 with the bonding layer 233, and the bonding layer 233 is cured (FIG. 7A).

Figure 7B:
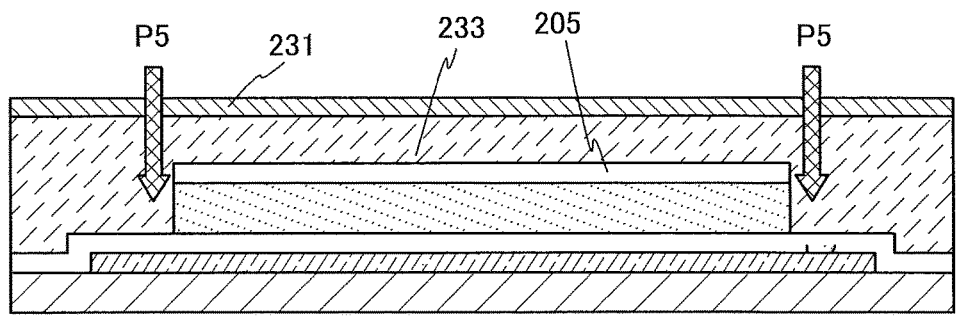
Figure 7C:
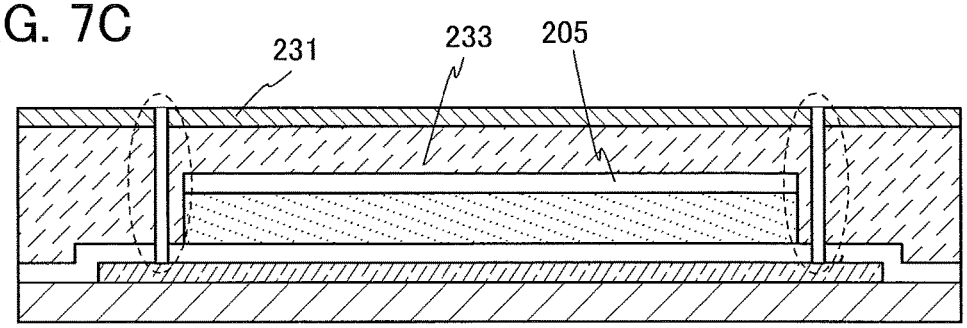

Next, a peeling trigger is formed by a sharp knife such as a cutter knife (FIGS. 7B and 7C).

In the case where the substrate 231 on the side where the peeling layer 223 is not provided can be cut by a sharp knife or the like, the cut may be made in the substrate 231, the bonding layer 233, and the layer to be peeled 225 (see arrows P5 in FIG. 7B). This enables part of the first layer to be removed; thus, the peeling trigger can be formed (see a region surrounded by a dotted line in FIG. 7C).

As illustrated in FIGS. 7B and 7C, in the case where the formation substrate 221 and the substrate 231 are attached to each other with the bonding layer 233 in a region where the substrates and the peeling layer 223 do not overlap each other, the yield of a subsequent peeling process might be decreased depending on the degree of adhesion between the formation substrate 221 and the substrate 231. Thus, it is preferable to make a cut in the form of a frame shape in a region where the bonding layer 233 in a cured state and the peeling layer 223 overlap each other to form a peeling trigger in the form of a solid line. This can improve the yield of the peeling process.

Figure 7D:
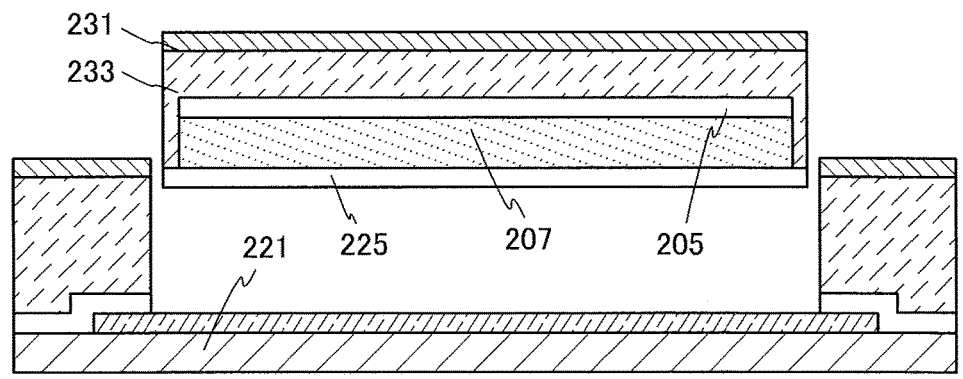

Then, the layer to be peeled 225 and the formation substrate 221 are separated from the formed peeling trigger (FIG. 7D). This enables the layer to be peeled 225 to be transferred from the formation substrate 221 to the substrate 231.

In the above-described peeling method of one embodiment of the present invention, peeling is performed in such a manner that the peeling trigger is formed by a sharp knife or the like and then the interface between the peeling layer and the layer to be peeled is made in a state where peeling can be easily performed. This can improve the yield of the peeling process.

Bonding of a substrate over which a device that is desirably fabricated can be performed after the following steps: a pair of formation substrates each provided with a layer to be peeled are attached to each other and then peeling is performed. This means that formation substrates having low flexibility can be used for attaching the layers to be peeled to each other. Thus, the alignment accuracy at the time of attachment can be improved as compared to the case where flexible substrates are attached to each other.

Figure 9A:
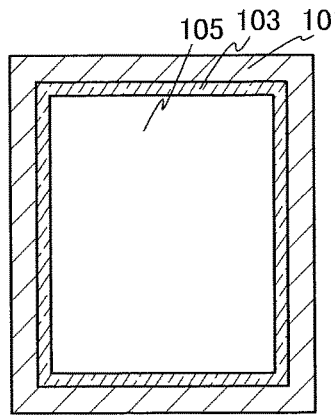
FIGS. 9A to 9C illustrate planar shapes of a peeling layer and FIGS. 9D to 9I illustrate examples of electronic appliances.
Figure 9B:
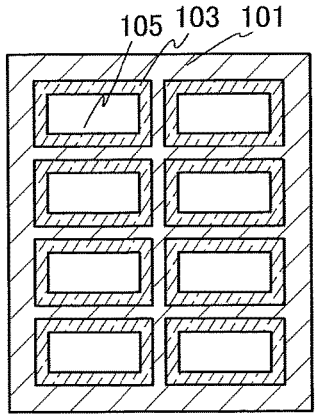
Figure 9C:
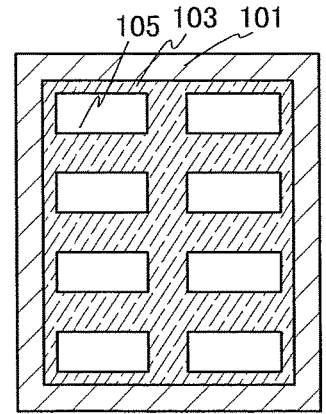

In each of the above-described peeling methods, an end portion of a region that can be peeled and transferred is more on the inside than the end portion of the peeling layer 103. The peeling layer 103 and the layer to be peeled 105 are formed so that an end portion of the layer to be peeled 105 is more on the inside than an end portion of the peeling layer 103 as illustrated in FIGS. 9A to 9C. In the case where there are a plurality of layers to be peeled 105, the peeling layer 103 may be provided for each of the layers to be peeled 105 as illustrated in FIG. 9B, or a plurality of layers to be peeled 105 may be provided over one peeling layer 103 as illustrated in FIG. 9C.

As described above, the use of any of the peeling methods of embodiments of the present invention enables a layer to be peeled to be peeled with a small amount of force and the layer to be peeled to be prevented from being cracked when peeled regardless of the structure of the layer to be peeled. Thus, a decrease in the yield of the peeling process can be suppressed.

This embodiment can be combined with any of the other embodiments as appropriate.

Embodiment 2

In this embodiment, a flexible light-emitting device that can be fabricated according to one embodiment of the present invention is described with reference to FIGS. 10A to 10C, FIGS. 11A to 11C, FIGS. 12A1, 12A2, 12B, and 12C, FIGS. 13A and 13B, and FIGS. 14A1, 14A2, 14B, and 14C.

FIGS. 10A to 10C, FIGS. 11A to 11C, FIGS. 12A1, 12A2, 12B, and 12C, FIGS. 13A and 13B, and FIGS. 14A1, 14A2, 14B, and 14C illustrate examples of flexible light-emitting devices each including an organic EL element as a light-emitting element. The flexible light-emitting devices of embodiments of the present invention can be bent with a radius of curvature of greater than or equal to 1 mm and less than or equal to 150 mm. The direction in which the light-emitting device is bent is not limited. The number of bent portions may be one or more than one. For example, the light-emitting device can be folded in two or three.

A light-emitting device of one embodiment of the present invention includes, for example, a first flexible substrate, a second flexible substrate, a light-emitting element between the first flexible substrate and the second flexible substrate, a first insulating layer between the first flexible substrate and the light-emitting element, and a first bonding layer between the second flexible substrate and the light-emitting element. The light-emitting element includes a layer containing a light-emitting organic compound between a pair of electrodes. The water vapor transmission rate of the first insulating layer is less than $1\times10^{-5}$ g/m$^2$·day.

In the light-emitting device, it is preferable that a second insulating layer be provided between the second flexible substrate and the first bonding layer and the water vapor transmission rate of the second insulating layer be less than $1\times10^{-5}$ g/m$^2$·day. In addition, it is preferable to form a frame-shaped second bonding layer surrounding the first bonding layer in the light-emitting device.

Note that the light-emitting device in this specification includes, in its category, a display device using a light-emitting element. Furthermore, the category of the light-emitting device in this specification includes a module in which a light-emitting element is provided with a connector such as an anisotropic conductive film or a tape carrier package (TCP); a module having a TCP at the tip of which a printed wiring board is provided; and a module in which an integrated circuit (IC) is directly mounted on a light-emitting element by a chip on glass (COG) method. The category also includes light-emitting devices used in lighting equipment and the like.

Structure Example 1

Figure 10A:
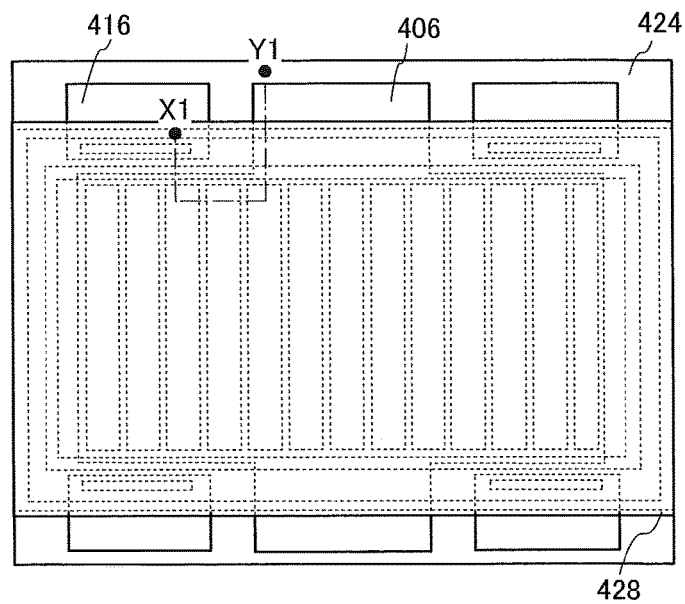
FIGS. 10A to 10C illustrate examples of light-emitting devices.
Figure 10B:
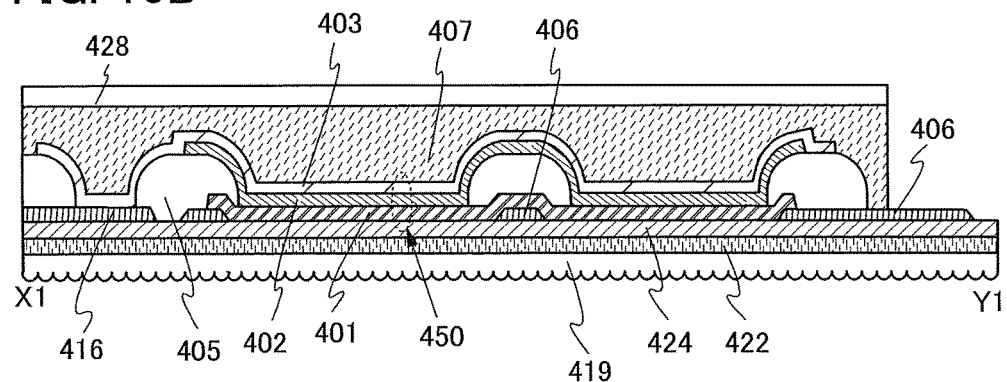
Figure 10C:
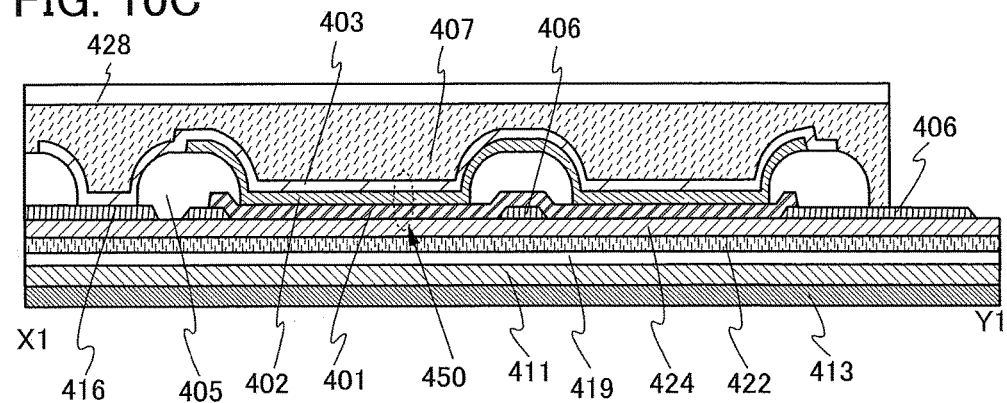

FIG. 10A is a plan view of a light-emitting device, and FIGS. 10B and 10C are each an example of a cross-sectional view taken along the dashed-dotted line X1-Y1 in FIG. 10A. The light-emitting devices illustrated in FIGS. 10A to 10C are bottom-emission light-emitting devices.

The light-emitting devices in FIGS. 10B and 10C each include a flexible substrate 419, an adhesive layer 422, an insulating layer 424, a conductive layer 406, a conductive layer 416, an insulating layer 405, an organic EL element 450 (a first electrode 401, an EL layer 402, and a second electrode 403), a bonding layer 407, and a flexible substrate 428. The first electrode 401, the insulating layer 424, the adhesive layer 422, and the flexible substrate 419 transmit visible light.

The organic EL element 450 is provided over the flexible substrate 419 with the adhesive layer 422 and the insulating layer 424 therebetween. The organic EL element 450 is sealed by the flexible substrate 419, the bonding layer 407, and the flexible substrate 428. The organic EL element 450 includes the first electrode 401, the EL layer 402 over the first electrode 401, and the second electrode 403 over the EL layer 402. It is preferable that the second electrode 403 reflect visible light.

End portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 therebetween functions as an auxiliary wiring and is electrically connected to the first electrode 401. It is preferable that the auxiliary wiring be electrically connected to the electrode of the organic EL element, in which case a voltage drop due to the electrical resistance of the electrode can be inhibited. Note that the conductive layer 406 may be provided over the first electrode 401. Furthermore, an auxiliary wiring that is electrically connected to the second electrode 403 may be provided, for example, over the insulating layer 405.

To increase the light outcoupling efficiency of the light-emitting device, a light outcoupling structure is preferably provided on the side from which light emitted from the light-emitting element is extracted. FIG. 10B illustrates an example in which the flexible substrate 419 from which the light emitted from the light-emitting element is extracted also serves as the light outcoupling structure. Note that in the light-emitting device of one embodiment of the present invention, a touch sensor or the light outcoupling structure such as a sheet having a function of diffusing light may be provided so as to be overlapped by the flexible substrate. Moreover, a polarizing plate or a retardation plate may be provided. FIG. 10C illustrates a case where a diffusion plate 411 and a touch sensor 413 are provided so as to be overlapped by the flexible substrate 419. A touch sensor or the like can be provided also in each structure described below.

The insulating layer 424 preferably has an excellent gas barrier property to prevent moisture and oxygen from entering the light-emitting device from the flexible substrate 419 side.

In this specification, the gas transmission rate, the oxygen transmission rate, or the water vapor transmission rate of the layer having an excellent gas barrier property is, for example, less than or equal to $1\times10^{-5}$ [g/m$^2$·day], preferably less than or equal to $1\times10^{-6}$ [g/m$^2$·day], further preferably less than or equal to $1\times10^{-7}$ [g/m$^2$·day], still further preferably less than or equal to $1\times10^{-8}$ [g/m$^2$·day].

The light-emitting device described as Structure Example 1 can be fabricated with a high yield by using any of the peeling methods of embodiments of the present invention. In particular, Peeling Method 1 or Peeling Method 2 described in Embodiment 1 can be used. In the peeling method of one embodiment of the present invention, the insulating layer 424 is formed as a layer to be peeled over a formation substrate, so that the insulating layer 424 can be formed at a high temperature. By using the layer that is formed at a high temperature and has an excellent gas barrier property as the insulating layer 424, the light-emitting device can be highly reliable. Note that the organic EL element 450 or the like as well as the insulating layer 424 may be formed as a layer to be peeled.

Structure Example 2

Figure 11A:
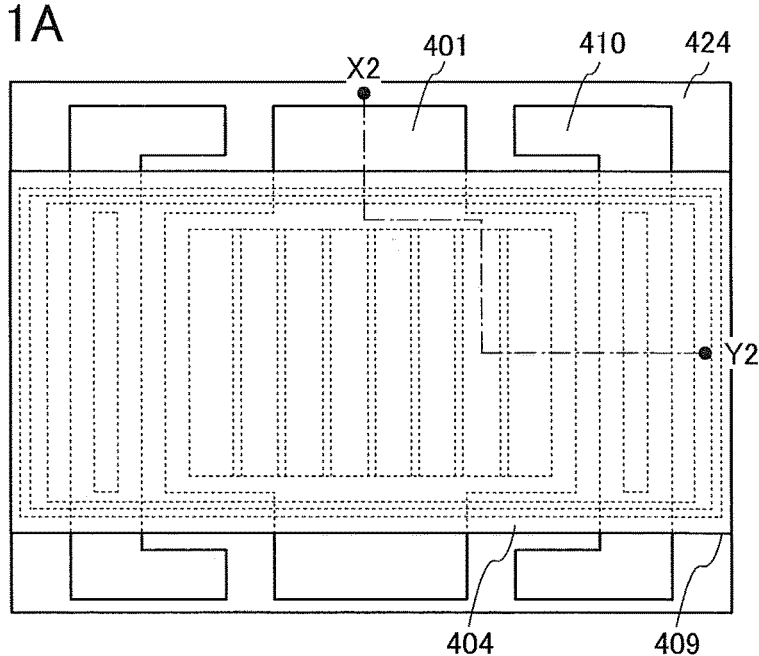
FIGS. 11A to 11C illustrate examples of light-emitting devices.
Figure 11B:
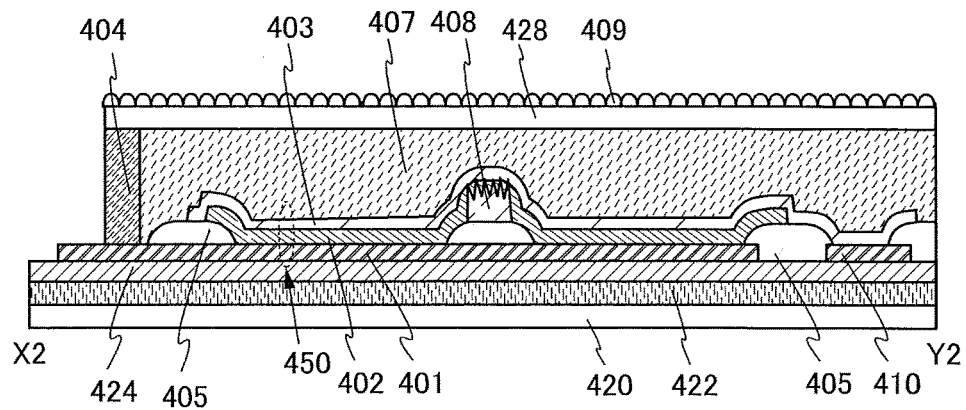
Figure 11C:
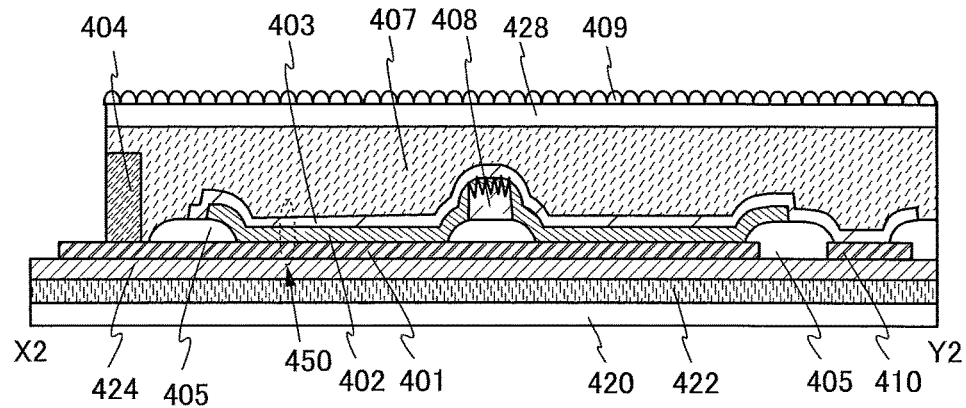

FIG. 11A is a plan view of a light-emitting device, and FIGS. 11B and 11C are each an example of a cross-sectional view taken along the dashed-dotted line X2-Y2 in FIG. 11A. The light-emitting devices illustrated in FIGS. 11A to 11C are top-emission light-emitting devices.

The light-emitting devices in FIGS. 11B and 11C each include a flexible substrate 420, the adhesive layer 422, the insulating layer 424, a conductive layer 408, the insulating layer 405, the organic EL element 450 (the first electrode 401, the EL layer 402, and the second electrode 403), a conductive layer 410, a frame-shaped bonding layer 404, the bonding layer 407, the flexible substrate 428, and a light outcoupling structure 409. The second electrode 403, the bonding layer 407, the flexible substrate 428, and the light outcoupling structure 409 transmit visible light.

The organic EL element 450 is provided over the flexible substrate 420 with the adhesive layer 422 and the insulating layer 424 therebetween. The organic EL element 450 is sealed by the flexible substrate 420, the bonding layer 407, the frame-shaped bonding layer 404, and the flexible substrate 428. The organic EL element 450 includes the first electrode 401, the EL layer 402 over the first electrode 401, and the second electrode 403 over the EL layer 402. It is preferable that the first electrode 401 reflect visible light. The light outcoupling structure 409 is attached to a surface of the flexible substrate 428.

End portions of the first electrode 401 and the conductive layer 410 are covered with the insulating layer 405. The conductive layer 410 can be formed using the same process and material as those of the first electrode 401 and is electrically connected to the second electrode 403.

The conductive layer 408 over the insulating layer 405 functions as an auxiliary wiring and is electrically connected to the second electrode 403. The conductive layer 408 is provided over the second electrode 403. Furthermore, as in Structure Example 1, an auxiliary wiring that is electrically connected to the first electrode 401 may be provided.

Here, the light-emitting device of one embodiment of the present invention includes the light-emitting element sealed by the pair of flexible substrates and the bonding layers.

The bonding layer is not covered at a side surface of the light-emitting device. For this reason, impurities such as moisture and oxygen enter the organic EL element from the outside when the bonding layer has a poor gas barrier property. The entry of impurities into the organic EL element causes, for example, shrinkage of a light-emitting portion (here, luminance degradation from an end portion of the light-emitting portion or an increase in a non-light-emitting region in the light-emitting portion). Thus, the bonding layer that covers the organic EL element preferably has an excellent gas barrier property (in particular, low water vapor and oxygen transmission rates).

In the case where a liquid composition whose volume is greatly reduced by curing is used as a material of the bonding layer, stress is applied to the organic EL element, which might damage the organic EL element and cause poor light emission. Thus, a reduction in the volume due to curing of a material used for the bonding layer is preferably as small as possible.

In the case where the bonding layer is positioned on the side from which light emitted from the organic EL element is extracted, the light-transmitting property of the bonding layer is preferably high so that the light outcoupling efficiency of the light-emitting device is increased. For a similar purpose, the refractive index of the bonding layer is preferably high.

There are a plurality of properties that are required for the bonding layer as described above, and it is very difficult for a material of the bonding layer to exhibit two or more of those properties.

In view of the above, the light-emitting device of one embodiment of the present invention includes two or more kinds of bonding layers between a flexible substrate and an organic EL element. Specifically, for example, one bonding layer having a more excellent gas barrier property than the other bonding layer surrounds the other. A material of the outer bonding layer has a more excellent gas barrier property than a material of the inner bonding layer. Thus, even when a material having a poor gas barrier property and having a small reduction in volume due to curing, a high light-transmitting property (particularly, visible light transmittance), or a high refractive index is used for the inner bonding layer, for example, moisture and oxygen can be prevented from entering the light-emitting device from the outside. Thus, a highly reliable light-emitting device in which shrinkage of a light-emitting portion is suppressed can be obtained.

The light-emitting device described as Structure Example 2 includes the bonding layer 407 and the frame-shaped bonding layer 404 surrounding the bonding layer 407, between the flexible substrate 428 and the organic EL element 450.

The frame-shaped bonding layer 404 preferably has a more excellent gas barrier property than the bonding layer 407. The gas transmission rate, the oxygen transmission rate, or the water vapor transmission rate of the frame-shaped bonding layer 404 is, for example, less than or equal to $1\times10^{-5}$ [g/m$^2$·day], preferably less than or equal to $1\times10^{-6}$ [g/m$^2$·day], further preferably less than or equal to $1\times10^{-7}$ [g/m$^2$·day], still further preferably less than or equal to $1\times10^{-8}$ [g/m$^2$·day].

In Structure Example 2, light emitted from the organic EL element 450 is extracted from the light-emitting device through the bonding layer 407. For this reason, the bonding layer 407 preferably has a higher light-transmitting property than the frame-shaped bonding layer 404. In addition, the bonding layer 407 preferably has a higher refractive index than the frame-shaped bonding layer 404. Furthermore, the volume of the bonding layer 407 is preferably less reduced by curing than that of the frame-shaped bonding layer 404.

The frame-shaped bonding layer 404 and the bonding layer 407 may be in contact with the flexible substrate 428 as illustrated in FIG. 11B, or the frame-shaped bonding layer 404 is not necessarily in contact with the flexible substrate 428 as illustrated in FIG. 11C. In addition, the frame-shaped bonding layer 404 may be positioned in an end portion of the light-emitting device as illustrated in FIG. 11B, or the frame-shaped bonding layer 404 and the bonding layer 407 may be positioned in the end portion of the light-emitting device as illustrated in FIG. 11C.

The light-emitting device described as Structure Example 2 can be fabricated with a high yield by using any of the peeling methods of embodiments of the present invention. In particular, Peeling Method 1 or Peeling Method 2 described in Embodiment 1 can be used. In the peeling method of one embodiment of the present invention, the insulating layer 424 is formed as a layer to be peeled over a formation substrate, so that the insulating layer 424 can be formed at a high temperature. By using the layer that is formed at a high temperature and has an excellent gas barrier property as the insulating layer 424, the light-emitting device can have high reliability. Note that the organic EL element 450 or the like as well as the insulating layer 424 may be formed as a layer to be peeled.

Structure Example 3

Figure 12B:
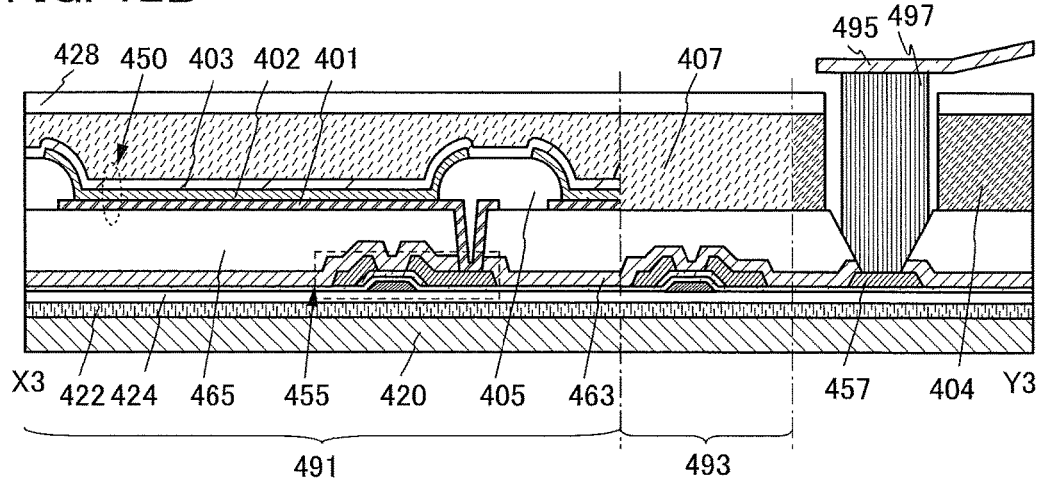

FIG. 12A1 is a plan view of a light-emitting device, and FIG. 12B is an example of a cross-sectional view taken along the dashed-dotted line X3-Y3 in FIG. 12A1. The light-emitting device illustrated in FIG. 12B is a top-emission light-emitting device using a separate coloring method. In this embodiment, the light-emitting device can have a structure in which light-emitting units of three colors of, for example, red (R), green (G), and blue (B) express one color, a structure in which light-emitting units of four colors of R, G, B, and white (W) express one color, or the like. The color element is not particularly limited and colors other than R, G, B, and W may be used. For example, yellow, cyan, magenta, and the like may be used.

The light-emitting device illustrated in FIG. 12A1 includes a light-emitting portion 491, a driver circuit portion 493, and a flexible printed circuit (FPC) 495. An organic EL element and a transistor included in the light-emitting portion 491 and the driver circuit portion 493 are sealed by the flexible substrate 420, the flexible substrate 428, the frame-shaped bonding layer 404, and the bonding layer 407. FIG. 12B illustrates an example in which the conductive layer 457 and a connector 497 are connected to each other through an opening in the frame-shaped bonding layer 404.

The light-emitting device illustrated in FIG. 12B includes the flexible substrate 420, the adhesive layer 422, the insulating layer 424, a transistor 455, an insulating layer 463, an insulating layer 465, the insulating layer 405, the organic EL element 450 (the first electrode 401, the EL layer 402, and the second electrode 403), the frame-shaped bonding layer 404, the bonding layer 407, the flexible substrate 428, and the conductive layer 457. The flexible substrate 428, the bonding layer 407, and the second electrode 403 transmit visible light.

In the light-emitting portion 491 of the light-emitting device in FIG. 12B, the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. It is preferable that the first electrode 401 reflect visible light. The end portion of the first electrode 401 is covered with the insulating layer 405.

The driver circuit portion 493 includes a plurality of transistors. FIG. 12B illustrates one of the transistors in the driver circuit portion 493.

The conductive layer 457 is electrically connected to an external input terminal through which a signal (e.g., a video signal, a clock signal, a start signal, and a reset signal) or a potential from the outside is transmitted to the driver circuit portion 493. Here, an example in which the FPC 495 is provided as the external input terminal is described.

To prevent an increase in the number of fabrication steps, the conductive layer 457 is preferably formed using the same material and step as those of the electrode or the wiring in the light-emitting portion or the driver circuit portion. Here, an example in which the conductive layer 457 is formed using the same material and step as those of the electrodes included in the transistor is described.

The insulating layer 463 has an effect of suppressing diffusion of impurities into a semiconductor included in the transistor. As the insulating layer 465, an insulating layer having a planarization function is preferably selected in order to reduce surface unevenness due to the transistor.

The frame-shaped bonding layer 404 preferably has a more excellent gas barrier property than the bonding layer 407 to prevent entry of moisture and oxygen from the outside into the light-emitting device. Thus, the light-emitting device can be highly reliable.

In Structure Example 3, light emitted from the organic EL element 450 is extracted from the light-emitting device through the bonding layer 407. For this reason, the bonding layer 407 preferably has a higher light-transmitting property than the frame-shaped bonding layer 404. In addition, the bonding layer 407 preferably has a higher refractive index than the frame-shaped bonding layer 404. Furthermore, it is preferable that the volume of the bonding layer 407 be less reduced by curing than that of the frame-shaped bonding layer 404.

The light-emitting device described as Structure Example 3 can be fabricated with a high yield by using any of the peeling methods of embodiments of the present invention. In particular, Peeling Method 1 or Peeling Method 2 described in Embodiment 1 can be used. In the peeling method of one embodiment of the present invention, the insulating layer 424 and the transistor are formed as a layer to be peeled over a formation substrate, so that the insulating layer 424 and the transistor can be formed at a high temperature. By using the insulating layer 424 and the transistor that are formed at a high temperature, the light-emitting device can be highly reliable. Note that the organic EL element 450 or the like may be further formed as a layer to be peeled.

Structure Example 4

Figure 12C:
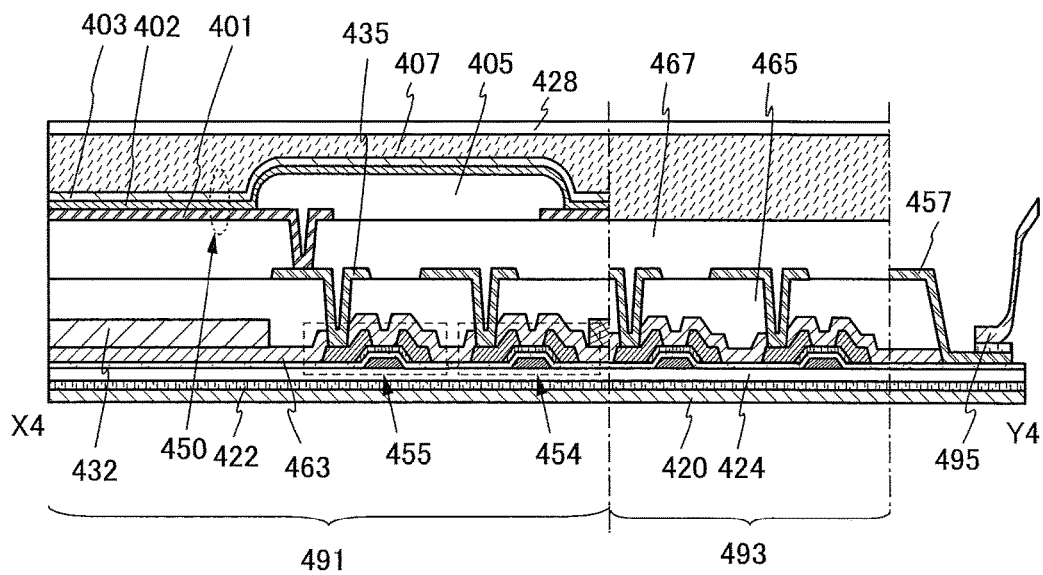

FIG. 12A2 is a plan view of the light-emitting device, and FIG. 12C is a cross-sectional view taken along the dashed-dotted line X4-Y4 in FIG. 12A2. The light-emitting device illustrated in FIG. 12C is a bottom-emission light-emitting device using a color filter method.

The light-emitting device illustrated in FIG. 12C includes the flexible substrate 420, the adhesive layer 422, the insulating layer 424, a transistor 454, the transistor 455, the insulating layer 463, a coloring layer 432, the insulating layer 465, a conductive layer 435, an insulating layer 467, the insulating layer 405, the organic EL element 450 (the first electrode 401, the EL layer 402, and the second electrode 403), the bonding layer 407, the flexible substrate 428, and a conductive layer 457. The flexible substrate 420, the adhesive layer 422, the insulating layer 424, the insulating layer 463, the insulating layer 465, the insulating layer 467, and the first electrode 401 transmit visible light.

In the light-emitting portion 491 of the light-emitting device illustrated in FIG. 12C, the switching transistor 454, the current control transistor 455, and the organic EL element 450 are provided over the flexible substrate 420 with the adhesive layer 422 and the insulating layer 424 therebetween. The organic EL element 450 includes the first electrode 401 over the insulating layer 467, the EL layer 402 over the first electrode 401, and the second electrode 403 over the EL layer 402. The first electrode 401 is electrically connected to the source electrode or the drain electrode of the transistor 455 through the conductive layer 435. The end portion of the first electrode 401 is covered with the insulating layer 405. It is preferable that the second electrode 403 reflect visible light. Moreover, the light-emitting device includes the coloring layer 432 overlapped by the organic EL element 450 over the insulating layer 463.

The driver circuit portion 493 includes a plurality of transistors. FIG. 12C illustrates two of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and step as those of the conductive layer 435 is described.

The insulating layer 463 has an effect of suppressing diffusion of impurities into a semiconductor included in the transistor. As the insulating layer 465 and the insulating layer 467, an insulating layer having a planarization function is preferably selected in order to reduce surface unevenness due to the transistors and wirings.

Figure 13A:
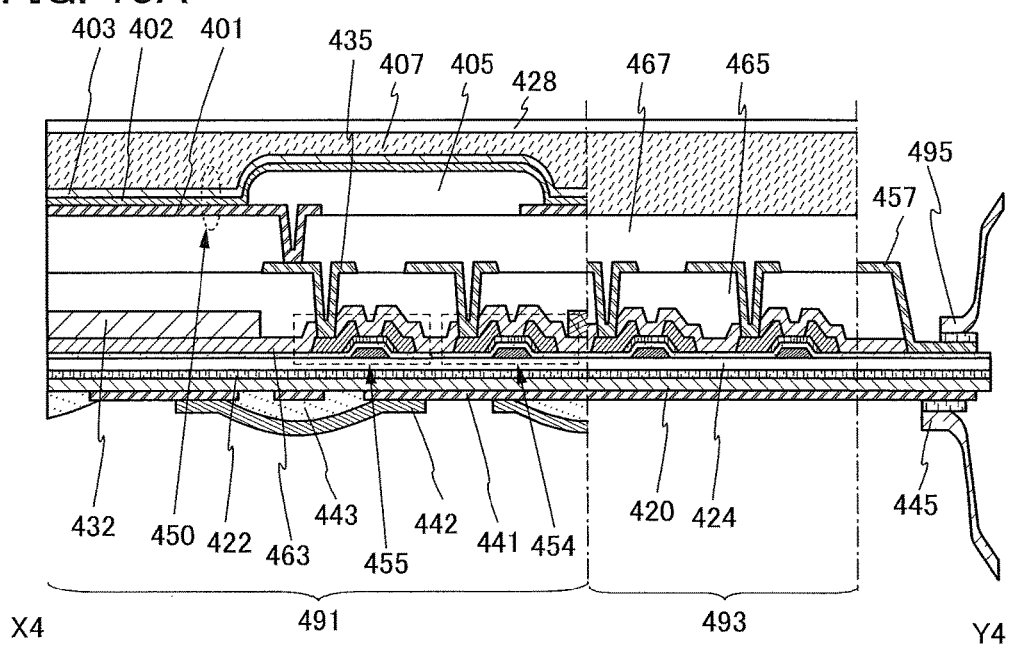
FIGS. 13A and 13B illustrate examples of light-emitting devices.
Figure 13B:
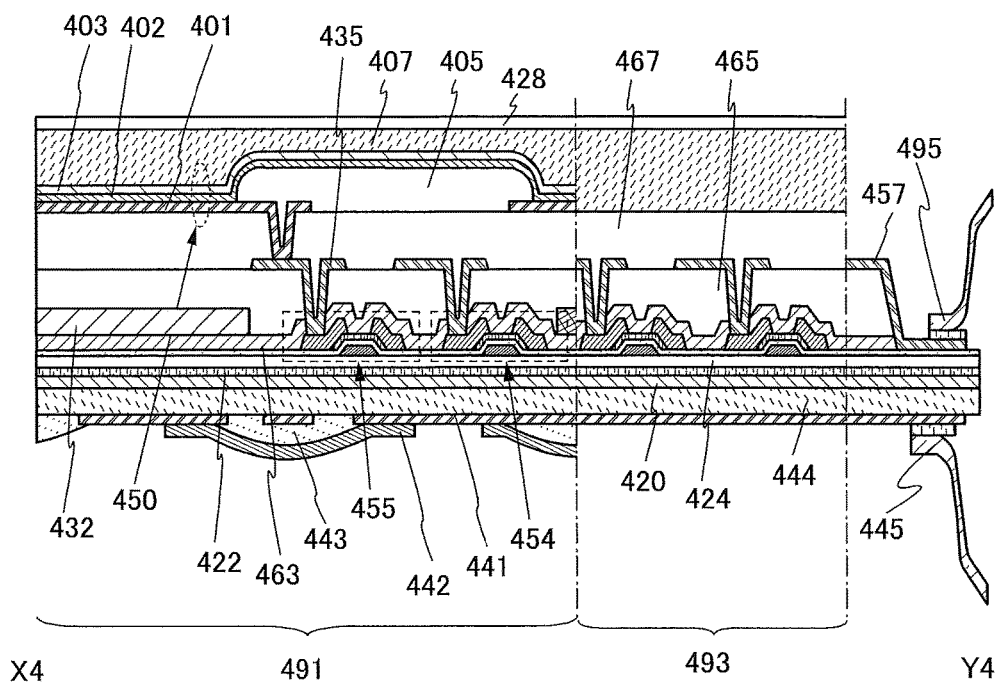

Note that a touch sensor may be provided so as to be overlapped by the flexible substrate 420 as illustrated in FIG. 13A. The touch sensor includes a conductive layer 441, a conductive layer 442, and an insulating layer 443. As illustrated in FIG. 13B, a flexible substrate 444 may be provided between the flexible substrate 420 and the touch sensor. Note that the touch sensor may be provided between the flexible substrate 420 and the flexible substrate 444. An FPC 445 for the touch sensor may also be provided.

The light-emitting device described as Structure Example 4 can be fabricated with a high yield by using any of the peeling methods of embodiments of the present invention. In particular, Peeling Method 1 or Peeling Method 2 described in Embodiment 1 can be used. In the peeling method of one embodiment of the present invention, the insulating layer 424 and the transistors are formed as a layer to be peeled over a formation substrate, so that the insulating layer 424 and the transistors can be formed at a high temperature. By using the insulating layer 424 and the transistors that are formed at a high temperature, the light-emitting device can be highly reliable. Note that the organic EL element 450 or the like may be further formed as a layer to be peeled.

Structure Example 5

FIG. 14A1 is a plan view of a light-emitting device, and FIG. 14B is a cross-sectional view taken along the dashed-dotted line X5-Y5 in FIG. 14A1. The light-emitting device illustrated in FIG. 14A1 is a top-emission light-emitting device using a color filter method.

The light-emitting device illustrated in FIG. 14B includes the flexible substrate 420, the adhesive layer 422, the insulating layer 424, the transistor 455, the insulating layer 463, the insulating layer 465, the insulating layer 405, a spacer 496, the organic EL element 450 (the first electrode 401, the EL layer 402, and the second electrode 403), the bonding layer 407, an overcoat 453, a light-blocking layer 431, the coloring layer 432, an insulating layer 226, an adhesive layer 426, the flexible substrate 428, and a conductive layer 457. The flexible substrate 428, the adhesive layer 426, the insulating layer 226, the bonding layer 407, the overcoat 453, and the second electrode 403 transmit visible light.

In the light-emitting portion 491 of the light-emitting device in FIG. 14B, the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. The end portion of the first electrode 401 is covered with the insulating layer 405. It is preferable that the first electrode 401 reflect visible light. The spacer 496 is provided over the insulating layer 405. The spacer 496 can adjust the gap between the flexible substrates 420 and 428.

In addition, the light-emitting device includes the coloring layer 432 that overlaps the organic EL element 450 with the bonding layer 407 therebetween, and the light-blocking layer 431 that overlaps the insulating layer 405 with the bonding layer 407 therebetween.

The driver circuit portion 493 includes a plurality of transistors. FIG. 14B illustrates one of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and step as those of the electrodes included in the transistor 455 is described.

In the light-emitting device illustrated in FIG. 14B, the FPC 495 overlaps the flexible substrate 428. The connector 497 is connected to the conductive layer 457 through an opening in the flexible substrate 428, the adhesive layer 426, the insulating layer 226, the bonding layer 407, the insulating layer 465, and the insulating layer 463. Moreover, the connector 497 is connected to the FPC 495. The FPC 495 and the conductive layer 457 are electrically connected to each other through the connector 497. In the case where the flexible substrate 428 overlaps the conductive layer 457, the conductive layer 457, the connector 497, and the FPC 495 can be electrically connected to one another by forming an opening in the flexible substrate 428 (or using a flexible substrate having an opening).

The insulating layer 424 preferably has an excellent gas barrier property to prevent entry of moisture and oxygen from the flexible substrate 420 side into the light-emitting device. Similarly, the insulating layer 226 preferably has an excellent gas barrier property to prevent entry of moisture and oxygen from the flexible substrate 428 side into the light-emitting device.

The light-emitting device described as Structure Example 5 can be fabricated with a high yield by using any of the peeling methods of embodiments of the present invention. In particular, Peeling Method 3 or Peeling Method 4 described in Embodiment 1 can be used. In the peeling method of one embodiment of the present invention, the insulating layer 424, the transistors, the organic EL element 450, and the like are formed as a layer to be peeled over a formation substrate. In addition, over another formation substrate, the insulating layer 226, the coloring layer 432, the light-blocking layer 431, and the like are formed as a layer to be peeled. After the two formation substrates are attached to each other, the layer to be peeled and the formation substrate are separated and the layer to be peeled and a flexible substrate are attached to each other with the adhesive layer, so that the light-emitting device described as Structure Example 5 can be fabricated.

In the peeling method of one embodiment of the present invention, an insulating layer and a transistor can be formed over a formation substrate at a high temperature. By using the insulating layer 424, the insulating layer 226, and the transistor that are formed at a high temperature, the light-emitting device can be highly reliable. The insulating layers (the insulating layers 226 and 424) having high gas barrier properties, which are formed at a high temperature, can be positioned above and below the organic EL element 450. This can prevent entry of impurities such as moisture into the organic EL element 450.

Structure Example 6

FIG. 14A2 is a plan view of a light-emitting device, and FIG. 14C is cross-sectional view taken along the dashed-dotted line X6-Y6 in FIG. 14A2. The light-emitting device illustrated in FIG. 14A2 is a top-emission light-emitting device using a color filter method.

The light-emitting device illustrated in FIG. 14C includes the flexible substrate 420, the adhesive layer 422, the insulating layer 424, the transistor 455, the insulating layer 463, the insulating layer 465, the insulating layer 405, the organic EL element 450 (the first electrode 401, the EL layer 402, and the second electrode 403), a frame-shaped bonding layer 404*a*, a frame-shaped bonding layer 404*b*, the bonding layer 407, the overcoat 453, the light-blocking layer 431, the coloring layer 432, the insulating layer 226, the adhesive layer 426, the flexible substrate 428, and the conductive layer 457. The flexible substrate 428, the adhesive layer 426, the insulating layer 226, the bonding layer 407, the overcoat 453, and the second electrode 403 transmit visible light.

In the light-emitting portion 491 of the light-emitting device in FIG. 14C, the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. The end portion of the first electrode 401 is covered with the insulating layer 405. It is preferable that the first electrode 401 reflect visible light. Moreover, the light-emitting device includes the coloring layer 432 that overlaps the organic EL element 450 with the bonding layer 407 therebetween, and the light-blocking layer 431 that overlaps the insulating layer 405 with the bonding layer 407 therebetween.

The driver circuit portion 493 includes a plurality of transistors. FIG. 14C illustrates one of the transistors in the driver circuit portion 493. An example in which the driver circuit portion 493 is more on the inside than the frame-shaped bonding layers 404*a* and 404*b* is described in this embodiment; however, the driver circuit portion 493 may be more on the outside than one or both of the frame-shaped bonding layers 404*a* and 404*b*.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and step as those of the electrodes included in the transistor 455 is described. As illustrated in FIG. 14C, the FPC 495 and the flexible substrate 428 do not necessarily overlap each other. The connector 497 is connected to the conductive layer 457. In addition, the connector 497 is connected to the FPC 495. The FPC 495 and the conductive layer 457 are electrically connected to each other through the connector 497.

The conductive layer 457 is preferably more on the outside than the frame-shaped bonding layer 404a, in which case entry of impurities such as moisture into the organic EL element 450 can be prevented even in the case where moisture and the like easily enter a connection portion between the FPC 495 and the connector 497 and a connection portion between the connector 497 and the conductive layer 457.

The light-emitting device illustrated in FIG. 14C is different from that illustrated in FIG. 14B in that the insulating layer 465 is covered at a side surface of the light-emitting device. In the case of using an organic insulating material or the like having a poor gas barrier property as a material for the insulating layer 465, the insulating layer 465 is preferably covered at the side surface of the light-emitting device. The frame-shaped bonding layer having an excellent gas barrier property is preferably positioned at the side surface of the light-emitting device to increase the reliability of the light-emitting device. Note that the insulating layer 465 is not necessarily covered at an end portion of the light-emitting device depending on the material or the like for the insulating layer 465, as illustrated in FIG. 14B.

The frame-shaped bonding layers 404a and 404b each preferably have a more excellent gas barrier property than the bonding layer 407 to prevent entry of moisture and oxygen into the light-emitting device through the side surface of the light-emitting device. Thus, the light-emitting device can be highly reliable.

For example, in the case where the frame-shaped bonding layer 404a has a lower water vapor transmission rate than the bonding layer 407 and the frame-shaped bonding layer 404b and a drying agent or the like that adsorbs moisture is included in the frame-shaped bonding layer 404b, entry of moisture can be prevented by the frame-shaped bonding layer 404a and moisture passing through the frame-shaped bonding layer 404a is adsorbed by the frame-shaped bonding layer 404b. This can particularly prevent entry of moisture into the bonding layer 407 and the organic EL element 450.

In Structure Example 6, light emitted from the organic EL element 450 is extracted from the light-emitting device through the bonding layer 407. For this reason, the bonding layer 407 preferably has a higher light-transmitting property than the frame-shaped bonding layers 404a and 404b. In addition, the bonding layer 407 preferably has a higher refractive index than the frame-shaped bonding layers 404a and 404b. Moreover, it is preferable that the volume of the bonding layer 407 be less reduced by curing than that of the frame-shaped bonding layers 404a and 404b.

The light-emitting device described as Structure Example 6 can be fabricated with a high yield by using any of the peeling methods of embodiments of the present invention. In particular, Peeling Method 3 or Peeling Method 4 described in Embodiment 1 can be used. In the peeling method of one embodiment of the present invention, the insulating layer 424, each transistor, the organic EL element 450, and the like are formed as a layer to be peeled over a formation substrate. In addition, over another formation substrate, the insulating layer 226, the coloring layer 432, the light-blocking layer 431, and the like are formed as a layer to be peeled. The two formation substrates are attached to each other, and then the layer to be peeled and the formation substrate are separated and the layer to be peeled and a flexible substrate are attached to each other, so that the light-emitting device described as Structure Example 6 can be fabricated.

In the peeling method of one embodiment of the present invention, an insulating layer and a transistor can be formed over a formation substrate at a high temperature. By using the insulating layer 424, the insulating layer 226, and the transistor that are formed at a high temperature, the light-emitting device can be highly reliable. The insulating layers (the insulating layer 226 and the insulating layer 424) having high gas barrier properties, which are formed at a high temperature, can be positioned above and below the organic EL element 450. This can prevent entry of impurities such as moisture into the organic EL element 450.

As described above, in Structure Example 6, the insulating layer 424, the insulating layer 226, and the frame-shaped bonding layers 404a and 404b can prevent entry of impurities such as moisture into the organic EL element 450 through a surface (a display surface) of the light-emitting device, a rear surface (a surface facing the display surface) thereof, and a side surface thereof. Thus, the light-emitting device can be highly reliable.

Note that in one embodiment of the present invention, an active matrix method in which an active element (non-linear element) is included in a pixel or a passive matrix method in which an active element is not included in a pixel can be used.

In an active matrix method, as an active element, not only a transistor but also various active elements can be used. For example, a metal insulator metal (MIM), a thin film diode (TFD), or the like can also be used. Since these elements can be formed with a smaller number of fabrication steps, fabrication cost can be reduced or yield can be improved. Furthermore, since the size of these elements is small, the aperture ratio can be improved, so that power consumption can be reduced or higher luminance can be achieved.

Since an active element is not used in a passive matrix method, the number of fabrication steps is small, so that the fabrication cost can be reduced or the yield can be improved. Furthermore, since an active element is not used, the aperture ratio can be improved, so that power consumption can be reduced or higher luminance can be achieved, for example.

<Material of Device>

Next, examples of materials that can be used for the light-emitting device are described.

[Flexible Substrate]

A flexible material is used for the flexible substrate. For example, an organic resin, a glass material that is thin enough to have flexibility, or the like can be used. Furthermore, a material that transmits visible light is used for the substrate of the light-emitting device from which light is extracted. A metal substrate or the like may be used in the case where the flexible substrate does not necessarily transmit visible light.

An organic resin, which has a specific gravity smaller than that of glass, is preferably used for the flexible substrate, in which case the light-emitting device can be more lightweight than in the case where glass is used.

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin; a polyamide imide resin, and a polyvinyl chloride resin. In particular, a material whose coefficient of thermal expansion is low is preferred, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

In the case where a fibrous body is contained in the material having flexibility and a light-transmitting property, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure in which this fibrous body is impregnated with a resin and the resin is cured may be used as the flexible substrate. When the structure including the fibrous body and the resin is used as the flexible substrate, reliability against bending or breaking due to local pressure can be increased, which is preferable.

To improve the outcoupling efficiency, the refractive index of the material having flexibility and a light-transmitting property is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferred, because such a filler can maintain optical transparency.

To obtain flexibility and bendability, the thickness of a metal substrate is preferably greater than or equal to 10 μm and less than or equal to 200 μm, more preferably greater than or equal to 20 μm and less than or equal to 50 μm. Since a metal substrate has high thermal conductivity, heat generated due to light emission of the light-emitting element can be efficiently released.

There is no particular limitation on a material of the metal substrate, but it is preferable to use, for example, aluminum, copper, nickel, a metal alloy such as an aluminum alloy or stainless steel.

The flexible substrate may have a stacked-layer structure in which a hard coat layer (such as a silicon nitride layer) by which a surface of a light-emitting device is protected from damage, a layer (such as an aramid resin layer) that can disperse pressure, or the like is stacked over a layer of any of the above-mentioned materials. Furthermore, to suppress a decrease in the lifetime of the functional element (in particular, the organic EL element) due to moisture and the like, an insulating layer having an excellent gas barrier property described later may be included.

The flexible substrate may be formed by stacking a plurality of layers. When a glass layer is used, a barrier property against water and oxygen can be improved and thus a reliable light-emitting device can be provided.

For example, a flexible substrate in which a glass layer, an adhesive layer, and an organic resin layer are stacked from the side closer to an organic EL element can be used. The thickness of the glass layer is greater than or equal to 20 μm and less than or equal to 200 μm, preferably greater than or equal to 25 μm and less than or equal to 100 μm. With such a thickness, the glass layer can have both an excellent barrier property against water and oxygen and a high flexibility. The thickness of the organic resin layer is greater than or equal to 10 μm and less than or equal to 200 μm, preferably greater than or equal to 20 μm and less than or equal to 50 μm. Providing such organic resin layer outside the glass layer, occurrence of a crack or a break in the glass layer can be suppressed and mechanical strength can be improved. With the substrate that includes such a composite material of a glass material and an organic resin, a highly reliable and flexible light-emitting device can be provided.

[Adhesive Layer, Bonding Layer]

As the adhesive layer or the bonding layer, various curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can prevent entry of impurities such as moisture into the functional element and can improve the reliability of the light-emitting device.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

[Insulating Layer]

An insulating layer having an excellent gas barrier property is preferably used as the insulating layer 424 and the insulating layer 226. In addition, an insulating layer having an excellent gas barrier property may be formed between the bonding layer 407 and the second electrode 403.

As an insulating layer having an excellent gas barrier property, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like can be used.

The gas transmission rate, the oxygen transmission rate, or the water vapor transmission rate of the insulating layer having an excellent gas barrier property is, for example, less than or equal to $1\times10^{-5}$ [g/m$^2$·day], preferably less than or equal to 1×10$^{-6}$ [g/m$^2$·day], further preferably less than or equal to 1×10$^{-7}$ [g/m$^2$·day], still further preferably less than or equal to 1×10$^{-8}$ [g/m$^2$·day]. The above transmission rates are preferably satisfied under hot and humid environment (e.g., temperature: 65° C., humidity: 95%).

Note that the above inorganic insulating layers can also be used as other insulating layers.

As the insulating layer 463, for example, an inorganic insulating film such as a silicon oxide film, a silicon oxynitride film, or an aluminum oxide film can be used. For example, as the insulating layer 465 and the insulating layer 467, an organic material such as polyimide, acrylic, polyamide, polyimide amide, or a benzocyclobutene-based resin can be used. Alternatively, a low-dielectric constant material (a low-k material) or the like can be used. Furthermore, the insulating layer 465 and the insulating layer 467 may be formed by stacking a plurality of insulating layers.

The insulating layer 405 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 405 be formed to have an inclined side wall with continuous curvature, using a photosensitive resin material.

There is no particular limitation on the method for forming the insulating layer 405; a photolithography method, a sputtering method, an evaporation method, a droplet discharging method (e.g., an ink-jet method), a printing method (e.g., a screen printing method or an off-set printing method), or the like may be used.

[Spacer]

The spacer 496 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 496 containing a conductive material and the second electrode 403 are electrically connected to each other, a potential drop due to the resistance of the second electrode 403 can be suppressed. The spacer 496 may have either a tapered shape or an inverse tapered shape.

[Transistor]

There is no particular limitation on the structure of the transistor used in the light-emitting device of one embodiment of the present invention. For example, a forward staggered transistor or an inverted staggered transistor may be used. A top-gate transistor or a bottom-gate transistor may be used. In addition, there is no particular limitation on a material used for the transistor. For example, a transistor in which silicon, germanium, or an oxide semiconductor is used in a channel formation region can be used. There is no particular limitation on the crystallinity of a semiconductor, and any of an amorphous semiconductor or a semiconductor having crystallinity (a microcrystalline semiconductor, a polycrystalline semiconductor, and a semiconductor partly including crystal regions) may be used. A semiconductor having crystallinity is preferably used, in which case deterioration of transistor characteristics can be suppressed. As silicon, amorphous silicon, single crystal silicon, polycrystalline silicon, or the like can be used. As an oxide semiconductor, an In—Ga—Zn—O-based metal oxide or the like can be used.

For stable characteristics of the transistor, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed by a sputtering method, a CVD method, an ALD method, a coating method, a printing method, or the like. Note that the base film is not necessarily provided. In each of the above structural examples, the insulating layer 424 can serve as a base film of the transistor.

[Organic EL Element]

The structure of the organic EL element used for the light-emitting device of one embodiment of the present invention is not particularly limited. The organic EL element may have a top emission structure, a bottom emission structure, or a dual emission structure.

When a voltage higher than the threshold voltage of the organic EL element is applied between a pair of electrodes, holes are injected to the EL layer 402 from the anode side and electrons are injected to the EL layer 402 from the cathode side. The injected electrons and holes are recombined in the EL layer 402 and a light-emitting substance contained in the EL layer 402 emits light.

A conductive film that transmits visible light is used as the electrode through which light is extracted in the organic EL element. A conductive film that reflects visible light is preferably used as the electrode through which light is not extracted.

The conductive film that transmits visible light can be formed using, for example, indium oxide, an indium tin oxide (ITO), an indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Further alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

The EL layer 402 includes at least a light-emitting layer. In addition to the light-emitting layer, the EL layer 402 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 402, either a low molecular compound or a high molecular compound can be used, and an inorganic compound may also be used. The above-described layers included in the EL layer 402 can be formed separately by any of the following methods: an evaporation method (including a vacuum evaporation method), a transfer method, a printing method, an inkjet method, a coating method, and the like.

Although the organic EL element is described here as an example of a light-emitting element, one embodiment of the present invention is not limited thereto, and a display element, a light-emitting element, a semiconductor element, or the like may be used.

For example, in this specification and the like, a display element, a display device that is a device including a display element, a light-emitting element, and a light-emitting device that is a device including a light-emitting element can employ a variety of modes or can include a variety of elements. Examples of a display element, a display device, a light-emitting element, or a light-emitting device include an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of a display device including an electron emitter are a field emission display (FED) and a surface-conduction electron-emitter display (SED)-type flat panel display. Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

[Coloring Layer, Light-Blocking Layer, and Overcoat]

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer is provided between the adjacent coloring layers. The light-blocking layer blocks light emitted from an adjacent organic EL element to prevent color mixture between adjacent organic EL elements. Here, the coloring layer is provided such that its end portion overlaps the light-blocking layer, whereby light leakage can be suppressed. As the light-blocking layer, a material that can block light from the organic EL element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. With the overcoat, impurities and the like contained in the coloring layer can be prevented from being diffused into an organic EL element. The overcoat is formed with a material that transmits light emitted from the organic EL element; for example, an inorganic insulating film such as a silicon nitride film or a silicon oxide film, an organic insulating film such as an acrylic film or a polyimide film can be used, and a stacked structure of an organic insulating film and an inorganic insulating film may be used.

In the case where upper surfaces of the coloring layer 432 and the light-blocking layer 431 are coated with a material of the bonding layer 407, a material that has high wettability with respect to the material of the bonding layer 407 is preferably used as the material of the overcoat. For example, an oxide conductive film such as an ITO film or a metal film such as an Ag film that is thin enough to transmit light is preferably used as the overcoat 453 (see FIGS. 14B and 14C).

[Conductive Layer]

For example, the conductive layer functioning as an electrode or a wiring of the transistor, an auxiliary electrode or an auxiliary wiring of the organic EL element, or the like can be found to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The thickness of the auxiliary wiring can be greater than or equal to 0.1 μm and less than or equal to 3 μm, preferably greater than or equal to 0.1 μm and less than or equal to 0.5 μm.

When a paste (e.g., silver paste) is used as the material of the auxiliary wiring, a metal forming the auxiliary wiring aggregates in the form of particles. As a result, the surface of the auxiliary wiring becomes rough and has many gaps, so that it is difficult for the EL layer to cover the auxiliary electrode completely. Thus, the upper electrode and the auxiliary wiring are electrically connected to each other easily, which is preferable.

[Light Outcoupling Structure]

For the light outcoupling structure, a hemispherical lens, a micro lens array, a film provided with an uneven surface structure, a light diffusing film, or the like can be used. For example, a light outcoupling structure can be formed by attaching the lens or film to the substrate with an adhesive or the like that has substantially the same refractive index as the substrate or the lens or film.

[Connector]

For the connector 497, it is possible to use a paste-like or sheet-like material that is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

This embodiment can be freely combined with any of the other embodiments.

Embodiment 3

In this embodiment, electronic appliances and lighting devices that can be fabricated by employing any of the peeling methods of embodiments of the present invention are described with reference to FIGS. 9D to 9I and FIGS. 15A to 15G.

A light-emitting device, a display device, a semiconductor device, or the like that can be used for an electronic appliance or a lighting device can be fabricated with a high yield by employing the peeling method of one embodiment of the present invention. Moreover, a flexible electronic appliance or lighting device having high productivity can be fabricated by employing the peeling method of one embodiment of the present invention.

Examples of an electronic appliance include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pinball machine.

The device fabricated by employing the peeling method of one embodiment of the present invention has flexibility and therefore can be incorporated along a curved inside/outside wall surface of a house or a building or a curved interior/exterior surface of a car.

FIG. 15A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the cellular phone 7400 is fabricated using the display device fabricated by employing the peeling method of one embodiment of the present invention for the display portion 7402. One embodiment of the present invention enables a highly reliable mobile phone having a curved display portion to be provided with a high yield.

When the display portion 7402 of the mobile phone 7400 illustrated in FIG. 15A is touched with a finger or the like, data can be input into the mobile phone 7400. In addition, operations such as making a call and inputting a letter can be performed by touch on the display portion 7402 with a finger or the like.

With the operation buttons 7403, the power can be turned on or off. In addition, types of images displayed on the display portion 7402 can be switched; switching images from a mail creation screen to a main menu screen.

FIG. 15B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as ON/OFF of the power, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting panel fabricated by using one embodiment of the present invention. One embodiment of the present invention enables a highly reliable portable information terminal having a curved display portion to be provided with a high yield.

FIGS. 15C to 15E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 15C includes a light-emitting portion 7202 having a wave-shaped light-emitting surface, and thus has good design.

A light-emitting portion 7212 included in the lighting device 7210 illustrated in FIG. 15D has two convex-curved light-emitting portions symmetrically placed. Thus, light radiates from the lighting device 7210 in all directions.

The lighting device 7220 illustrated in FIG. 15E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device fabricated by employing the peeling method of one embodiment of the present invention. One embodiment of the present invention enables a highly reliable lighting device having a curved light-emitting portion to be provided with a high yield.

FIG. 15F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, ON/OFF of the power, switching of displayed videos, and the like can be performed.

FIG. 15G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 15F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device fabricated by employing the peeling method of one embodiment of the present invention. One embodiment of the present invention enables a lightweight and highly reliable display device to be provided with a high yield.

Figure 9D:
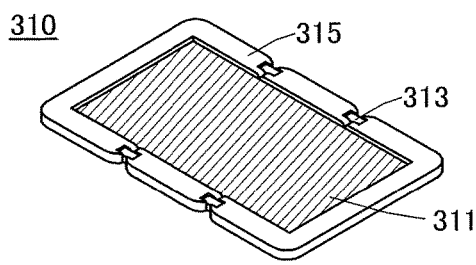
Figure 9E:
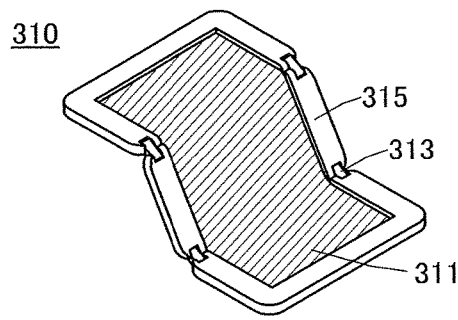
Figure 9F:
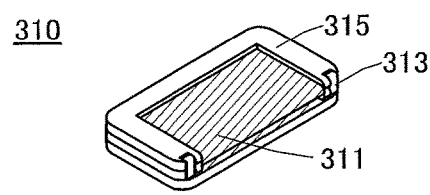

FIGS. 9D to 9F illustrate a foldable portable information terminal 310. FIG. 9D illustrates the portable information terminal 310 that is opened. FIG. 9E illustrates the portable information terminal 310 that is being opened or being folded. FIG. 9F illustrates the portable information terminal 310 that is folded. The portable information terminal 310 is highly portable when folded. When the portable information terminal 310 is opened, a seamless large display region is highly browsable.

A display panel 311 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device fabricated by any of the peeling methods of embodiments of the present invention can be used for the display panel 311. For example, a display device that can be bent with a radius of curvature of greater than or equal to 1 mm and less than or equal to 150 mm can be used.

Figure 9G:
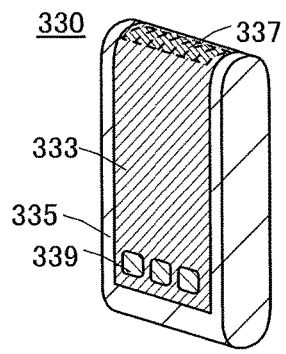
Figure 9H:
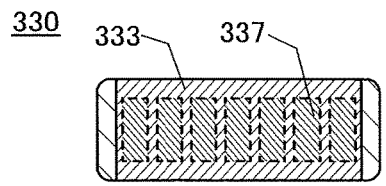
Figure 9I:
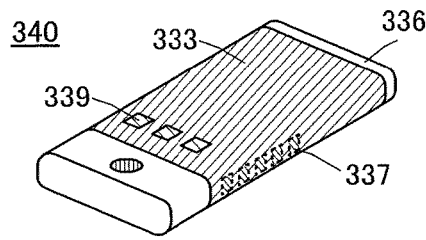

FIG. 9G is a perspective view illustrating an external shape of the portable information terminal 330. FIG. 9H is a top view of the portable information terminal 330. FIG. 9I is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 9G and 9I). In addition, information 337 indicated by dashed rectangles can be displayed on another surface (FIGS. 9H and 9I). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 9G and 9H illustrate an example in which the information 337 is displayed at the top, one embodiment of the present invention is not limited thereto. The information may be displayed, for example, on the side as illustrated in FIG. 9I.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A display device fabricated by any of the peeling methods of embodiments of the present invention can be used for a display portion 333 mounted in each of a housing 335 of the portable information terminal 330 and a housing 336 of the portable information terminal 340. One embodiment of the present invention makes it possible to provide a highly reliable display device having a curved display portion with a high yield.

This embodiment can be freely combined with any of the other embodiments.

Embodiment 4

In this embodiment, a peeling method of one embodiment of the present invention is described with reference to FIGS. 16A to 16C.

Figure 16A:
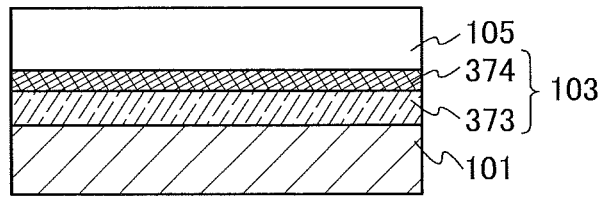
FIGS. 16A to 16C illustrate a peeling method.
Figure 16B:
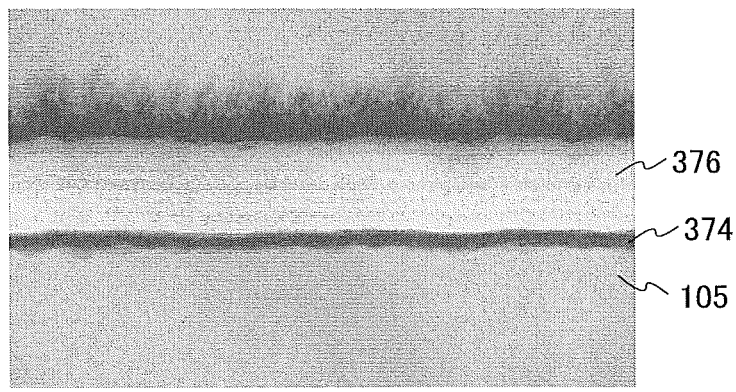
Figure 16C:
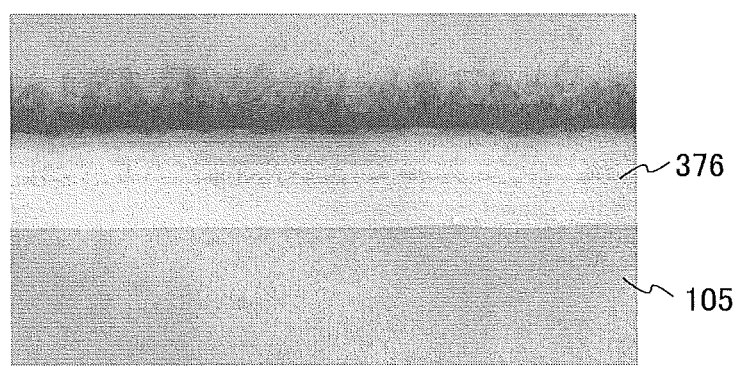

In the peeling method of one embodiment of the present invention, the peeling layer 103 is formed to a thickness of greater than or equal to 10 nm over the formation substrate 101, and the layer to be peeled 105 is formed over the peeling layer (FIG. 16A).

In this embodiment, a 30-nm-thick tungsten film is formed and dinitrogen monoxide ($N_2O$) plasma treatment is performed on a surface of the tungsten film. Thus, a tungsten film 373 over the formation substrate 101 and a tungsten oxide film 374 over the tungsten film 373 can be formed as the peeling layer 103. The thickness of the tungsten oxide film 374 can be, for example, approximately 10 nm.

The structure and formation method of the peeling layer are not limited to those described above. For example, any of the materials given in Embodiment 1 can be used. A layer containing an oxide of tungsten may be formed as follows:

a layer containing tungsten is formed and an insulating layer formed of an oxide is formed thereover, so that the layer containing an oxide of tungsten is formed at the interface between the layer containing tungsten and the insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas.

By forming the tungsten oxide film 374 between the tungsten film 373 and the layer to be peeled 105, the adhesion between the peeling layer and the layer to be peeled can be controlled. This can improve the yield of the peeling process.

Next, in the same manner as the peeling method described in Embodiment 1, the layer to be peeled 105 and a substrate are attached to each other with a bonding layer, and the bonding layer is cured. After that, a peeling trigger is formed. Then, the layer to be peeled 105 and the formation substrate 101 are separated from the formed peeling trigger.

When peeling occurs at the interface between the tungsten film 373 and the tungsten oxide film 374 or in the vicinity of the interface, part of the peeling layer 103 (here, part of the tungsten oxide film 374) might remain on the layer to be peeled 105 side. FIG. 16B is a cross-sectional TEM image showing the tungsten oxide film 374 that remains on the layer to be peeled 105 after the peeling from the formation substrate 101. Note that a layer 376 in FIG. 16B is a carbon film provided for cross-sectional TEM observation.

The tungsten oxide film 374 that remains in a device such as a light-emitting device fabricated by the peeling method of one embodiment of the present invention causes a defect such as a shift of transistor characteristics in some cases.

For this reason, the peeling method of one embodiment of the present invention includes a step of removing the tungsten oxide film 374 remaining on the layer to be peeled 105 after peeling occurs at the interface between the tungsten film 373 and the tungsten oxide film 374 or in the vicinity of the interface. The tungsten oxide film 374 may be removed completely or partly. The tungsten oxide film may remain as long as a device is not damaged.

For example, water or an alkaline aqueous solution can be used to remove the tungsten oxide film. Alternatively, for example, an ethanol aqueous solution or an $H_2O_2$ aqueous solution can be used. Since the rate at which the tungsten oxide film can be removed varies depending on the temperature of water or a solution, the water or the solution may be selected as appropriate. For example, water at a temperature of approximately 60° C. can remove the tungsten oxide film more easily than water at room temperature.

For example, the tungsten film may be wiped off with a non-woven wiping cloth or the like that has absorbed water or a solution, or the tungsten oxide film may be removed by soaking a sample in water or a solution.

The tungsten oxide film may alternatively be removed physically. For example, the tungsten oxide film may be removed by polishing with sandpaper or the like.

In this embodiment, the tungsten oxide film is wiped off with a non-woven wiping cloth that has absorbed an ethanol aqueous solution, and then the tungsten oxide film was further wiped off with a non-woven wiping cloth that has adsorbed an $H_2O_2$ aqueous solution. FIG. 16C is a cross-sectional TEM image after removing the tungsten oxide film. Note that the layer 376 in FIG. 16C is the carbon film provided for cross-sectional TEM observation.

As described above, in the peeling method of one embodiment of the present invention, a stack of the tungsten film and the tungsten oxide film is used as the peeling layer, and the tungsten oxide film that remains on the layer to be peeled is removed after separation of the formation substrate and the layer to be peeled. This can improve the yield of the peeling process. In addition, a defect such as a shift of transistor characteristics can be suppressed.

This embodiment can be combined with any of the other embodiments as appropriate.

Example 1

Described in this embodiment are measurement results of the force required for peeling a layer to be peeled from a formation substrate in samples in each of which a layer to be peeled is formed over the formation substrate with the peeling layer therebetween.

Figure 17A:
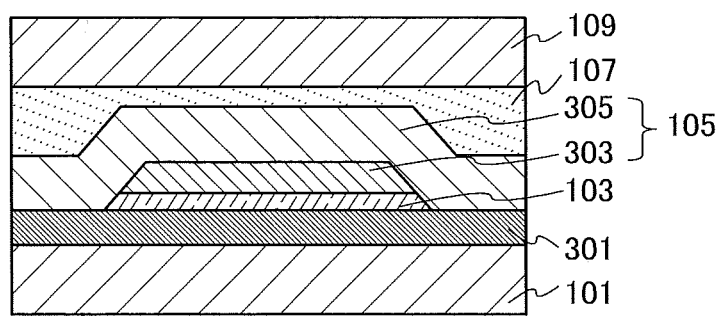
FIGS. 17A and 17B illustrate a sample and an apparatus used for measurement in Example 1.

FIG. 17A illustrates a structure of each sample in this example. The sample includes the formation substrate 101, a base film 301 over the formation substrate 101, the peeling layer 103 over the base film 301, the layer to be peeled 105 over the peeling layer 103, the bonding layer 107 over the layer to be peeled 105, and the substrate 109 over the bonding layer 107.

Table 1 shows differences in the fabrication conditions between the samples.

TABLE 1

|  | Sample 1 | Sample 2 | Sample 3 | Sample 4 | Sample 5 | Sample 6 | Sample 7 | Sample 8 |
|---|---|---|---|---|---|---|---|---|
| Heat treatment |  |  |  | 450° C. 1 hour |  |  |  |  |
| Layer to be peeled | Structure 1 | Structure 2 | Structure 3 | Structure 1 | Structure 1 | Structure 1 | Structure 1 | Structure 3 |
| $N_2O$ plasma treatment | No | No | No | Yes | No | No | No | No |
| Peeling layer | 30 nm | 30 nm | 30 nm | 30 nm | 15 nm | 10 nm | 5 nm | 5 nm |

First, an approximately 200-nm-thick silicon oxynitride film was formed as the base film 301 over a glass substrate serving as the formation substrate 101. The silicon oxynitride film was formed by a plasma CVD method under the following conditions: the flow rates of a silane gas and an $N_2O$ gas were 10 sccm and 1200 sccm, respectively, the supplied power was 30 W, the pressure was 22 Pa, and the substrate temperature was 330° C.

Next, a tungsten film serving as the peeling layer 103 was formed over the base film 301. The thickness of the tungsten film differs among the samples. The tungsten films serving as the peeling layers in the samples were formed to the respective thicknesses shown in Table 1. The tungsten film was formed by a sputtering method under the following conditions: the flow rate of an Ar gas was 100 sccm, the power supply was 60 kW, the pressure was 2 Pa, and the substrate temperature was 100° C.

Next, dinitrogen monoxide (N$_2$O) plasma treatment was performed. The N$_2$O plasma treatment was performed for 240 seconds under the following conditions: the flow rate of an N$_2$O gas was 100 sccm, the power supply was 500 W, the pressure was 100 Pa, and the substrate temperature was 330° C. Whether the N$_2$O plasma treatment was performed depended on the sample (see Table 1).

Next, the layer to be peeled 105 was formed over the peeling layer 103. The layer to be peeled 105 had a stacked-layer structure of a first silicon oxynitride film 303 and an insulating layer 305. The structure of the layer to be peeled 105 differs from sample to sample as shown in Table 1.

[Structure 1 of Layer to be Peeled 105]

First, the first silicon oxynitride film 303 was formed to a thickness of approximately 600 nm over the peeling layer 103. The first silicon oxynitride film 303 was formed by a plasma CVD method under the following conditions: the flow rates of a silane gas and an N$_2$O gas were 75 sccm and 1200 sccm, respectively, the power supply was 120 W, the pressure was 70 Pa, and the substrate temperature was 330° C.

Then, the first silicon oxynitride film 303 was processed into an island shape by wet etching and the peeling layer 103 was processed into an island shape by dry etching.

After that, the insulating layer 305 was formed over the first silicon oxynitride film 303. The insulating layer 305 in Structure 1 of the layer to be peeled had a four-layer structure of a first silicon nitride film, a second silicon oxynitride film, a silicon nitride oxide film, and a third silicon oxynitride film.

First, the first silicon nitride film was formed to a thickness of approximately 200 nm over the first silicon oxynitride film 303. The first silicon nitride film was formed by a plasma CVD method under the following conditions: the flow rates of a silane gas, an H$_2$ gas, and an NH$_3$ gas were 30 sccm, 800 sccm, and 300 sccm, respectively, the power supply was 600 W, the pressure was 60 Pa, and the substrate temperature was 330° C.

Next, the second silicon oxynitride film was formed to a thickness of approximately 200 nm over the first silicon nitride film. The second silicon oxynitride film was formed by a plasma CVD method under the following conditions: the flow rates of a silane gas and an N$_2$O gas were 50 sccm and 1200 sccm, respectively, the power supply was 120 W, the pressure was 70 Pa, and the substrate temperature was 330° C.

Then, the silicon nitride oxide film was formed to a thickness of approximately 140 nm over the second silicon oxynitride film. The silicon nitride oxide film was formed by a plasma CVD method under the following conditions: the flow rates of a silane gas, an H$_2$ gas, an N$_2$ gas, an NH$_3$ gas, and an N$_2$O gas were 110 sccm, 800 sccm, 800 sccm, 800 sccm, and 70 sccm, respectively, the power supply was 320 W, the pressure was 100 Pa, and the substrate temperature was 330° C.

After that, the third silicon oxynitride film was formed to a thickness of approximately 100 nm over the silicon nitride oxide film. The third silicon oxynitride film was formed under the same conditions as the base film 301.

[Structure 2 of Layer to be Peeled 105]

The first silicon oxynitride film 303 was formed in the same manner as Structure 1. The insulating layer 305 had a single layer structure of the second silicon nitride film.

Specifically, the second silicon nitride film was formed to a thickness of approximately 200 nm over the first silicon oxynitride film 303. The second silicon nitride film was formed by a plasma CVD method under the following conditions: the flow rates of a silane gas, an N$_2$ gas, and an NH$_3$ gas were 38 sccm, 1000 sccm, and 250 sccm, respectively, the power supply was 150 W, the pressure was 50 Pa, and the substrate temperature was 330° C.

[Structure 3 of Layer to be Peeled 105]

The first silicon oxynitride film 303 was formed in the same manner as Structure 1. The insulating layer 305 had a single layer structure of the first silicon nitride film.

Specifically, the first silicon nitride film was formed to a thickness of approximately 200 nm over the first silicon oxynitride film 303. The first silicon nitride film was formed under the same conditions as those of Structure 1.

After the layer to be peeled having any one of Structures 1 to 3 described above was formed, heat treatment was performed at 450° C. in a nitrogen atmosphere for 1 hour.

Then, the layer to be peeled 105 and a film with an adhesive were attached to each other to form the bonding layer 107 and the substrate 109 over the layer to be peeled 105.

Figure 17B:
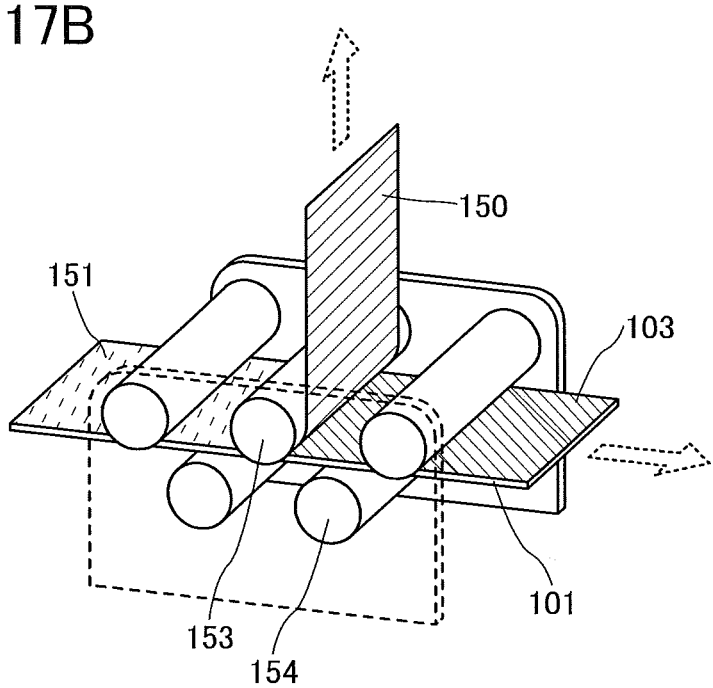

The force required for peeling the layer to be peeled from the formation substrate in each sample fabricated under the above-described conditions was measured. A jig illustrated in FIG. 17B was used for the measurement. The jig illustrated in FIG. 17B includes a plurality of guide rollers 154 and a plurality of support rollers 153. A tape 151 is attached onto a layer 150 including a layer to be peeled that is formed over the formation substrate 101 and an end portion of the tape 151 is partly peeled in advance. Then, the formation substrate 101 is fixed to the jig so that the tape 151 is held by the support rollers 153, and the tape 151 and the layer 150 including the layer to be peeled are positioned perpendicular to the formation substrate 101. The force required for peeling can be measured as follows: when the tape 151 is pulled at a rate of 20 mm/min in a direction perpendicular to the formation substrate 101 to peel the layer 150 including the layer to be peeled from the formation substrate 101, the pulling force in the perpendicular direction is measured. During the peeling, the formation substrate 101 moves in the plane direction along the guide rollers 154 with the peeling layer 103 exposed. The support rollers 153 and the guide rollers 154 are rotatable so that the formation substrate 101 and the layer 150 including the layer to be peeled are not affected by friction during the move.

For the peeling test, a compact table-top universal tester (EZ-TEST EZ-S-50N) manufactured by Shimadzu Corporation was used. For the peeling test, an adhesive tape/adhesive sheet testing method based on the standard number JIS Z0237 of Japanese Industrial Standards (RS) was referred to. Each sample had a size of 126 mm×25 mm.

Figure 18:
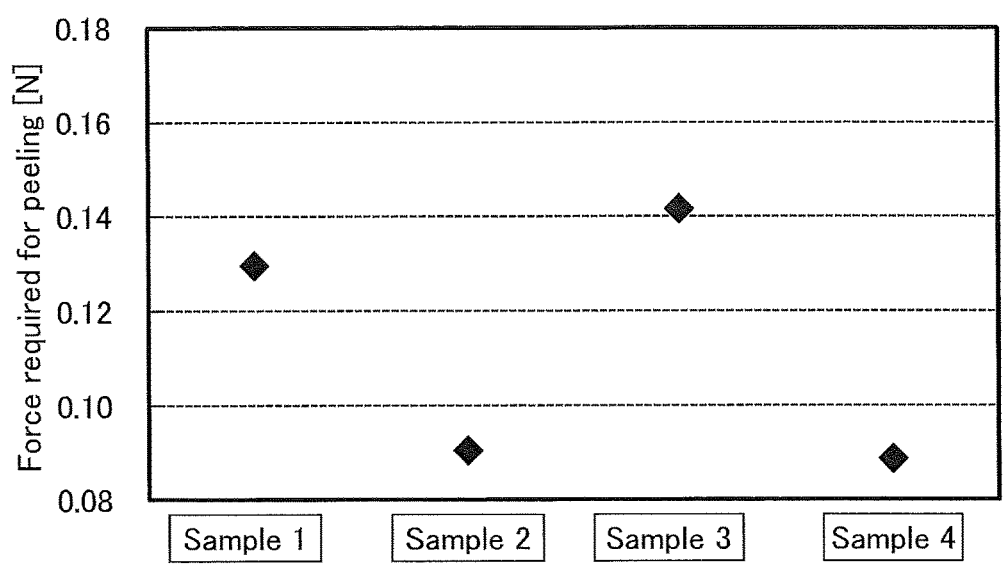
FIG. 18 shows measurement results of force required for peeling in Example 1.

FIG. 18 shows the forces required for peeling in Samples 1 to 4. Table 2 shows the stress on each layer included in the layer to be peeled 105 and the stress on the layer to be peeled 105.

TABLE 2

| | Thickness | Conditions | Stress (MPa) |
|---|---|---|---|
| First silicon oxynitride film | 600 nm | $SiH_4$ = 75 sccm, $N_2O$ = 1200 sccm, 120 W, 70 Pa, 330° C. | −55.1 |
| First silicon nitride film | 200 nm | $SiH_4$ = 30 sccm, $H_2$ = 800 sccm, $NH_3$ = 300 sccm, 600 W, 60 Pa, 330° C. | −612.1 |
| Second silicon oxynitride film | 200 nm | $SiH_4$ = 50 sccm, $N_2O$ = 1200 sccm, 120 W, 70 Pa, 330° C. | −187.2 |
| Silicon nitride oxide film | 140 nm | $SiH_4$ = 110 sccm, $H_2$ = 800 sccm, $N_2$ = 800 sccm, $NH_3$ = 800 sccm, $N_2O$ = 70 sccm, 320 W, 100 Pa, 330° C. | 445.3 ※ |
| Third silicon oxynitride film | 100 nm | $SiH_4$ = 10 sccm, $N_2O$ = 1200 sccm, 30 W, 22 Pa, 330° C. | −331.9 ※ |
| Second silicon nitride film | 200 nm | $SiH_4$ = 38 sccm, $N_2$ = 1000 sccm, $NH_3$ = 250 sccm, 150 W, 50 Pa, 330° C. | 583.5 |

| | Stacked-layer structure | Stress (MPa) |
|---|---|---|
| Structure 1 of layer to be peeled | first silicon oxynitride film 303\first silicon nitride film\second silicon oxynitride film\silicon nitride oxide film\third silicon oxynitride film | −82.3 |
| Structure 2 of layer to be peeled | first silicon oxynitride film 303\second silicon nitride film | 112.5 |
| Structure 3 of layer to be peeled | first silicon oxynitride film 303\first silicon nitride film | −162.2 |

※ value in the case of a thickness of 200 nm

Note that in the case where the force required for peeling is greater than or equal to 0.14 N in this example, the layer to be peeled 105 might remain on the formation substrate 101 side after the peeling test. In contrast, in the case where the force is less than 0.14 N, favorable peeling can be performed without the layer to be peeled 105 remaining on the formation substrate 101 side. Thus, in the following peeling tests, conditions where the force required for peeling is less than 0.14 N are regarded as conditions where peeling is possible.

As shown in Table 2, the stress on the layer to be peeled 105 in the case where the layer to be peeled 105 had Structure 2 is expressed as a positive value (i.e., tensile stress). Although Sample 2 in which the layer to be peeled had Structure 2 required a small amount of force for peeling as shown in FIG. 18, a defect such as a crack occurred at the time of peeling.

As shown in Table 2, the stress on the layer to be peeled 105 in the case where the layer to be peeled 105 had Structure 1 or 3 is expressed as a negative value (i.e., compressive stress). As shown in FIG. 18, the force required for peeling in Sample 3 was greater than or equal to 0.14 N, which indicates a low yield of a peeling process. Although the force required for peeling in Sample 1 is less than 0.14 N, the force is greater than that in Sample 2. The comparison between Sample 1 and Sample 4 demonstrates that the $N_2O$ plasma treatment can reduce the force required for peeling.

The results shown in FIG. 18 reveal that the force required for peeling is high (e.g., the compressive stress on the layer to be peeled is high) depending on the structure of the layer to be peeled 105 when the thickness of the peeling layer 103 is 30 nm. The results shown in FIG. 18 also reveal that addition of a step (e.g., $N_2O$ plasma treatment) enables a reduction in the force required for peeling.

The results shown in FIG. 18 and Table 2 reveal that the force required for peeling in the case where the stress on the layer to be peeled 105 has a positive value (i.e., tensile stress) is lower than that in the case where the stress on the layer to be peeled 105 has a negative value (i.e., compressive stress). The results shown in FIG. 18 and Table 2 also reveal that a crack is less likely to occur at the time of peeling in the case where the stress on the layer to be peeled 105 has a negative value (i.e., compressive stress) than in the case where the stress on the layer to be peeled 105 has a positive value (i.e., tensile stress).

Figure 19:
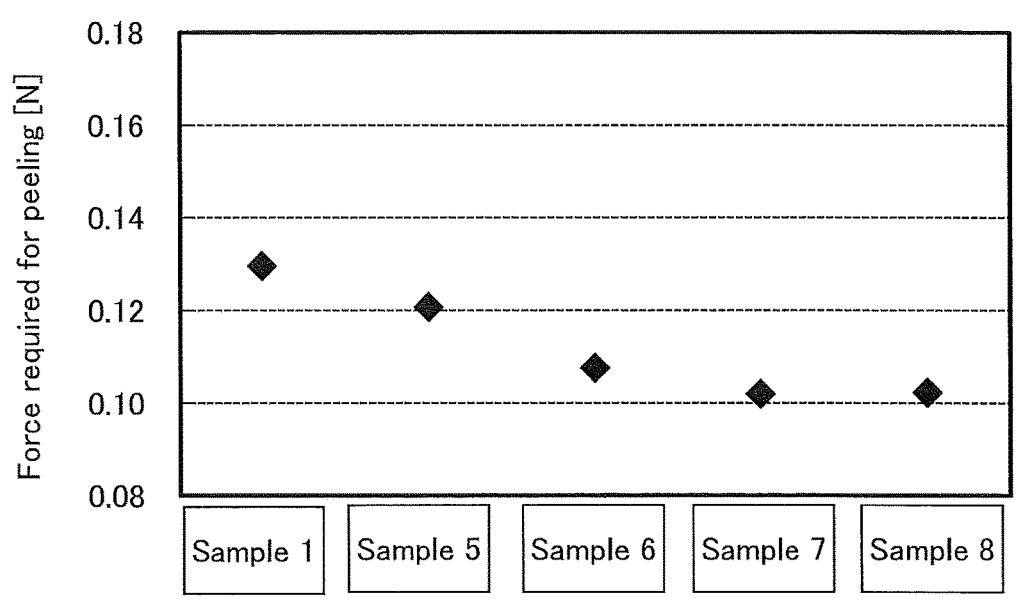
FIG. 19 shows measurement results of force required for peeling in Example 1.

FIG. 19 shows the force required for peeling in Samples 1 and 5 to 8. The stress on each layer included in the layer to be peeled 105 and the stress on the layer to be peeled 105 that are shown in Table 2 can also be referred to for Samples 5 to 8.

The results shown in FIG. 19 revealed that in the case where the insulating layer 305 had Structure 1, the force required for peeling was reduced as the thickness of the tungsten film was decreased. In addition, when the tungsten film was 5 nm thick, the force required for peeling in the case where the insulating layer 305 had Structure 1 was as low as that in the case where the insulating layer 305 had Structure 3. As the result of Sample 8 shows, the layer to be peeled with high compressive stress, which was difficult to peel when the tungsten film was 30 nm thick, was able to be peeled with a smaller amount of force when the tungsten film was 5 nm thick.

The above results revealed that the use of the 5-nm-thick tungsten film as the peeling layer 103 allows the layer to be peeled 105 to be peeled from the formation substrate 101 with a small amount of force regardless of whether the stress on the layer to be peeled 105 had a positive value or a negative value.

Note that the stress on the tungsten film with each thickness was measured: the tungsten films had stresses of 1145.8 MPa, 773.2 MPa, and 607.6 MPa when the thicknesses were 30 nm, 50 nm, and 100 nm, respectively. This revealed that the tensile stress was able to be increased as the thickness of the tungsten film was decreased.

Example 2

In this example, the water vapor transmission rate of an insulating layer that can be used in one embodiment of the present invention was measured.

First, an approximately 200-nm-thick silicon oxynitride film was formed as a base film over a glass substrate by a plasma CVD method. Then, an approximately 30-nm-thick tungsten film was formed as a peeling layer by a sputtering method.

Figure 20A:
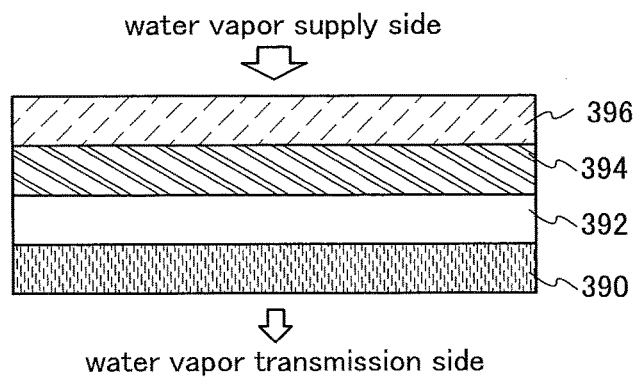
FIG. 20A illustrates a sample in Example 2.

Next, $N_2O$ plasma treatment was performed on a surface of the tungsten film, and five layers were stacked as an insulating layer (an insulating layer 392 in FIG. 20A). First, an approximately 600-nm-thick silicon oxynitride film was formed as a first insulating layer. The silicon oxynitride film was formed under the following conditions: the flow rates of a silane gas and an $N_2O$ gas were 75 sccm and 1200 sccm, respectively, the power supply was 120 W, the pressure was 70 Pa, and the substrate temperature was 330° C.

Then, an approximately 200-nm-thick silicon nitride film was formed as a second insulating layer. The silicon nitride film was formed under the following conditions: the flow rates of a silane gas, an $H_2$ gas, and an $NH_3$ gas were 30 sccm, 800 sccm, and 300 sccm, respectively, the power supply was 600 W, the pressure was 60 Pa, and the substrate temperature was 330° C.

Next, an approximately 200-nm-thick silicon oxynitride film was formed as a third insulating layer. The silicon oxynitride film was formed under the following conditions: the flow rates of a silane gas and an $N_2O$ gas were 50 sccm and 1200 sccm, respectively, the power supply was 120 W, the pressure was 70 Pa, and the substrate temperature was 330° C.

Then, an approximately 140-nm-thick silicon nitride oxide film was formed as a fourth insulating layer. The silicon nitride oxide film was formed under the following conditions: the flow rates of a silane gas, an $H_2$ gas, an $N_2$ gas, an $NH_3$ gas, and an $N_2O$ gas were 110 sccm, 800 sccm, 800 sccm, 800 sccm, and 70 sccm, respectively, the power supply was 320 W, the pressure was 100 Pa, and the substrate temperature was 330° C.

Then, an approximately 100-nm-thick silicon oxynitride film was formed as a fifth insulating layer. The silicon oxynitride film was formed under the following conditions: the flow rates of a silane gas and an $H_2O$ gas were 10 sccm and 1200 sccm, respectively, the power supply was 30 W, the pressure was 22 Pa, and the substrate temperature was 330° C.

After that, heat treatment was performed at 450° C. in a nitrogen atmosphere for 1 hour.

Next, a two-component epoxy adhesive (product name: R2007/H-1010, produced by ALTECO INC.) was applied as a sealing resin 390, and it was cured while being left still at room temperature for 24 hours. Then, a UV peeling tape was attached to the sealing resin 390. After that, peeling was performed at the interface between the peeling layer and the first insulating layer to remove the glass substrate provided with the base film and the peeling layer.

Next, the above-described two-component epoxy adhesive was applied as an adhesive layer 394 to an exposed surface of the first insulating layer, and a 20-μm-thick film was attached as a substrate 396 to the adhesive layer 394 with a laminator. Then, the adhesive layer 394 was cured, and the above UV peeling film was irradiated with UV light to peel the film.

The water vapor transmission rate of the fabricated sample was measured. A highly sensitive water vapor transmission rate measuring instrument (product name. HiBarSens, produced by Fraunhofer IWS) was used, and a diffusion control method was used as a measuring mode. The temperature and the relative humidity on the water vapor supply side (corresponding to the side where a water vapor filled chamber 173 was provided) were set at 38.0° C. and 90% RH, respectively. The measurement was conducted twice.

The measuring instrument in this example can be used in three modes, a static control method, a dynamic control method, and a diffusion control method, and is capable of highly accurate and highly sensitive measurement of a water vapor transmission rate. The measurement limit of many measuring instruments is $10^{-5}$ g/m$^2$·day to $10^{-6}$ g/m$^2$·day; however, the measuring instrument used in this example is capable of highly accurate measurement up to $10^{-7}$ g/m$^2$·day.

The measuring instrument used in this example includes one chamber. The chamber is divided into two parts by a sample 171 set as shown in FIG. 20C. One part of the chamber serves as the water vapor filled chamber 173 for supplying water vapor and the other part serves as a water vapor transmission chamber 175 for measuring the water vapor concentration. Water vapor with a constant temperature and constant humidity is supplied to the water vapor filled chamber 173, and the amount of water vapor moving to the water vapor transmission chamber 175 through the sample 171 is measured. Dry nitrogen can be supplied to the water vapor transmission chamber 175. The supply of dry nitrogen can be controlled by opening and closing a valve depending on the measurement method. The water vapor transmission chamber 175 is also provided with a laser light source and a detector and has a 2-m-long light path therein. The concentration of water vapor in the water vapor transmission chamber 175 can be measured by measuring the decay rate of the intensity of laser light.

A change in the amount of water vapor in the entire system $J_{SYS}$ is represented by the following equation: $J_{SYS}=\text{WVTR}+j_{cell}+J_{sample}+J_{tubes}$, where WVTR represents a water vapor, transmission rate; $j_{cell}$, a change due to desorption of water molecules on an inner wall of the chamber; $j_{sample}$, a change due to desorption of water molecules on a surface of the sample; and $j_{tubes}$, a change due to desorption of water molecules on an inner wall of a tube.

In the equilibrium state, the equation $j_{cell}=j_{sample}=j_{tubes}=0$ is satisfied; thus, the water vapor transmission rate can be estimated by measuring a change in the amount of water vapor in the entire system.

There are three modes for the measurement method. The first mode is a dynamic measurement method. In the dynamic measurement method, dry nitrogen is constantly supplied at a fixed flow rate into the measurement chamber, and WVTR is estimated from the concentration of water vapor in the equilibrium state on the basis of the fact that WVTR has a fixed value. The dynamic measurement method is suitable for accurately measuring WVTR up to $10^{-4}$ level.

The second mode is a static measurement method. In the static measurement method, supply of dry nitrogen into the measurement chamber is stopped, and WVTR is estimated by measuring a change in the amount of water vapor that passes through the sample and gradually accumulates in the measurement chamber. The static measurement method is capable of measuring WVTR even at $10^{-6}$ level with high sensitivity, but the accuracy tends to be low.

The third mode is a diffusion control method. In the diffusion control method, supply of dry nitrogen into the measurement chamber is stopped and dry nitrogen is discharged through a narrow tube connected to the measurement chamber. The diffusion control method is a method in which WVTR is estimated using Fick's law of diffusion and has advantages of both the dynamic measurement method and the static measurement method. The diffusion control method is suitable for performing measurement on a sample whose WVTR is known to be low in advance.

FIG. 20A schematically illustrates the measurement method. The water vapor transmission rate can be measured in such a manner that water vapor is supplied from the substrate 396 side of the sample and water vapor transmitted to the sealing resin 390 side is detected.

Figure 20B:
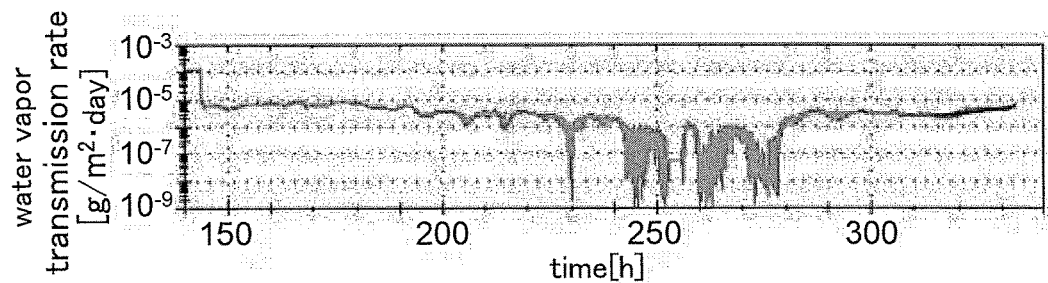
FIG. 20B shows measurement results of water vapor transmission rates.
Figure 20C:
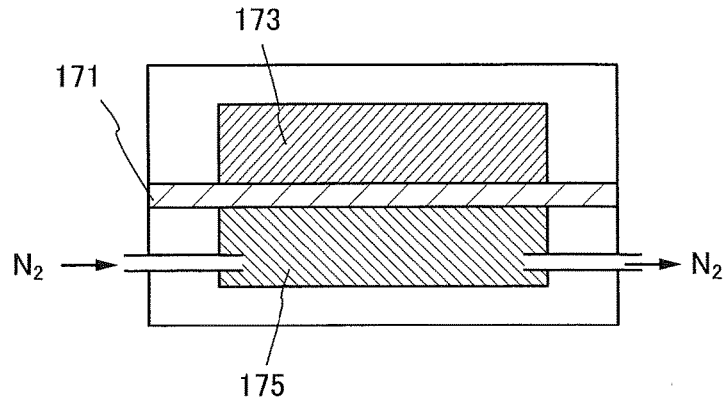
FIG. 20C illustrates a structure of an apparatus for measuring water vapor transmission rates in Example 2.
Figure 25:
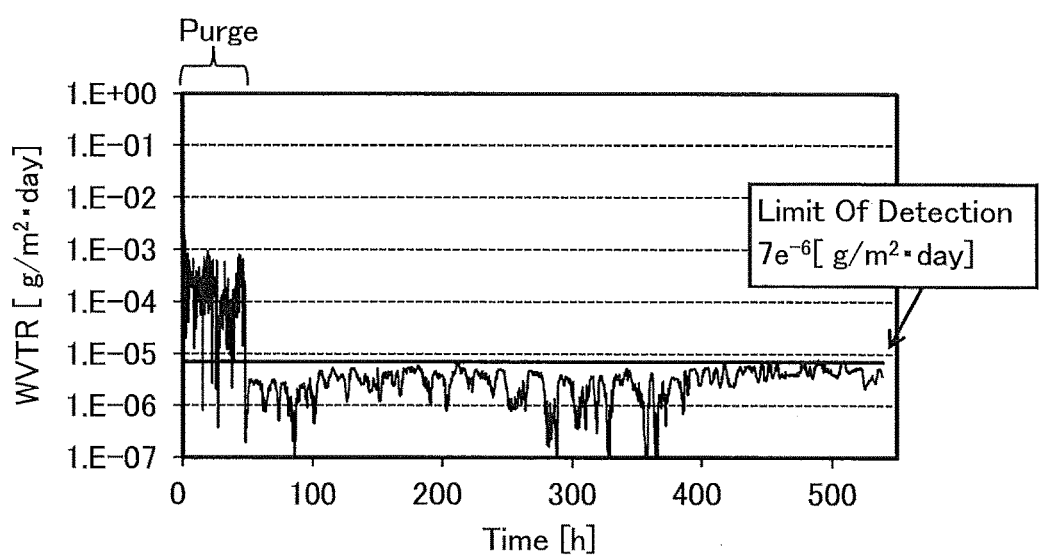
FIG. 25 shows measurement results of water vapor transmission rates in Example 2.

FIG. 20B and FIG. 25 show measurement results. In FIG. 20B and FIG. 25, the horizontal axis represents time and the vertical axis represents water vapor transmission rate (WVTR). As shown in FIG. 20B and FIG. 25, the water vapor transmission rate of the sample was less than $1 \times 10^{-5}$ g/m²·day in the equilibrium state. In addition, the water vapor transmission rate of the sample in the equilibrium state was less than or equal to $7 \times 10^{-6}$ g/m²·day that is the lower measurement limit.

In contrast, for example, the water vapor transmission rate of general aluminum foil is $1.5 \times 10^{-4}$ g/m²·day and the water vapor transmission rate of a film with an excellent gas barrier property is $2 \times 10^{-5}$ g/m²·day. Thus, the water vapor transmission rates of the samples fabricated in this example were much lower than those of the aluminum foil and the film with an excellent gas barrier property.

Next, a light-emitting device was fabricated using the insulating layer 392 having the above-described structure, and a preservation test was performed on the light-emitting device.

Figure 30A:
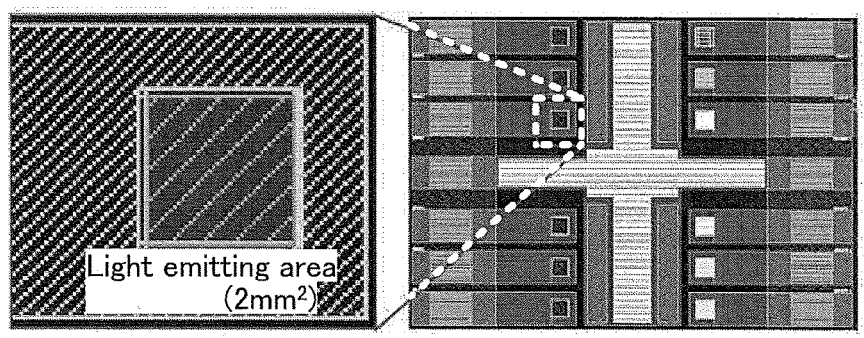
FIGS. 30A and 30B show a mask pattern and results of a preservation test in Example 2.

FIG. 30A shows a mask pattern of an examination sample in the preservation test. Specifically, a light-emitting area with a size of 2 mm² that was 10 mm or more away from an end portion of the sample was examined so that examination results were not adversely affected by entry of impurities such as moisture from a side surface of the sample.

Figure 31A:
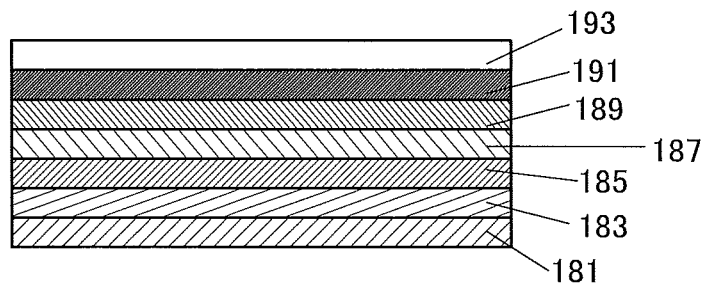
FIGS. 31A to 31C illustrate a method for fabricating an examination sample in Example 2.
Figure 31B:
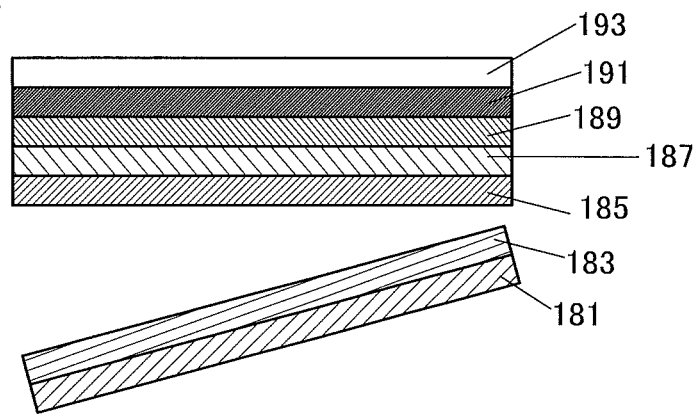
Figure 31C:
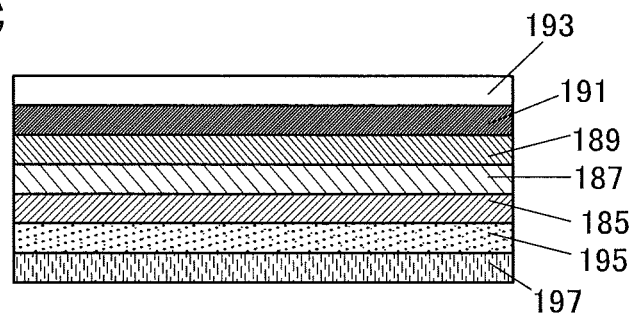

A method for fabricating the examination sample is described with reference to FIGS. 31A to 31C. First, an approximately 200-nm-thick silicon oxynitride film was formed as a base film over a glass substrate 181 by a plasma CVD method. Then, an approximately 30-nm-thick tungsten film was formed as a peeling layer 183 by a sputtering method.

Next, N₂O plasma treatment was performed on a surface of the tungsten film, and then an insulating layer 185 was formed. Since a structure and a formation method of the insulating layer 185 are the same as those of the insulating layer 392 (FIG. 20A), the description thereof is omitted. After that, heat treatment was performed at 450° C. in a nitrogen atmosphere for 1 hour. Then, an element layer 187 was formed over the insulating layer 185.

The element layer 187 includes an organic EL element emitting blue light. A 100-nm-thick silicon oxide film and a 100-nm-thick silicon nitride film were formed as a protective layer 189 by a sputtering method in order to suppress deterioration of the organic EL element due to entry of impurities such as moisture from a side surface of the examination sample and a gas released from a resin used for a bonding layer. After that, a glass substrate 193 was attached to the protective layer 189 with a bonding layer 191 (FIG. 31A). As the bonding layer 191, an ultraviolet curable epoxy resin was used. Then, the glass substrate 181 was peeled (FIG. 31B), and a resin substrate 197 was attached to the exposed insulating layer 185 with a bonding layer 195 (FIG. 31C). As the bonding layer 195, a two-component epoxy resin was used.

Figure 32A:
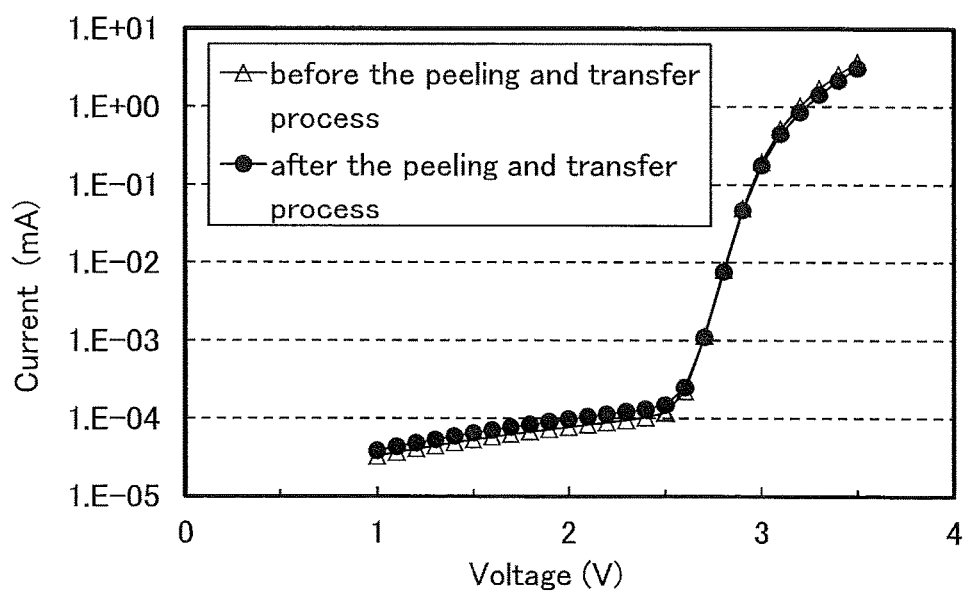
FIGS. 32A and 32B show characteristics of organic EL elements in Example 2.
Figure 32B:
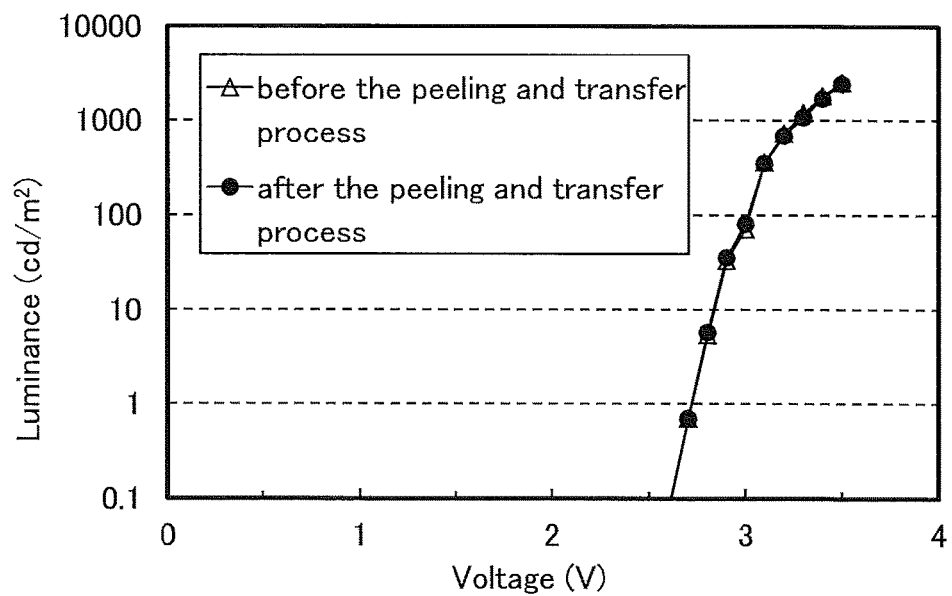

Note that it was examined whether the characteristics of the organic EL element were changed because of the peeling of the glass substrate 181 and the transfer of the element layer 187 to the resin substrate 197. FIG. 32A shows current-voltage characteristics of the organic EL element before and after the peeling and transfer process. There was no difference in the characteristics between before and after the peeling and transfer process. This indicates that the peeling and transfer process did not cause deterioration of the electrical characteristics such as a short circuit or an increase in contact resistance. FIG. 32B shows luminance-voltage characteristics of the organic EL element before and after the peeling and transfer process. The dependence of luminance on voltage and the rising voltage did not change. This indicates that the peeling and transfer process also did not cause damage to a material contained in the organic EL element, a change in outcoupling efficiency, and the like. The above results confirmed that the method for fabricating the light-emitting device including the peeling and transfer process did not adversely affect the characteristics of the organic EL element.

Figure 30B:
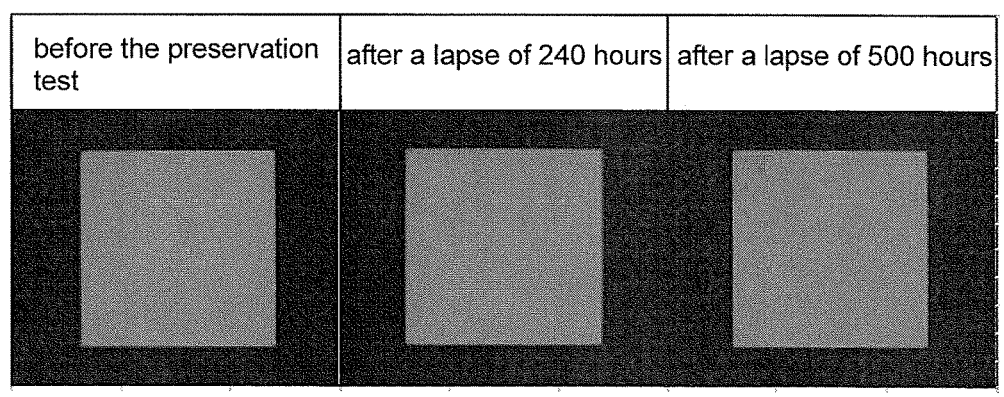

Next, a preservation test was performed. Specifically, the examination sample was preserved at a temperature of 65° C. and a humidity of 90% for 500 hours. FIG. 30B are photographs showing light emission before and after the preservation test. FIG. 30B are three photographs showing light emission before the preservation test, light emission after a lapse of 240 hours from the start of the preservation test, and light emission after a lapse of 500 hours from the start of the preservation test. Here, the sample was observed with an optical microscope at 50-fold magnification. Even after a lapse of 500 hours from the start of the preservation test, an increase in the number of dark spots and shrink were not observed.

Figure 33A:
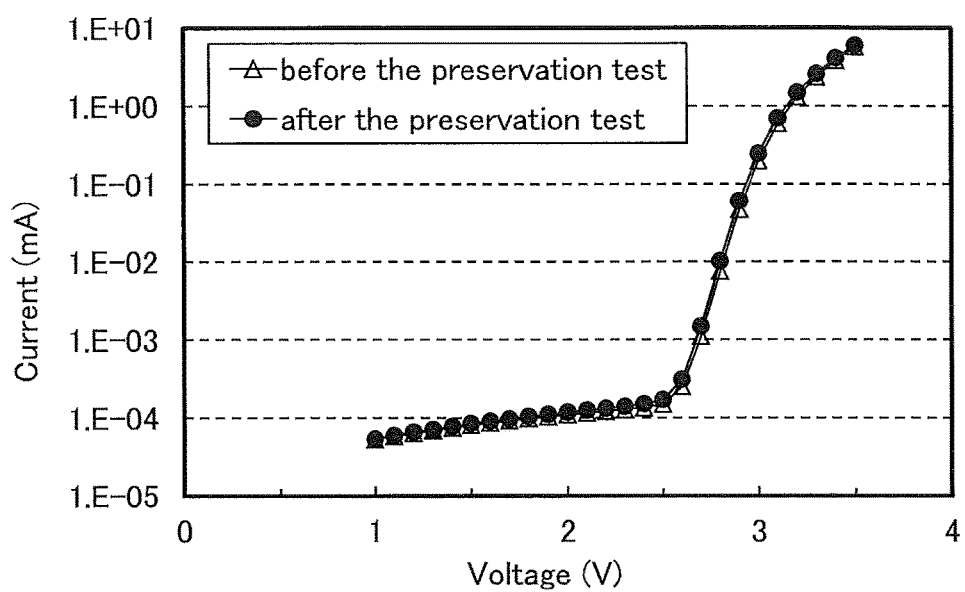
FIGS. 33A and 33B show characteristics of organic EL elements in Example 2.
Figure 33B:
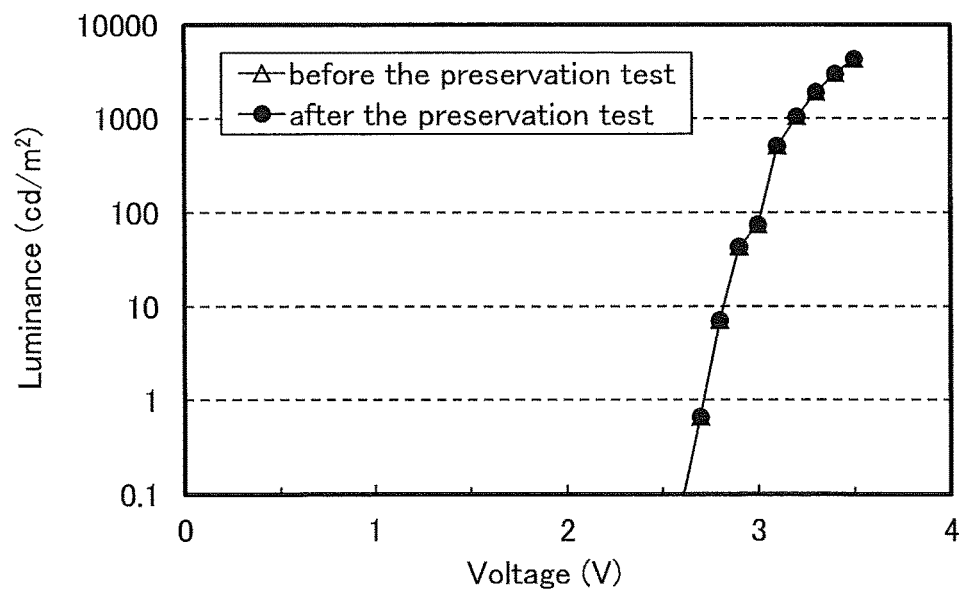

In addition, the characteristics of the organic EL element before and after the preservation test are described. FIG. 33A shows current-voltage characteristics of the organic EL element before and after the preservation test, and FIG. 33B shows luminance-voltage characteristics of the organic EL element before and after the preservation test. The current-voltage characteristics and the luminance-voltage characteristics of the organic EL element did not change even in the preservation test for 500 hours. This revealed that the use of the insulating layer formed in this example can suppress deterioration of the organic EL element.

Example 3

In this example, a light-emitting device was fabricated using the insulating layer 392 formed in Example 2 and the reliability of the light-emitting device was evaluated.

Since the light-emitting device fabricated in this example is the same as the light-emitting device in Structure Example 5 described with reference to FIG. 14B in Embodiment 2, the description of the light-emitting device is omitted. In this example, the insulating layer 392 formed in Example 2 was used as the insulating layers 424 and 226.

A preservation test was performed on the fabricated light-emitting device at a temperature of 65° C. and a humidity of 90% RH for 1000 hours.

Figure 21A:
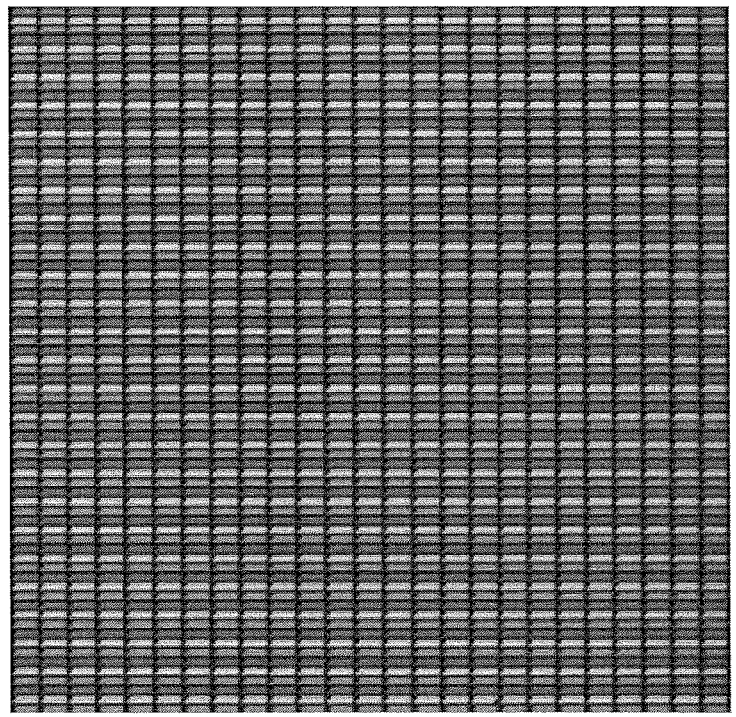
FIGS. 21A and 21B show optical micrographs of a light-emitting device before and after a preservation test in Example 3.
Figure 21B:
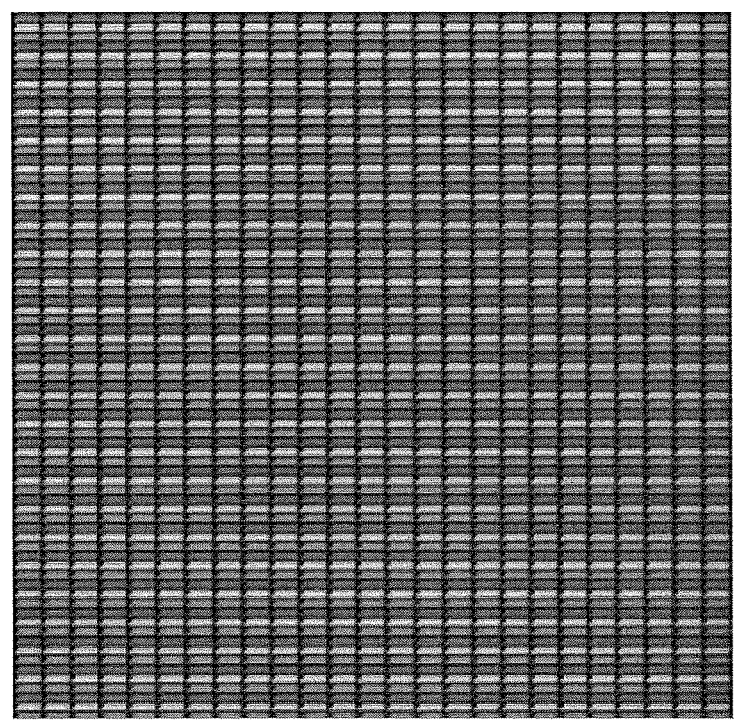

FIGS. 21A and 21B are optical micrographs showing light emission states of a central portion of the light-emitting device before and after the preservation test. FIGS. 21A and 21B are the optical micrographs before the preservation test and after a lapse of 1000 hours from the start of the preservation test, respectively.

As shown in FIG. 21B, defects such as a decrease in luminance and formation of a non-light-emitting region were not caused even in the preservation test. This means that as described in Example 2, the use of insulating layers with an extremely low water vapor transmission rate for the insulating layers 424 and 226 enables an organic EL panel with extremely high reliability to be obtained.

Example 4

In this example, a light-emitting device was fabricated using the insulating layer 392 formed in Example 2 and the reliability of the light-emitting device was evaluated. The light-emitting device fabricated in this example is a bendable display.

Figure 24A:
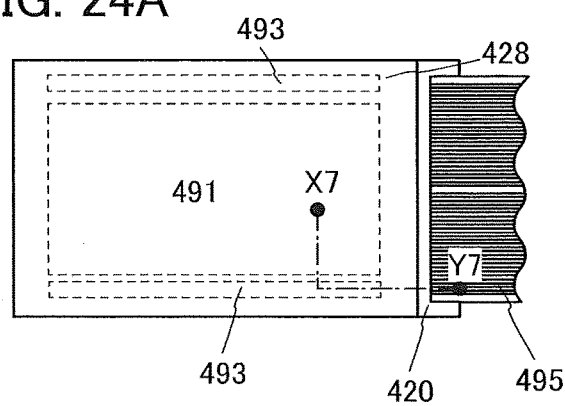
FIGS. 24A and 24B illustrate an example of a light-emitting device.
Figure 24B:
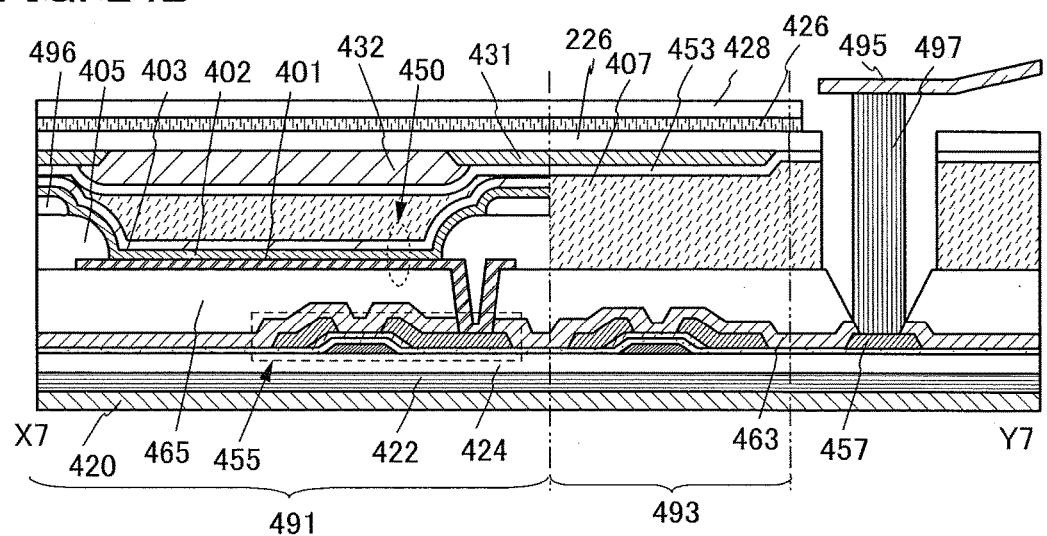

FIGS. 24A and 24B illustrate the light-emitting device fabricated in this example. FIG. 24A is a plan view of the light-emitting device, and FIG. 24B is a cross-sectional view taken along the dashed dotted line X7-Y7 in FIG. 24A. The light-emitting device fabricated in this example is different from that in Structure Example 5 described with reference to FIG. 14B in Embodiment 2 in that the flexible substrate 428 is smaller than the flexible substrate 420. The description of Structure Example 5 can be referred to for the other parts.

In this example, the light-emitting device was fabricated by Peeling Method 4 described in Embodiment 1.

First, the peeling layer 203 was formed over a glass substrate serving as the formation substrate 201, and the layer to be peeled 205 was formed over the peeling layer 203. In addition, the peeling layer 223 was formed over a glass substrate serving as the formation substrate 221, and the layer to be peeled 225 was formed over the peeling layer 223. Next, the formation substrate 201 and the formation substrate 221 were attached so that the surfaces provided with the respective layers to be peeled faced each other. Then, the two formation substrates were peeled from the respective layers to be peeled, and flexible substrates were attached to the respective layers to be peeled. Materials for each of the layers are described below.

A stacked-layer structure of a tungsten film and a tungsten oxide film thereover was formed as each of the peeling layers 203 and 223. Specifically, an approximately 30-nm-thick tungsten film was formed by a sputtering method and subjected to $N_2O$ plasma treatment, and then a layer to be peeled was formed.

The peeling layer having the stacked-layer structure right after deposition is not easily peeled; however, by reaction with an inorganic insulating film by heat treatment, the state of the interface between the peeling layer and the inorganic insulating film is changed to become brittle. Then, forming a peeling trigger enables physical peeling.

The insulating layer 424, a transistor, and the organic EL element 450 were formed as the layer to be peeled 205. A color filter, which corresponds to the coloring layer 432, and the like were formed as the layer to be peeled 225.

The insulating layer 392 formed in Example 2 was used as the insulating layers 424 and 226.

As the transistor, a transistor including a c-axis aligned crystalline oxide semiconductor (CAAC-OS) was used. Since the CAAC-OS, which is not amorphous, has few defect states, using the CAAC-OS can improve the reliability of the transistor. Moreover, since the CAAC-OS does not have a grain boundary, stress that is caused by bending a flexible device does not easily make a crack in a CAAC-OS film.

A CAAC-OS is an oxide semiconductor having c-axis alignment in a direction perpendicular to the film surface. It has been found that oxide semiconductors have a variety of crystal structures other than an amorphous structure and a single-crystal structure. An example of such structures is a nano-crystal (nc)-OS, which is an aggregate of nanoscale microcrystals. The crystallinity of the CAAC-OS is lower than that of a single crystal structure but higher than those of an amorphous structure and an nc-OS.

In this example, a channel-etched transistor including an In—Ga—Zn-based oxide was used. The transistor can be fabricated over a glass substrate at a process temperature lower than 500° C.

In a method for fabricating an element such as a transistor directly on an organic resin such as a plastic substrate, the temperature of the process for fabricating the element needs to be lower than the upper temperature limit of the organic resin. In this example, the formation substrate is a glass substrate and the peeling layer, which is an inorganic film, has high heat resistance; thus, the transistor can be fabricated at a temperature equal to that when a transistor is fabricated over a glass substrate. Thus, the performance and reliability of the transistor can be easily secured.

As the organic EL element 450, a tandem organic EL element that included a fluorescence-emitting unit including a blue light-emitting layer and a phosphorescence-emitting unit including a green light-emitting layer and a red light-emitting layer was used. The organic EL element 450 is a top-emission organic EL element. As the first electrode 401 of the organic EL element 450, an aluminum film, a titanium film over the aluminum film, and an ITO film serving as an optical adjustment layer over the titanium film were stacked. The thickness of the optical adjustment layer was varied depending on the color of the pixel. Owing to the combination of a color filter and a microcavity structure, light with high color purity can be extracted from the light-emitting device fabricated in this example. A 20-μm-thick organic resin film was used as the flexible substrates 420 and 428.

Figure 26:
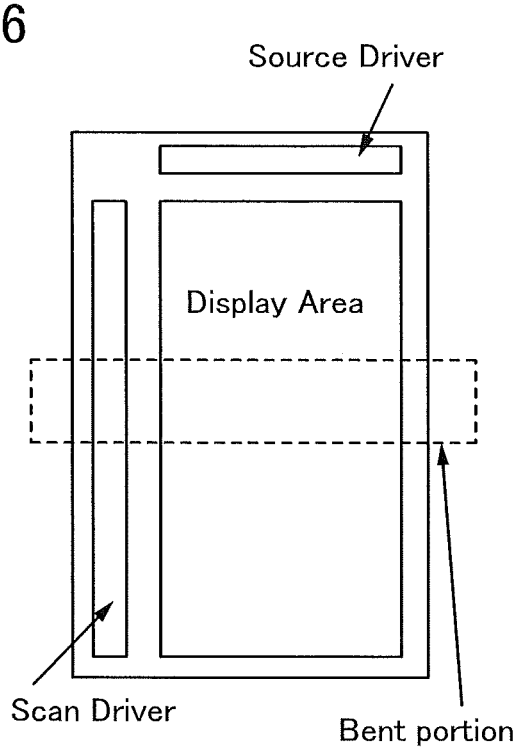
FIG. 26 illustrates a bent portion in Example 4.

FIG. 26 illustrates the light-emitting device fabricated in this example. The fabricated light-emitting device had a size of a light-emitting portion (pixel portion) of 3.4 inches diagonal, 540×960×3 (RGB) pixels, a pixel pitch of 0.078 mm×0.078 mm, a resolution of 326 ppi, and an aperture ratio of 56.9%. The light-emitting device had a built-in scan driver (gate driver) and source driver. In addition, the light-emitting device had a thickness of less than or equal to 100 μm and a weight of 2 g. Note that different light-emitting devices were used for different bending tests.

Figure 22A:
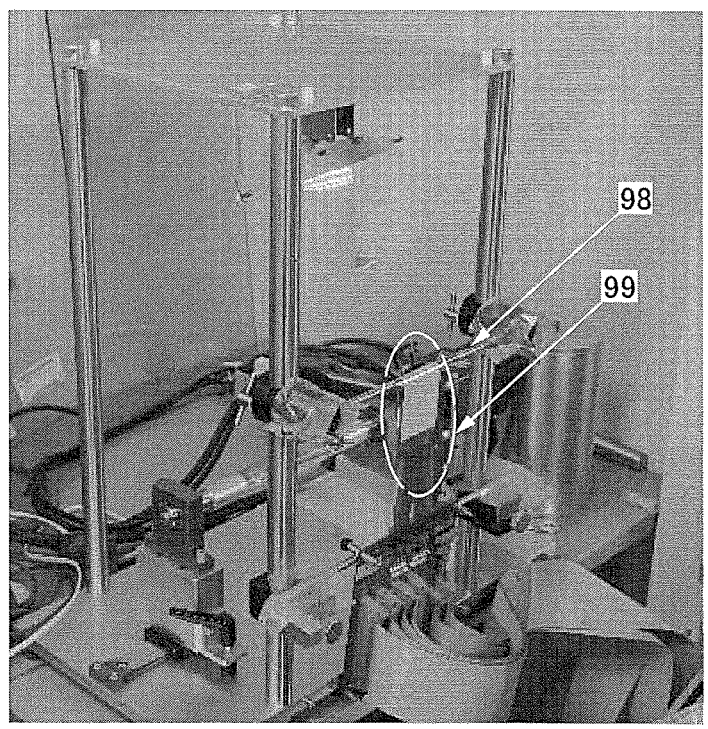
FIGS. 22A to 22C are photographs and a diagram illustrating a bending test in Example 4.
Figure 22B:
Figure 22C:
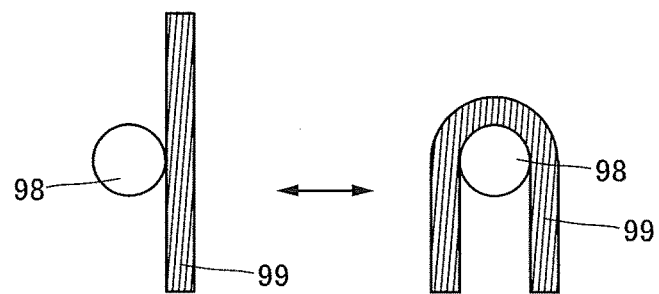

The fabricated light-emitting device was bent repeatedly while displaying an image. As illustrated in FIG. 26, a bent portion is a middle portion of the light-emitting device and includes the light-emitting portion and the scan driver. FIG. 22A is a photograph showing a bend tester where the light-emitting device is set. FIG. 22B shows how a bending test is performed. Fixing the side where an FPC is provided allows the bending test to be performed while the light-emitting device is driven. As illustrated in FIG. 22C, the radius of curvature for bending a light-emitting device 99 was determined by the diameter of a metal rod 98. Four rods with diameters of 10 mm, 6 mm, 4 mm, and 2 mm were used as the rod 98. In other words, four bending tests with radiuses of curvature of 5 mm, 3 mm, 2 mm, and 1 mm were performed. Note that here, "outward bending" means bending performed such that a display surface of the light-emitting device faces outward, and "inward bending" means bending performed such that a display surface faces inward. FIG. 22B shows states during an inward bending test. In the bending test, one bending was performed in approximately 2 seconds. The results of the bending tests are described below. In the case where the radius of curvature was 5 mm, the display portion had no defect and the driver operated normally after either outward bending or inward bending performed 100000 times. When inward bending with a radius of curvature of 3 mm was performed 100000 times, the display portion had no defect and the driver operated normally. When inward bending with a radius of curvature of 2 mm was performed 100000 times, the display portion had no defect and the driver operated normally. When inward bending with a radius of curvature of 1 mm was performed 4000 times, the display portion had no defect and the driver operated normally. Furthermore, when inward bending with a radius of curvature of 5 mm was performed 300000 times on a light-emitting device with the same structure, a display portion also had no defect and a driver also operated normally.

Figure 27A:
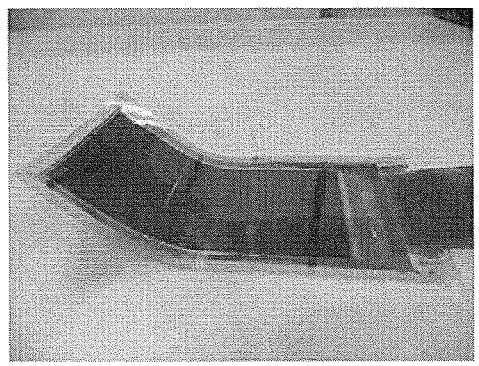
FIGS. 27A to 27C show results of a bending test and a preservation test in Example 4.
Figure 27B:
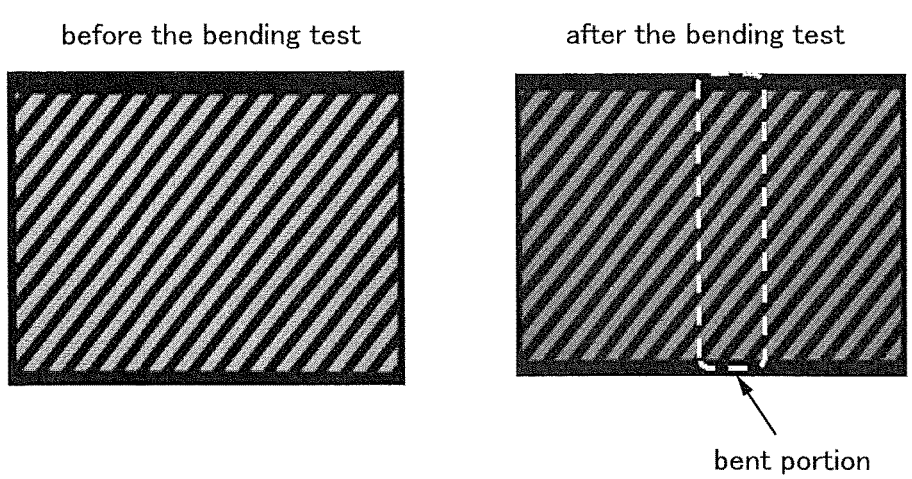
Figure 27C:
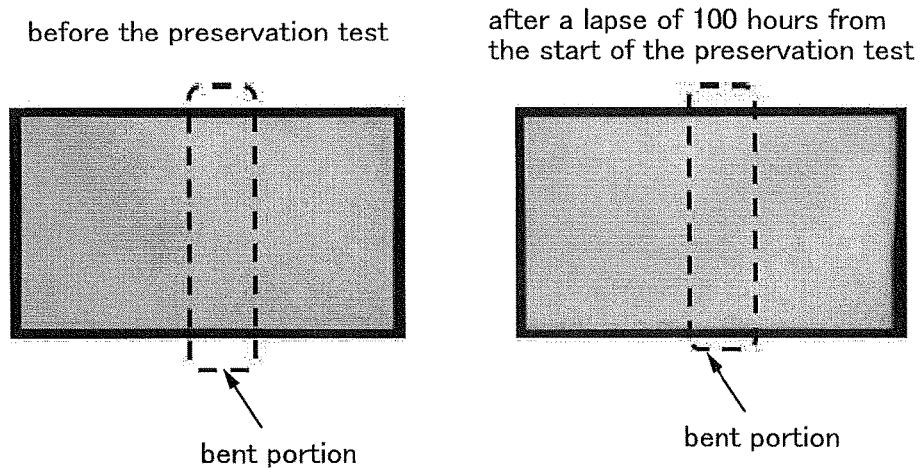

FIG. 27A shows the appearance of the light-emitting device after being subjected to bending with a radius of curvature of 5 mm 100000 times. FIG. 27B shows display states before and after the bending test. As shown in FIG. 27A, warpage due to bending and a scratch on a surface were caused in the light-emitting device; however, the display state and the operation of the driver had no problem. Furthermore, a preservation test was performed at a high temperature of 65° C. and a high humidity of 90% for 100 hours after the bending test. FIG. 27C shows display states of the light-emitting device before and after the preservation test. No defect was also observed in the bent portion after the preservation test, and a crack was probably not caused in the inorganic insulating film or the like in the light-emitting device.

Figure 28A:
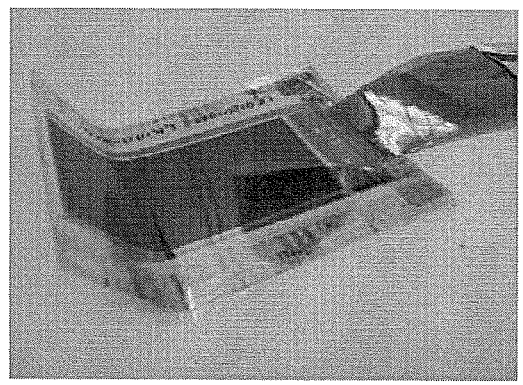
FIGS. 28A to 28C show results of a bending test and a preservation test in Example 4.
Figure 28B:
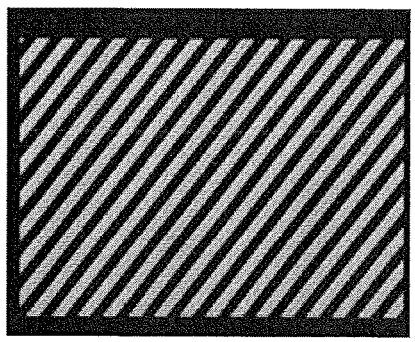
Figure 28B:
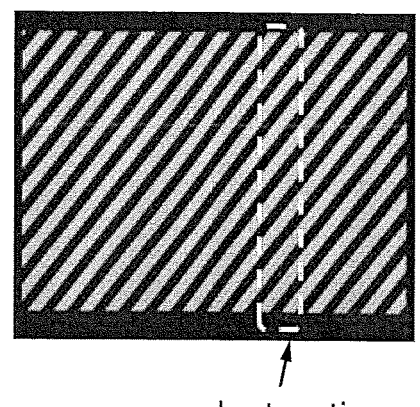
Figure 28C:
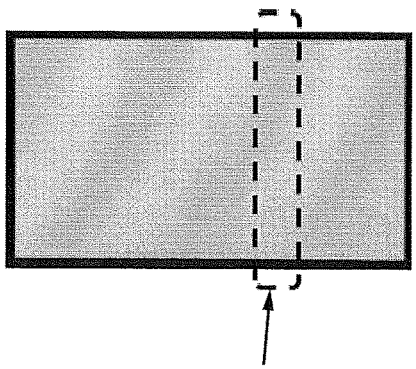
Figure 28C:
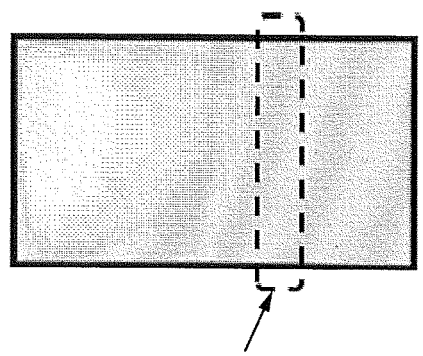

FIG. 28A shows the appearance of the light-emitting device after being subjected to the bending with a radius of curvature of 2 mm 100000 times. FIG. 28B shows display states before and after the bending test. As shown in FIG. 28A, warpage due to bending and a scratch on a surface were caused in the light-emitting device; however, the display state and the operation of the driver had no problem. Furthermore, a preservation test was performed at a high temperature of 65° C. and a high humidity of 90% for 100 hours after the bending test. FIG. 28C shows display states of the light-emitting device before and after the preservation test. No defect was also observed in the bent portion after the preservation test, and a crack was probably not caused in the inorganic insulating film or the like in the light-emitting device.

In the bending test with the bend tester, factors such as tensile stress, compressive stress, and friction are involved as well as simple bending.

Figure 29A:
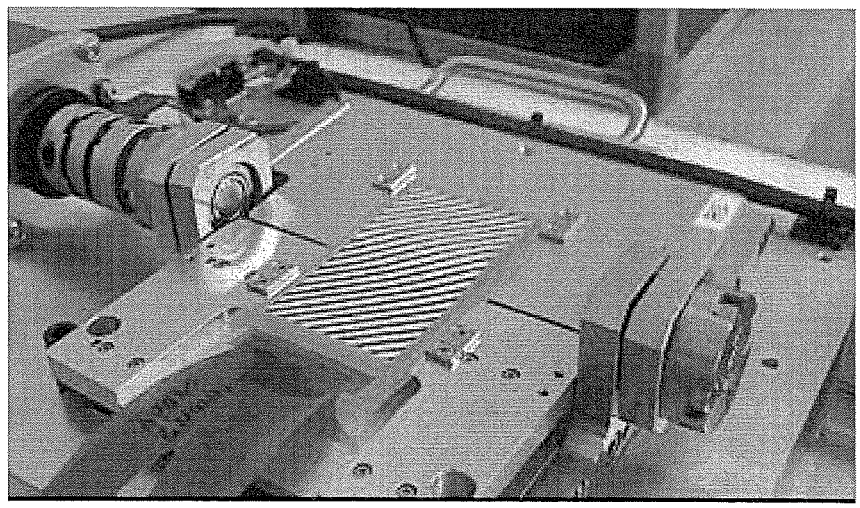
FIGS. 29A and 29B are photographs of a bend tester in Example 4.
Figure 29B:
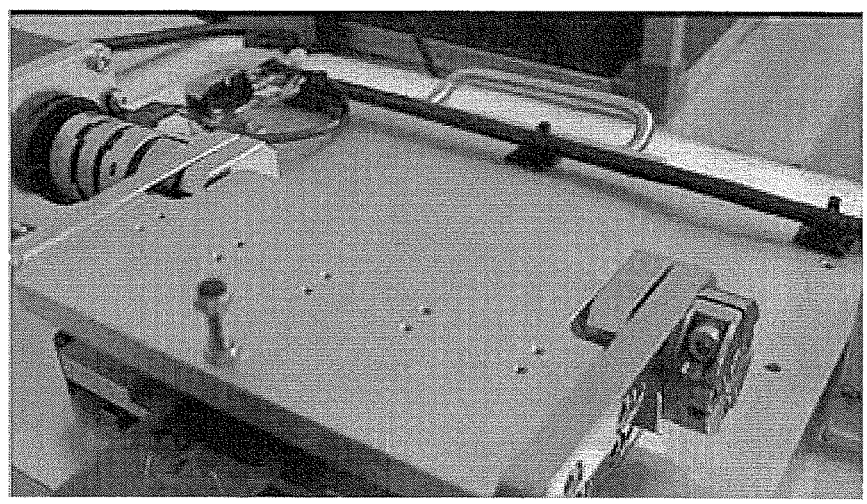

A bending test performed with a book-type bend tester that is capable of examining only resistance to bending is described below. In the bending test, the bend tester is repeatedly opened (FIG. 29A) and closed (FIG. 29B) like a book. The radius of curvature for bending the light-emitting device was determined by setting the distance between plates when bent.

The bending characteristics of the light-emitting devices examined with the book-type bend tester are described. When inward bending with each of radiuses of curvature of 5 mm, 3 mm, and 2 mm was performed 100000 times, the display portion had no defect and the driver operated normally. When inward bending with a radius of curvature of 1 mm was performed 9000 times, the display portion had no defect and the driver operated normally. In addition, when inward bending with a radius of curvature of 5 mm was performed on a light-emitting device with the same structure 300000 times, a display portion also had no defect and a driver also operated normally. Less warpage due to the bending test was caused in the case where the book-type bend tester was used than in the case where the bend tester described above was used, and almost no warpage was observed when bending with a radius of curvature of 5 mm was performed with the book-type bend tester.

As described above, a highly reliable flexible light-emitting device that had high resistance to repeated bending was able to be fabricated in this example.

Example 5

In this example, a light-emitting device was fabricated using the insulating layer 392 formed in Example 2. The light-emitting device fabricated in this example is a book-type flexible organic light-emitting diode (OLED) display that can be repeatedly folded in two like a book. The light-emitting device can be bent such that a display surface faces inward. The light-emitting device can also be referred to as a bendable display.

FIGS. 24A and 24B illustrate the light-emitting device fabricated in this example. Structures of the insulating layer 424, the insulating layer 226, a transistor, the organic EL element 450, the first electrode 401, the flexible substrate 420, and the flexible substrate 428 in the light-emitting device are the same as those in the light-emitting device fabricated in Example 4; thus, the description thereof is omitted. In addition, a method for fabricating the light-emitting device and peeling layers used for the fabrication were the same as those described in Example 4.

The fabricated light-emitting device had a size of a light-emitting portion (pixel portion) of 5.9 inches diagonal, 720×1280×3 (RGB) pixels, a pixel pitch of 0.102 mm×0.102 mm, a resolution of 249 ppi, and an aperture ratio of 45.2%. A built-in scan driver and an external source driver attached by chip on film (COF) were used.

Figure 23A:
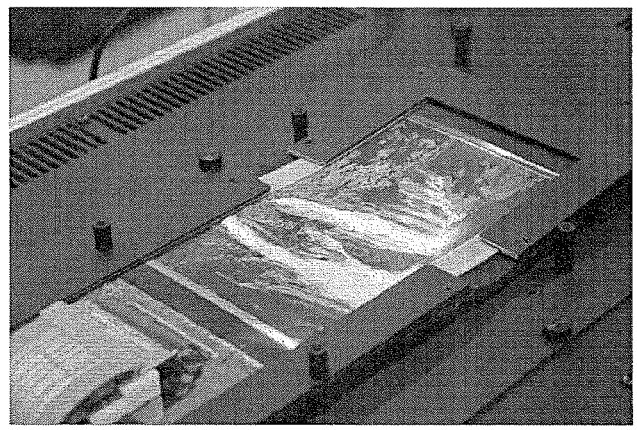
FIGS. 23A to 23C show display conditions of a light-emitting device in Example 5.
Figure 23B:
Figure 23C:
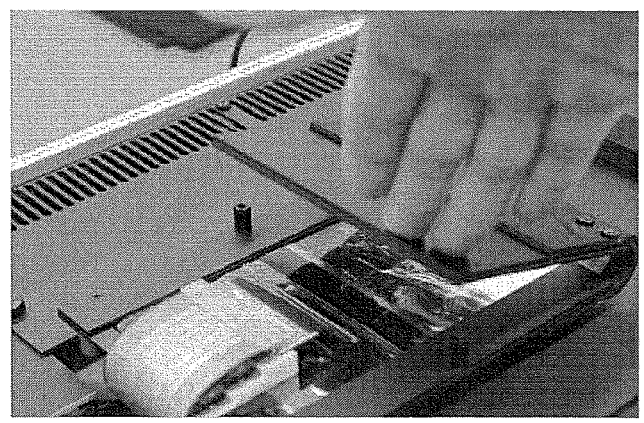

FIGS. 23A to 23C are photographs showing a display of the light-emitting device fabricated in this example. FIG. 23A shows the light-emitting device that is opened, FIG. 23B shows the light-emitting device that is being folded, and FIG. 23C shows the light-emitting device that is folded. The radius of curvature of a folded portion was 5 mm. The light-emitting device of this example had no problem in display and driving even when it was folded while displaying an image.

In addition, the fabricated light-emitting device was repeatedly bent while displaying an image. A method of the bending test was the same as that described in Example 4. When inward bending with a radius of curvature of 5 mm was performed 100000 times, the display portion had no defect and the driver operated normally.

As described above, a highly reliable flexible light-emitting device that had high resistance to repeated bending was able to be fabricated in this example.

This application is based on Japanese Patent Application serial No. 2013-230532 filed with the Japan Patent Office on Nov. 6, 2013, Japanese Patent Application serial No. 2013-249158 filed with the Japan Patent Office on Dec. 2, 2013, and Japanese Patent Application serial No. 2014-029755 filed with the Japan Patent Office on Feb. 19, 2014, the entire contents of which are hereby incorporated by reference.

What is claimed is:
1. A peeling method comprising:
    a first step of forming a peeling layer to a thickness of greater than or equal to 0.1 nm and less than 10 nm over a first substrate;
    a second step of forming a layer to be peeled that is in contact with the peeling layer and includes a first layer;
    a third step of attaching the layer to be peeled to a second substrate with a first bonding layer, a fourth step of removing at least a part of the peeling layer and a part of the first layer to form a peeling trigger between the first bonding layer and the first substrate; and a fifth step of separating the peeling layer and the layer to be peeled from the peeling trigger.

2. The peeling method according to claim 1, wherein at least a stack comprising the first layer having stress with a negative value is formed as the layer to be peeled in the second step.

3. The peeling method according to claim 2, wherein at least the first layer having stress with a negative value and a second layer having stress with a negative value over the first layer are formed as the stack in the second step.

4. The peeling method according to claim 3, wherein the first layer comprises an oxide insulating film, and wherein the second layer comprises a nitride insulating film.

5. The peeling method according to claim 2, wherein at least the first layer having stress with a negative value, a second layer having stress with a negative value over the first layer, a third layer having stress with a negative value over the second layer, a fourth layer having stress with a positive value over the third layer, and a fifth layer having stress with a negative value over the fourth layer are formed as the stack in the second step.

6. The peeling method according to claim 1, wherein $N_2O$ plasma treatment is not performed between the first step and the fourth step.

7. The peeling method according to claim 1, wherein the peeling layer comprises tungsten.

8. The peeling method according to claim 1, further comprising the step of:

curing the first bonding layer.

9. The peeling method according to claim 1, further comprising the steps of:

forming a second bonding layer surrounding the first bonding layer, and curing the first bonding layer and the second bonding layer, wherein the first bonding layer, the second bonding layer, the peeling layer, and the layer to be peeled overlap one another.

10. A method for fabricating a semiconductor device, the method comprising:

a first step of forming a peeling layer to a thickness of greater than or equal to 0.1 nm and less than 10 nm over a first substrate;

a second step of forming a layer to be peeled that is in contact with the peeling layer and includes a first layer;

a third step of attaching the layer to be peeled to a second substrate with a first bonding layer, a fourth step of removing at least a part of the peeling layer and a part of the first layer to form a peeling trigger between the first bonding layer and the first substrate; and a fifth step of separating the peeling layer and the layer to be peeled from the peeling trigger, wherein the layer to be peeled comprises a transistor.

11. The method according to claim 10, wherein at least a stack comprising the first layer having stress with a negative value is formed as the layer to be peeled in the second step.

12. The method according to claim 11, wherein at least the first layer having stress with a negative value and a second layer having stress with a negative value over the first layer are formed as the stack in the second step.

13. The method according to claim 12, wherein the first layer comprises an oxide insulating film, and wherein the second layer comprises a nitride insulating film.

14. The method according to claim 11, wherein at least the first layer having stress with a negative value, a second layer having stress with a negative value over the first layer, a third layer having stress with a negative value over the second layer, a fourth layer having stress with a positive value over the third layer, and a fifth layer having stress with a negative value over the fourth layer are formed as the stack in the second step.

15. The method according to claim 10, wherein $N_2O$ plasma treatment is not performed between the first step and the fourth step.

16. The method according to claim 10, wherein the peeling layer comprises tungsten.

17. The method according to claim 10, further comprising the step of:

curing the first bonding layer.

18. The method according to claim 10, further comprising the steps of:

forming a second bonding layer surrounding the first bonding layer, and curing the first bonding layer and the second bonding layer, wherein the first bonding layer, the second bonding layer, the peeling layer, and the layer to be peeled overlap one another.

* * * * *